(12) United States Patent
Yukawa et al.

(10) Patent No.: US 7,712,676 B2
(45) Date of Patent: May 11, 2010

(54) DEVICE, AND METHOD FOR MANUFACTURING THE SAME

(75) Inventors: Mikio Yukawa, Kanagawa (JP);
Nozomu Sugisawa, Kanagawa (JP);
Takaaki Nagata, Kanagawa (JP);
Shuhei Yoshitomi, Kanagawa (JP);
Michiko Aizawa, Kanagawa (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 11/987,124

(22) Filed: Nov. 27, 2007

(65) Prior Publication Data
US 2008/0128517 A1 Jun. 5, 2008

(30) Foreign Application Priority Data
Nov. 29, 2006 (JP) .............................. 2006-321032

(51) Int. Cl.
*G06K 21/06* (2006.01)
(52) U.S. Cl. .............................. 235/492; 257/4; 257/40; 438/99; 365/148; 365/64; 428/696
(58) Field of Classification Search ................ 235/492; 257/4, 40; 438/99; 365/148, 64; 428/696
See application file for complete search history.

(56) References Cited

U.S. PATENT DOCUMENTS

| 5,821,138 | A | 10/1998 | Yamazaki et al. |
| 6,339,010 | B2 | 1/2002 | Sameshima |
| 2003/0032210 | A1 | 2/2003 | Takayama et al. |
| 2006/0214008 | A1 | 9/2006 | Asami et al. |
| 2006/0276831 | A1 * | 12/2006 | Porter et al. ................ 606/200 |
| 2007/0105285 | A1 | 5/2007 | Kusumoto et al. |
| 2007/0120650 | A1 * | 5/2007 | Nagai et al. ................ 340/10.2 |
| 2007/0153565 | A1 | 7/2007 | Nomura et al. |

(Continued)

FOREIGN PATENT DOCUMENTS

JP 2003-174153 6/2003

(Continued)

OTHER PUBLICATIONS

Invitation to Pay Additional Fees (Application No. PCT/JP2007/072291) International Search Authority, Dated Dec. 25, 2007.

*Primary Examiner*—Allyson N Trail
(74) *Attorney, Agent, or Firm*—Eric J. Robinson; Robinson Intellectual Property Law Office, P.C.

(57) ABSTRACT

In a method for manufacturing a flexible memory device and semiconductor device, a stack including an element layer and an insulating layer which seals the element layer is formed over a substrate having a separation layer, and the stack is separated from the separation layer. The element layer includes a memory element having a layer containing an organic compound between a pair of electrodes, a first electrode layer and a second electrode layer, and at least one of the pair of electrode layers is formed using an alloy layer containing tin. The flexible memory device and semiconductor device include a memory element having a layer containing an organic compound between a pair of electrodes, a first electrode layer and a second electrode layer, in which at least one of the pair of electrode layers is formed using an alloy layer containing tin.

21 Claims, 29 Drawing Sheets

U.S. PATENT DOCUMENTS

| | | | |
|---|---|---|---|
| 2007/0221986 A1* | 9/2007 | Kang et al. | 257/316 |
| 2007/0224724 A1* | 9/2007 | Cheung et al. | 438/82 |
| 2007/0254186 A1* | 11/2007 | Arakane et al. | 428/696 |
| 2008/0157070 A1* | 7/2008 | Hsieh et al. | 257/40 |

FOREIGN PATENT DOCUMENTS

| | | |
|---|---|---|
| JP | 2006-148080 | 6/2006 |
| JP | 2006-253667 | 9/2006 |
| JP | 2006-310799 | 11/2006 |
| WO | WO 2006/043573 | 4/2006 |
| WO | WO 2006-085633 | 8/2006 |

\* cited by examiner

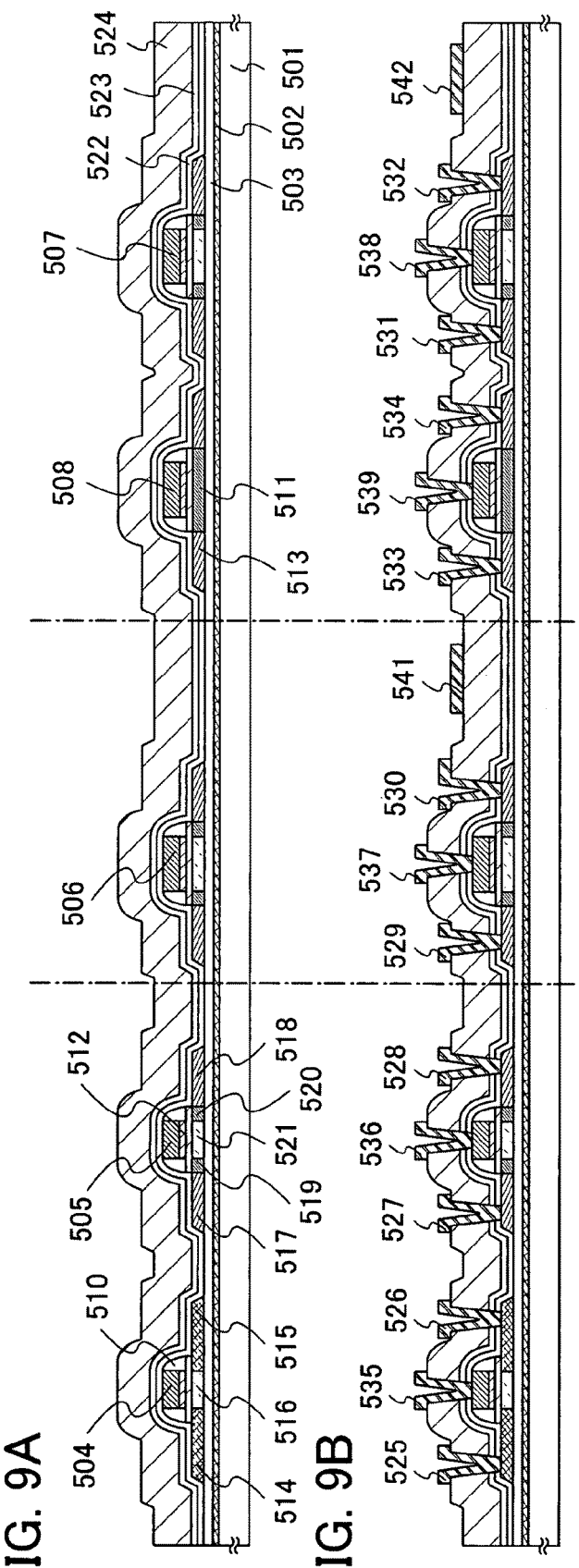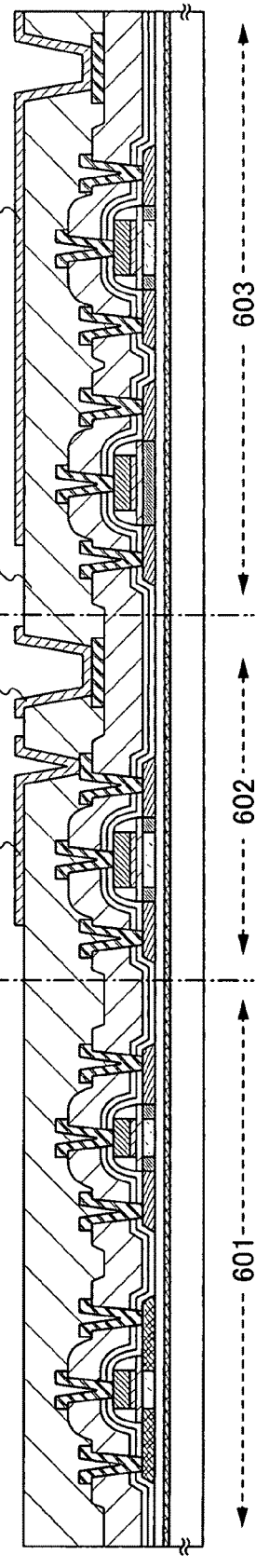

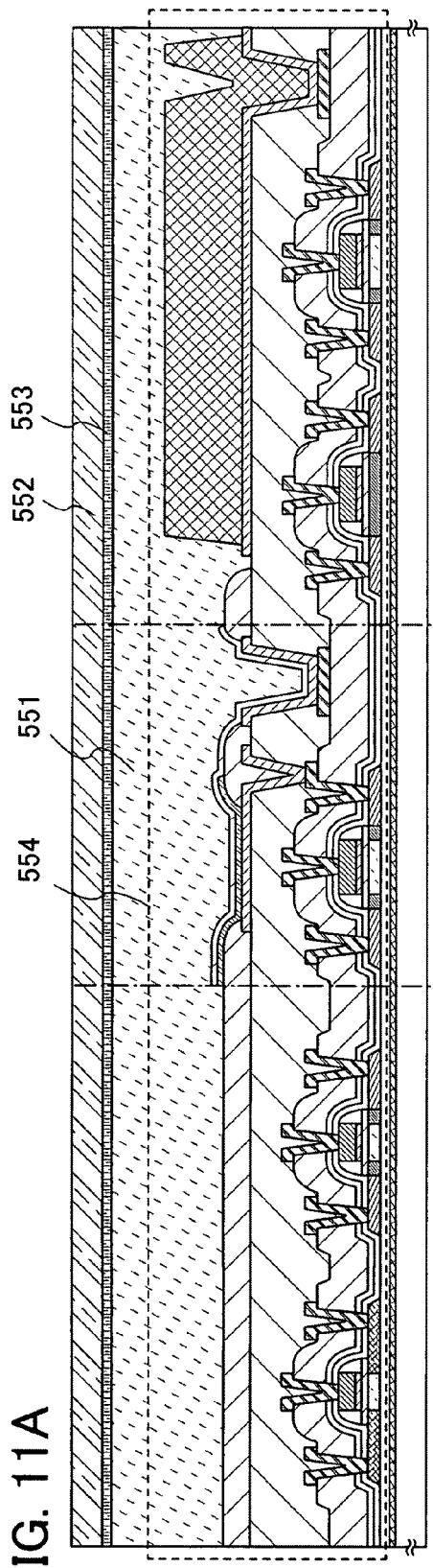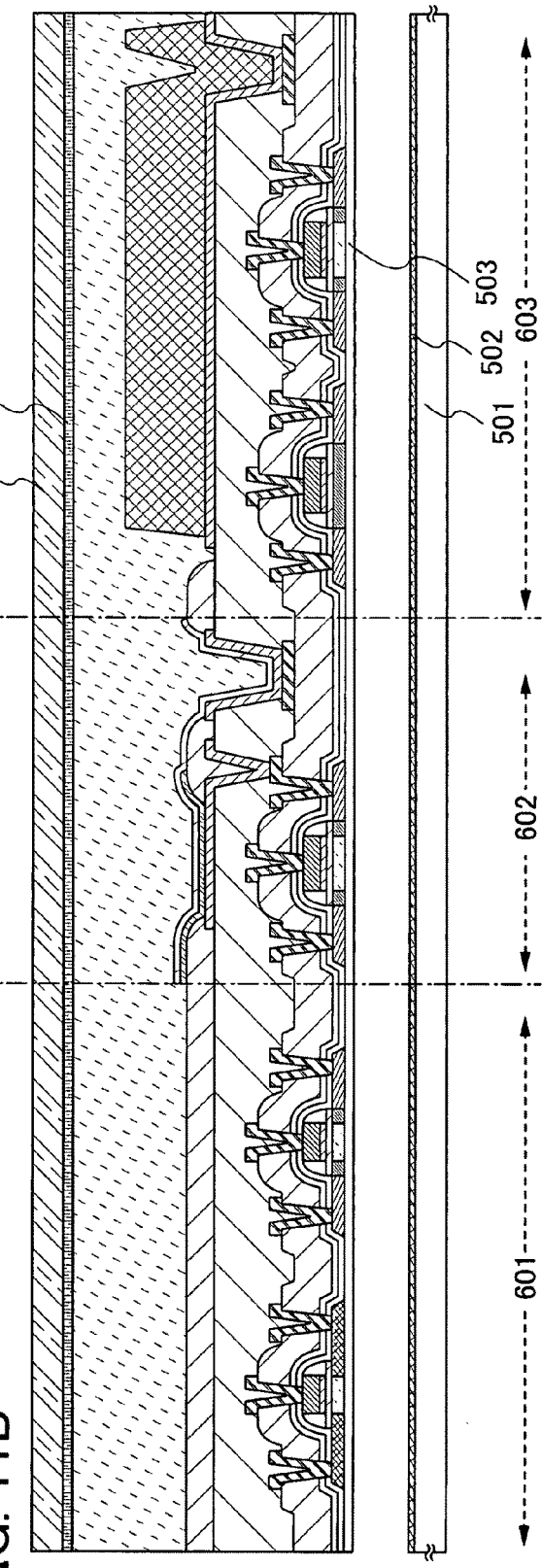

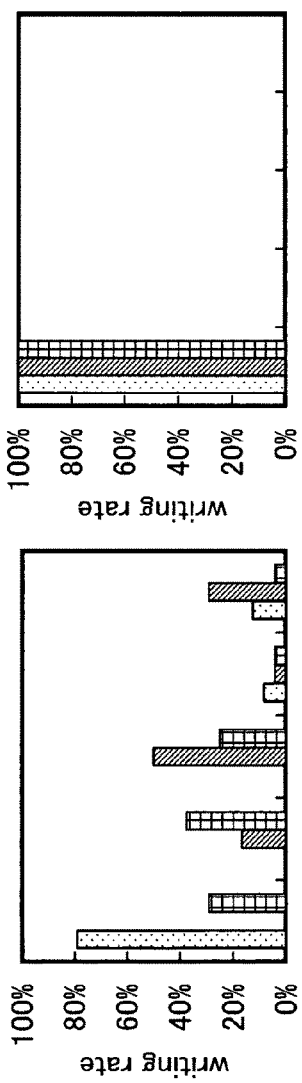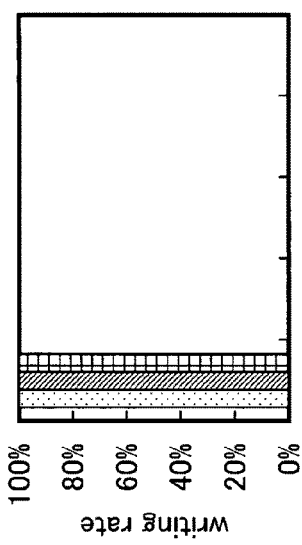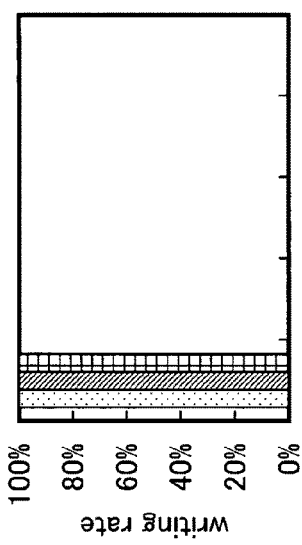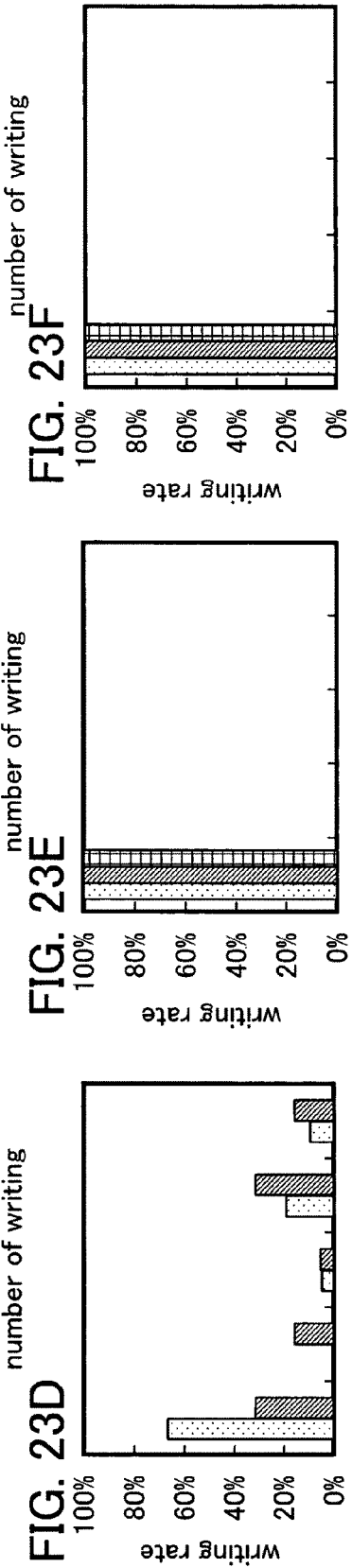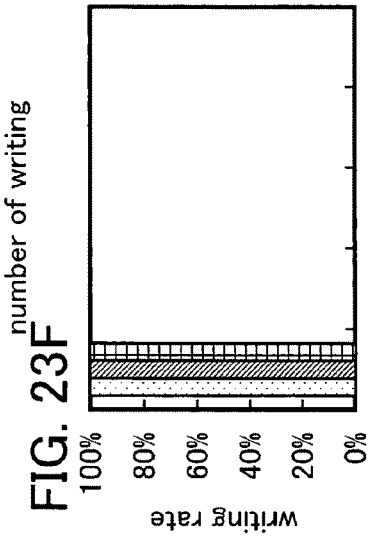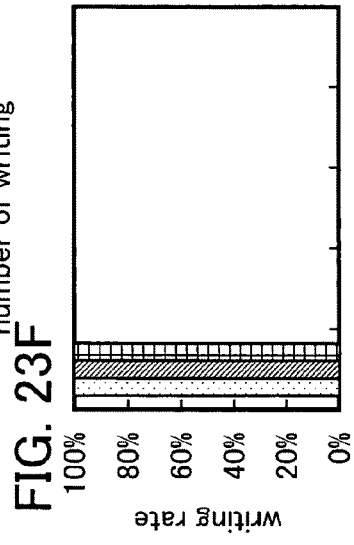

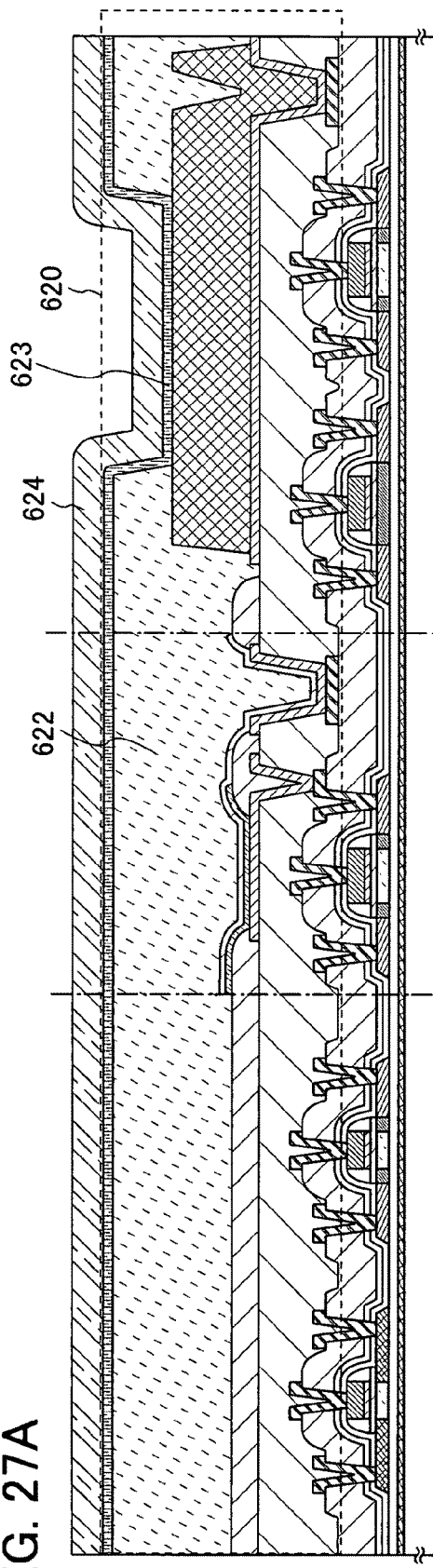
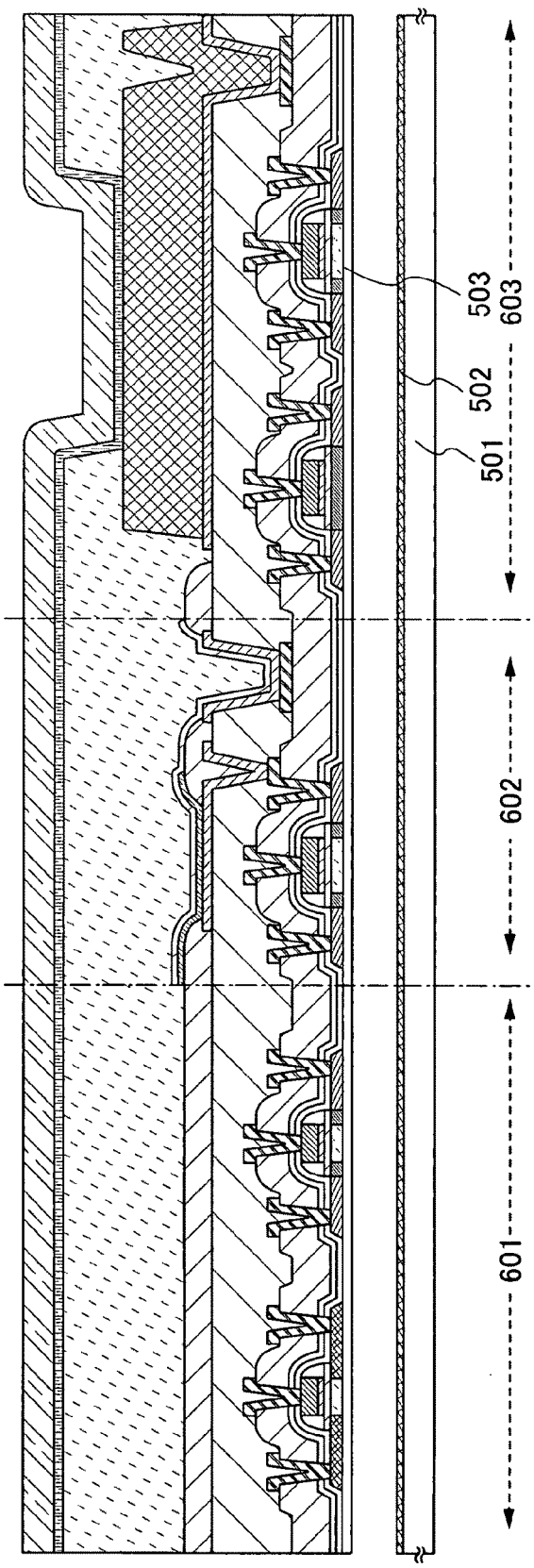
FIG. 27A
FIG. 27B

DEVICE, AND METHOD FOR MANUFACTURING THE SAME

TECHNICAL FIELD

The present invention relates to a device provided with a memory element which includes a layer containing an organic compound, and also relates to a manufacturing method of the device.

BACKGROUND ART

It has been required to manufacture semiconductor devices at low cost, and development has been extensively carried out in recent years on elements such as transistors, memory elements, and solar cells which use layers containing organic compounds for control circuits, memory circuits, and the like (refer to Reference 1: Japanese Published Patent Application No. 2006-148080).

Various applications of semiconductor devices having the elements such as transistors, memory elements, and solar cells which use the layers containing organic compounds are expected. And, compact and lightweight semiconductor devices have been developed by using flexible plastic films instead of non-flexible substrates, e.g., glass substrates or silicon wafers.

Since plastic films have low heat resistance, it is necessary to decrease the highest temperature in a process. Therefore, the semiconductor devices are manufactured by forming semiconductor elements over plastic films by an evaporation method or a sputtering method using a metal mask.

Since plastic films have low heat resistance, transistors formed over plastic substrates cannot have as favorable electrical characteristics as transistors formed over glass substrates at present.

Consequently, such a technique is suggested that minute elements formed over a glass substrate by a photolithography step are separated from the substrate and attached to another base material such as a plastic film (refer to Reference 2: Japanese Published Patent Application No. 2003-174153).

DISCLOSURE OF INVENTION

However, in the case of manufacturing a memory device or a semiconductor device by an evaporation method or a sputtering method using a metal mask, a step of aligning the metal mask is necessary. Therefore, there is a problem in that yield is decreased due to defects in aligning the metal mask.

Moreover, in the case of manufacturing a memory device or a semiconductor device by an evaporation method or a sputtering method using a metal mask, an element is designed in consideration of misalignment. Thus, it is difficult to manufacture transistors, memory elements, and solar cells having minute structures, and reduction in size and weight and improvement in performance of a memory device or a semiconductor device are difficult to be achieved.

Moreover, in the case of separating an element which has a layer containing an organic compound by using a separation step shown in Reference 2, there is a problem in that the layer containing an organic compound and a second electrode layer are separated. Specifically, as shown in FIG. 18, in the case where a separation layer 1102 is formed over a substrate 1101, an insulating layer 1103 serving as a base film is formed over the separation layer 1102, a first electrode layer 1104 is formed over the insulating layer 1103 serving as a base film, a layer 1105 containing an organic compound is formed over the first electrode layer 1104, and a second electrode layer 1106 is formed over the layer 1105 containing an organic compound, and an element 1151 which has the layer 1105 containing an organic compound and a layer 1157 having the element 1151 are separated from the substrate; the separation occurs between the layer 1105 containing an organic compound and the second electrode layer 1106.

As a result, it is difficult to manufacture a memory device and a semiconductor device in which an element including a layer containing an organic compound is provided over a plastic film with high yield.

Further, in a memory device and a semiconductor device having a memory element which includes a layer containing an organic compound, the memory element tends to be damaged due to surroundings. Consequently, there is a concern that a storage function, specifically, reliability of writing characteristics, reading characteristics, memory retention characteristics, or the like of the memory device and the semiconductor device may be decreased.

In view of the above problems, it is an object of the present invention to manufacture a flexible memory device and semiconductor device having an element which includes a layer containing an organic compound with high yield. Further, it is an object to provide a flexible memory device and semiconductor device with a highly reliable storage function, and a manufacturing method thereof.

One aspect of the present invention is a method for manufacturing a flexible memory device and semiconductor device. In this method, a stack including an element layer and an insulating layer which seals the element layer is formed over a substrate having a separation layer, and the stack is separated from the separation layer. The element layer has a memory element including a layer containing an organic compound between a pair of electrodes, a first electrode layer and a second electrode layer, and at least one of the electrode layers is formed using an alloy layer containing tin.

Note that after the stack is separated from the separation layer, the stack may be attached to a flexible substrate to form a flexible memory device and semiconductor device.

In addition, one aspect of the present invention is a flexible memory device and semiconductor device having a memory element including a layer containing an organic compound between a pair of electrodes, a first electrode layer and a second electrode layer, and at least one of the electrode layers is formed using an alloy layer containing tin.

Note that an element layer including the memory element may be provided over a flexible substrate.

Further, the first electrode layer or the second electrode layer is preferably formed using an alloy layer containing tin. In addition, the first electrode layer or the second electrode layer is preferably an alloy layer containing tin of greater than or equal to 1 at. %. The first electrode layer or the second electrode layer is more preferably an alloy layer containing tin of 1 at. % to 10 at. % inclusive, still more preferably 1 at. % to 7 at. % inclusive, still more preferably 1 at. % to 6 at. % inclusive, still more preferably 1 at. % to 5 at. % inclusive, and still more preferably 1 at. % to 4 at. % inclusive.

In the present invention, a typical example of the alloy layer containing tin is an alloy containing a metal element which prevents crystal transition of tin. Representatively, an alloy of tin and silver, an alloy of tin and bismuth, an alloy of tin and antimony, an alloy of tin and copper, an alloy of tin and gold, an alloy of tin and zinc, an alloy of tin and indium, and the like can be given.

The element layer may include one or more of a transistor such as a MOS transistor, a thin film transistor, or an organic semiconductor transistor, a capacitor, a resistor, and an antenna.

Further, the memory device and the semiconductor device of the present invention have a function of storing information. The memory device and the semiconductor device of the present invention perform transmission/reception of instructions or data with radio signals and have a function of storing information which is transmitted and received by the radio signals or a processing result obtained by instructions which are transmitted and received by the radio signals.

In the present invention, in a memory device and a semiconductor device having a memory element including a layer containing an organic compound between a pair of electrodes, a first electrode layer and a second electrode layer, at least one of the electrode layers is formed using an alloy layer containing tin. Since cohesive energy of tin is relatively low, the electrode containing tin is not easily separated from the layer containing an organic compound. In addition, when at least one of the electrode layers is formed using an alloy layer containing tin, contraction and roughness due to modification of a crystalline structure of a tin crystal can be reduced. Further, when at least one of the electrode layers is formed using an alloy layer containing tin, crystal growth of tin can be suppressed, whereby variation in film thickness distribution can be suppressed. Accordingly, memory retention characteristics of the memory element can be prevented from changing with time, and a memory device and a semiconductor device with a highly reliable storage function can be manufactured with high yield. Furthermore, a memory device and a semiconductor device which are very thin, flexible, and highly reliable in memory capability can be manufactured with high yield.

BRIEF DESCRIPTION OF DRAWINGS

In the accompanying drawings:

FIGS. 9A to 9C are cross-sectional views showing a manufacturing process of a semiconductor device of the present invention;

FIGS. 11A and 11B are cross-sectional views showing a manufacturing process of a semiconductor device of the present invention;

FIGS. 23A to 23F are graphs showing measurement results of a semiconductor device of the present invention;

FIGS. 27A and 27B are cross-sectional views showing a manufacturing process of a semiconductor device of the present invention;

BEST MODE FOR CARRYING OUT THE INVENTION

Figure 1A:
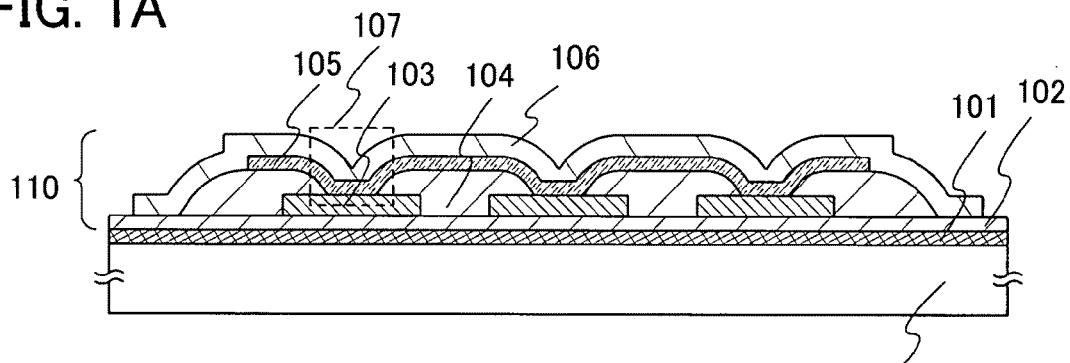
FIGS. 1A to 1D are cross-sectional views showing a manufacturing process of a memory device of the present invention.

Hereinafter, embodiment modes of the present invention will be described with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be interpreted as being limited to the description of the embodiment modes. In a structure of the present invention to be given below, the same portions or portions having similar functions are denoted by the same reference numerals in different drawings.

Embodiment Mode 1

In this embodiment mode, a main structure of a memory device of the present invention and a manufacturing method thereof will be described. Typically, a method for manufacturing a memory device having a memory cell array, in which memory cells each having a memory element that has a layer containing an organic compound between a pair of electrodes, a first electrode layer and a second electrode layer, are arranged in matrix, will be described with reference to FIGS.

1A to 1D, FIGS. 2A to 2C, and FIGS. 4A to 4C. Also, structures of the memory element will be described with reference to FIGS. 3A to 3F.

Figure 4A:
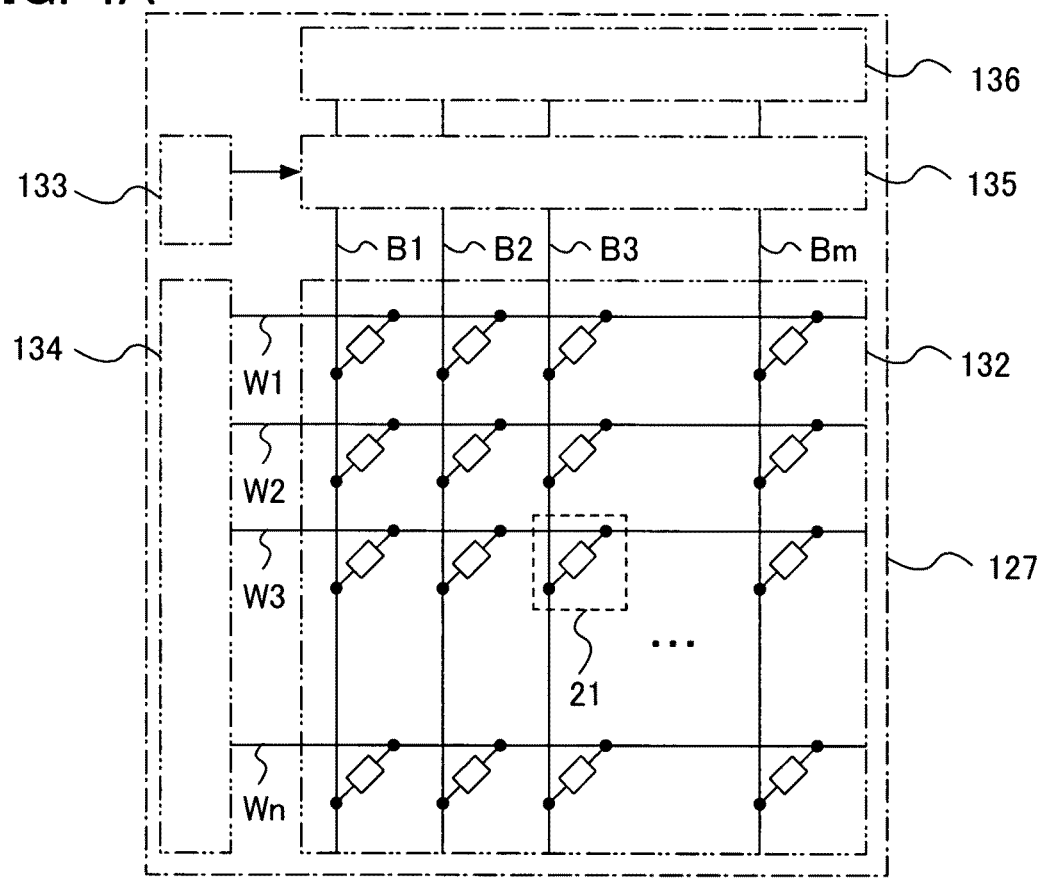
FIGS. 4A to 4C are diagrams showing structures of a memory device of the present invention.

As shown in FIG. 4A, a memory device 127 has a memory cell array 132 and a driver circuit to drive the memory cell array. In the memory cell array 132, memory cells 21 are provided in matrix. The memory cell 21 has a memory element 107 (FIG. 1A). The memory element 107 has, over a substrate 100, a first electrode layer 103 extending in a first direction, a layer 105 containing an organic compound formed over the first electrode layer 103, and a second electrode layer 106 extending in a second direction that intersects with the first direction. Further, an insulating layer serving as a protection film may be provided so as to cover the second electrode layer 106.

The following will describe a method for separating a memory element having a layer containing an organic compound between a pair of electrodes, a first electrode layer and a second electrode layer, and an element layer including the memory element with high yield.

As shown in FIG. 1A, a separation layer 101 is formed over the substrate 100, and an insulating layer 102 serving as a base film is formed over the separation layer 101. The first electrode layer 103 is formed over the insulating layer 102, and an insulating layer (or a partition) 104 is formed over the first electrode layer 103 and the insulating layer 102 serving as a base film. Note that openings are formed in the insulating layer (or a partition) 104 so that the first electrode layer 103 is exposed. The layer 105 containing an organic compound is formed over the insulating layer (or a partition) 104 and the first electrode layer 103. The second electrode layer 106 is formed over the layer 105 containing an organic compound, the insulating layer (or a partition) 104, and the insulating layer 102 serving as a base film.

The memory element 107 includes the first electrode layer 103, the layer 105 containing an organic compound, and the second electrode layer 106. Further, here, a stack from the insulating layer 102 serving as a base film through the second electrode layer 106 is referred to as an element layer 110.

As the substrate 100, a glass substrate, a quartz substrate, a metal or stainless steel substrate with an insulating layer formed over one surface, a plastic substrate having heat resistance against a treatment temperature of this process, or the like is used. Since the aforementioned substrate 100 is not limited in size or shape, when a rectangular substrate with a length of, for example, greater than or equal to 1 m on one side is used as the substrate 100, productivity can be drastically increased. This point is superior to that of a circular silicon substrate.

The separation layer 101 is formed by a sputtering method, a plasma CVD method, a coating method, a printing method, or the like to be a single layer or a stacked layer using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy containing any of the elements described above as its main component; or a compound containing any of the elements described above as its main component. In the case of using silicon as the separation layer, the crystalline structure of a layer containing silicon may be amorphous, microcrystalline, or polycrystalline. Here, a coating method means a method in which a solution is discharged on an object to form a film, and includes, for example, a spin coating method and a droplet discharging method. Further, a droplet discharging method is a method in which droplets of a composition that contains fine particles are discharged through a minute hole to form a pattern with a predetermined shape.

If the separation layer 101 has a single layer structure, it is preferably formed using a tungsten layer, a molybdenum layer, or a layer containing a mixture of tungsten and molybdenum. Alternatively, the separation layer 101 is formed using a layer containing an oxide of tungsten, a layer containing an oxynitride of tungsten, a layer containing an oxide of molybdenum, a layer containing an oxynitride of molybdenum, or a layer containing an oxide or an oxynitride of a mixture of tungsten and molybdenum. Note that the mixture of tungsten and molybdenum corresponds to, for example, an alloy of tungsten and molybdenum.

In the case where the separation layer 101 has a stacked layer structure, preferably, a metal layer is formed as a first layer, and a metal oxide layer or a metal nitride oxide layer is formed as a second layer. Representatively, a metal layer such as a tungsten layer, a molybdenum layer, or a layer containing a mixture of tungsten and molybdenum is formed as the first layer. As the second layer, a layer containing an oxide of tungsten, molybdenum, or a mixture of tungsten and molybdenum; or a nitride oxide of tungsten, molybdenum, or a mixture of tungsten and molybdenum is formed.

In the case where the separation layer 101 has a stacked layer structure in which a metal layer is formed as the first layer and a metal oxide layer is formed as the second layer, the stacked layer structure may be formed by utilizing the following: a layer containing tungsten is formed as the metal layer, and an insulating layer formed of an oxide is formed thereover, whereby a layer containing an oxide of tungsten is formed as the metal oxide layer in an interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability such as ozone water, or the like.

Further, as the separation layer 101, a metal layer may be formed as the first layer, and a metal nitride layer or a metal oxynitride layer may be formed as the second layer. Representatively, after a metal layer such as a tungsten layer, a molybdenum layer, or a layer containing a mixture of tungsten and molybdenum is formed as the first layer, a layer containing a nitride of tungsten, molybdenum, or a mixture of tungsten and molybdenum; or an oxynitride of tungsten, molybdenum, or a mixture of tungsten and molybdenum may be formed as the second layer.

An oxide of tungsten is represented by $WO_x$ where x is greater than or equal to 2 and less than or equal to 3. The x may be 2 ($WO_2$), 2.5 ($W_2O_5$), 2.75 ($W_4O_{11}$), 3 ($WO_3$), and the like.

Although the separation layer 101 is formed to be in contact with the substrate 100 in accordance with the above process, the present invention is not limited to this process. An insulating layer to be a base may be formed so as to be in contact with the substrate 100, and the separation layer 101 may be provided to be in contact with the insulating layer.

The insulating layer 102 serving as a base film is formed using an inorganic compound to be a single layer or a multilayer by a sputtering method, a plasma CVD method, a coating method, a printing method, or the like. As a typical example of an inorganic compound, silicon oxide, silicon nitride, silicon oxynitride, silicon nitride oxide, or the like can be given. Note that when silicon nitride, silicon nitride oxide, silicon oxynitride, or the like is used for the insulating layer 102 serving as a base film, moisture or gas such as oxygen can be prevented from entering the element layer which is formed afterward from outside.

Further, the insulating layer 102 serving as a base film may have a stacked layer structure. For example, the stacked layer structure may be formed using an inorganic compound. Typically, the insulating layer 102 may be formed by stacking silicon oxide, silicon nitride oxide, and/or silicon oxynitride.

The first electrode layer 103 can be formed to have a single layer or multilayer structure formed of a metal, an alloy, a compound, or the like having high conductivity by a sputtering method, a plasma CVD method, a coating method, a printing method, an electrolytic plating method, an electroless plating method, an evaporation method, or the like.

As the first electrode layer 103, indium tin oxide (hereinafter, referred to as ITO), indium tin oxide containing silicon, indium oxide containing zinc oxide of 2 to 20 at. %, or the like can be used. Further, titanium (Ti), gold (Au), platinum (Pt), nickel (Ni), tungsten (W), chromium (Cr), molybdenum (Mo), iron (Fe), cobalt (Co), copper (Cu), palladium (Pd), a nitride of the metal material (e.g., titanium nitride, tungsten nitride, molybdenum nitride), or the like can be used.

In addition, as the first electrode layer 103, an alkali metal such as lithium (Li) or cesium (Cs), an alkaline earth metal such as magnesium (Mg), calcium (Ca), or strontium (Sr), aluminum (Al), an alloy containing any of these (a magnesium-silver alloy or an aluminum-lithium alloy), a rare earth metal such as europium (Eu) or ytterbium (Yb), an alloy containing any of these, and the like can be used.

Further, the first electrode layer 103 can be formed of a tin alloy. Typical examples of a tin alloy include an alloy of tin and silver, an alloy of tin and bismuth, an alloy of tin and antimony, an alloy of tin and copper, an alloy of tin and gold, an alloy of tin and zinc, an alloy of tin and indium, and the like. Furthermore, the first electrode layer 103 may be formed of an alloy of tin and one or more elements of silver, bismuth, antimony, copper, gold, zinc, and indium. Note that the first electrode layer 103 is preferably an alloy layer containing tin of greater than or equal to 1 at. %. The first electrode layer 103 is more preferably an alloy layer containing tin of 1 at. % to 10 at. % inclusive, still more preferably 1 at. % to 7 at. % inclusive, still more preferably 1 at. % to 6 at. % inclusive, still more preferably 1 at. % to 5 at. % inclusive, and still more preferably 1 at. % to 4 at. % inclusive.

The layer 105 containing an organic compound can be formed by an evaporation method, an electron beam evaporation method, a coating method, or the like.

In this embodiment mode, after a titanium layer is formed with a thickness of 50 nm to 200 nm by a sputtering method, the titanium film is etched to have a desired shape by a photolithography method to form the first electrode layer 103. Next, the layer containing an organic compound is formed using NPB by an evaporation method.

The second electrode layer 106 can be formed by an evaporation method, a sputtering method, a CVD method, a printing method, a coating method, or the like. The second electrode layer 106 can be formed of a tin alloy. Typical examples of a tin alloy include an alloy of tin and silver, an alloy of tin and bismuth, an alloy of tin and antimony, an alloy of tin and copper, an alloy of tin and gold, an alloy of tin and zinc, an alloy of tin and indium, and the like. Further, the second electrode layer 106 may be formed of an alloy of tin and one or more elements of silver, bismuth, antimony, copper, gold, zinc, and indium. Note that the second electrode layer 106 is preferably an alloy layer containing tin of greater than or equal to 1 at. %. The second electrode layer 106 is more preferably an alloy layer containing tin of 1 at. % to 10 at. % inclusive, still more preferably 1 at. % to 7 at. % inclusive, still more preferably 1 at. % to 6 at. % inclusive, still more preferably 1 at. % to 5 at. % inclusive, and still more preferably 1 at. % to 4 at. % inclusive.

Moreover, the second electrode layer 106 can have a stacked layer structure. Typically, after a tin alloy layer is formed as a first layer, a metal layer of titanium (Ti), gold (Au), platinum (Pt), nickel (Ni), tungsten (W), chromium (Cr), molybdenum (Mo), iron (Fe), cobalt (Co), copper (Cu), palladium (Pd), aluminum (Al), magnesium (Mg), a nitride of the metal material (e.g., titanium nitride, tungsten nitride, or molybdenum nitride), or the like may be formed as a second layer. By forming the second layer, when high-current conduction is generated in writing data to the memory element, the tin alloy layer of the first layer can be prevented from peeling.

By forming the first electrode layer 103 or the second electrode layer 106 using an alloy layer containing tin, it is possible to reduce contraction and roughness due to modification in crystalline structure of a tin crystal. In addition, if only tin is deposited, a thickness distribution is varied locally in the first electrode layer 103 or the second electrode layer 106 by crystal growth of tin, and a region is generated where a distance between the first electrode layer and the second electrode layer is large. However, by forming the first electrode layer 103 or the second electrode layer 106 using an alloy layer containing tin, a thickness distribution can be prevented from being varied locally in the first electrode layer 103 or the second electrode layer 106. In addition, the first electrode layer 103 or the second electrode layer 106 formed by depositing only tin by an evaporation method has low film quality. However, by forming the first electrode layer 103 or the second electrode layer 106 using an alloy layer containing tin by an evaporation method, a flat film can be obtained. Accordingly, a data change can be avoided, and reliability of a storage function can be enhanced.

Here, tin and silver are evaporated at the same time by an evaporation method, and the second electrode layer 106 is formed of an alloy of tin and silver.

Now, a more specific structure of the memory element 107 will be hereinafter shown with reference to FIGS. 3A to 3F.

Figure 3A:
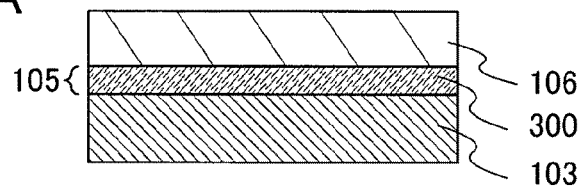
FIGS. 3A to 3F are cross-sectional views showing structures of a memory element which can be applied to the present invention.

As shown in FIG. 3A, the layer 105 containing an organic compound is formed to be a layer that changes in a crystal condition, conductivity, and a shape by voltage applied to the first electrode layer 103 and the second electrode layer 106, to form the memory element 107. By the voltage applied to the first electrode layer 103 and the second electrode layer 106, a crystal condition, conductivity, and a shape of the layer 105 containing an organic compound are changed, whereby electric resistance of the memory element is changed. By using this change, data of "0" or "1" can be recorded.

Here, the layer 105 containing an organic compound is formed using an organic compound layer 300. Note that the organic compound layer 300 can have a single layer or multilayer structure of organic compound layers.

The thickness of the layer 105 containing an organic compound is preferably set so that the electric resistance of the memory element is changed by voltage applied to the first electrode layer 103 and the second electrode layer 106. A typical thickness of the layer 105 containing an organic compound is 1 nm to 100 nm, preferably, 10 nm to 60 nm, more preferably, 5 nm to 30 nm.

The organic compound layer 300 can be formed of an organic compound having a hole-transporting property or an organic compound having an electron-transporting property.

As the organic compound having a hole-transporting property, for example, phthalocyanine (abbreviation: $H_2Pc$), copper phthalocyanine (abbreviation: CuPc), and vanadyl phthalocyanine (abbreviation: VOPc) are given. Besides them, the following are given: 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis{N-[4-di(m-tolyl)amino]phenyl-N-phenylamino}biphenyl (abbreviation: DNTPD); 4,4'-bis[N-(4-biphenylyl)-N-phenylamino]biphenyl (abbreviation: BBPB); 4,4',4''-tri(N-carbazolyl)triphenylamine (abbreviation: TCTA); and the like. However, the present invention is not limited to these. The substances mentioned here mainly have a hole mobility of greater than or equal to $10^{-6}$ cm$^2$/Vs.

As the organic compound having an electron-transporting property, the following materials formed of a metal complex having a quinoline skeleton or a benzoquinoline skeleton, or the like can be used: tris(8-quinolinolato)aluminum (abbreviation: Alq$_3$); tris(4-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)-4-phenylphenolato-aluminum (BAlq); and the like. Besides them, the following materials such as a metal complex having an oxazole-based ligand or a thiazole-based ligand, or the like can also be used: bis[2-(2-hydroxyphenyl)benzoxazolato]zinc (abbreviation: Zn(BOX)$_2$); bis[2-(2-hydroxyphenyl)benzothiazolato]zinc (abbreviation: Zn(BTZ)$_2$); and the like. Furthermore, in addition to such a metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproine (abbreviation: BCP); and the like can also be used. The substances mentioned here mainly have an electron mobility of greater than or equal to $10^{-6}$ cm$^2$/Vs.

Note that a substance having mobility outside the above range, for example, 2,3-bis(4-diphenylaminophenyl)quinoxaline (abbreviation: TPAQn), 9-[4-(N-carbazolyl)]phenyl-10-phenylanthracene (hereinafter, referred to as CzPA), or the like may also be used.

Further, the organic compound layer 300 may be formed using a mixture of a plurality of the above-mentioned organic compounds. Furthermore, the organic compound layer 300 may be formed by stacking the above-mentioned organic compounds.

In addition, in the organic compound layer 300, an insulator may also be mixed into the organic compound having a hole-transporting property or an electron-transporting property. Note that the insulator does not have to be dispersed uniformly. Morphology of the organic compound layer 300 can be improved by mixing the insulator into the organic compound. Thus, since partial crystallization or the like of the film can be suppressed, variations in behavior of each memory element can be further suppressed.

Figure 3B:
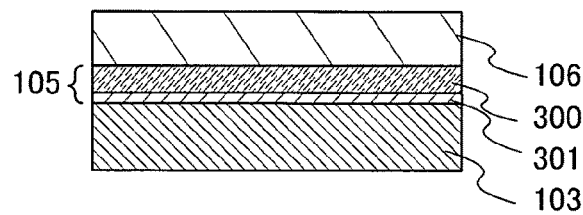

Further, as shown in FIG. 3B, the layer 105 containing an organic compound may be formed of the organic compound layer 300 and a buffer layer 301. The buffer layer 301 is formed of an inorganic compound or an organic compound that is stable thermally and chemically. Typically, the buffer layer 301 is formed of an inorganic insulator, an inorganic semiconductor, or an organic insulator.

When the buffer layer 301 is formed of an inorganic insulator or an organic insulator, the buffer layer 301 is a layer for injecting electric charges such as holes or electrons from the first electrode layer or the second electrode layer to the organic compound layer, by a tunnel effect. The buffer layer 301 has a thickness capable of injecting electric charges to the organic compound layer 300 by a tunnel effect at a predetermined voltage. A typical thickness of the buffer layer 301 as an insulator is 0.1 nm to 4 nm inclusive, preferably, 0.1 nm to 2 nm inclusive. Since the thickness of the buffer layer 301 is as thin as 0.1 nm to 4 nm inclusive, the tunnel effect is generated in the buffer layer 301, so that a charge-injecting property to the organic compound layer 300 is improved. Accordingly, when the thickness of the buffer layer 301 exceeds 4 nm, the tunnel effect is not easily generated in the buffer layer 301, so that it is difficult to inject electric charges to the organic compound layer 300; thus, the voltage to be applied in writing into the memory element increases.

A typical example of an inorganic insulator which forms the buffer layer 301 is an oxide having an insulating property typified by lithium oxide, sodium oxide, potassium oxide, rubidium oxide, beryllium oxide, magnesium oxide, calcium oxide, strontium oxide, barium oxide, cesium oxide, zirconium oxide, hafnium oxide, francium oxide, tantalum oxide, technetium oxide, manganese oxide, iron oxide, cobalt oxide, palladium oxide, silver oxide, alumina, gallium oxide, bismuth oxide, or the like.

Further, typical examples of an inorganic insulator which forms the buffer layer 301 are fluoride having an insulating property typified by lithium fluoride, sodium fluoride, potassium fluoride, cesium fluoride, beryllium fluoride, magnesium fluoride, calcium fluoride, strontium fluoride, barium fluoride, aluminum fluoride, silver fluoride, manganese fluoride, or the like; chloride having an insulating property typified by lithium chloride, sodium chloride, potassium chloride, cesium chloride, beryllium chloride, calcium chloride, barium chloride, aluminum chloride, tin chloride, silver chloride, zinc chloride, titanium chloride, strontium chloride, iron chloride, palladium chloride, antimony chloride, strontium chloride, thallium chloride, copper chloride, manganese chloride, ruthenium chloride, or the like; bromide having an insulating property typified by calcium bromide, cesium bromide, silver bromide, barium bromide, lithium bromide, or the like; and iodide having an insulating property typified by sodium iodide, potassium iodide, barium iodide, thallium iodide, silver iodide, titanium iodide, calcium iodide, silicon iodide, cesium iodide, or the like.

Typical examples of an inorganic insulator which forms the buffer layer 301 are carbonate having an insulating property typified by lithium carbonate, calcium carbonate, sodium carbonate, manganese carbonate, strontium carbonate, barium carbonate, iron carbonate, cobalt carbonate, nickel carbonate, copper carbonate, silver carbonate, zinc carbonate, or the like; sulfate having an insulating property typified by lithium sulfide, calcium sulfide, sodium sulfide, magnesium sulfide, strontium sulfide, barium sulfide, titanium sulfide, zirconium sulfide, manganese sulfide, iron sulfide, cobalt sulfide, nickel sulfide, copper sulfide, silver sulfide, zinc sulfide, aluminum sulfide, indium sulfide, tin sulfide, antimony sulfide, bismuth sulfide, or the like; nitrate having an insulating property typified by lithium nitrate, potassium nitrate, sodium nitrate, magnesium nitrate, calcium nitrate, strontium nitrate, barium nitrate, titanium nitrate, zirconium nitrate, manganese nitrate, iron nitrate, cobalt nitrate, nickel nitrate, copper nitrate, silver nitrate, zinc nitrate, aluminum nitrate, indium nitrate, tin nitrate, or the like; and nitride having an insulating property typified by aluminum nitride, silicon nitride, or the like.

Note that when the buffer layer 301 is formed of an inorganic insulator, the thickness of the buffer layer 301 is preferably 0.1 nm to 4 nm inclusive. When the thickness of the insulating layer exceeds 4 nm, the voltage to be applied in writing increases.

A typical example of an organic insulator which forms the buffer layer 301 is an organic resin typified by polyimide, an acrylic resin, polyamide, a benzocyclobutene resin, polyester, a novolac resin, a melamine resin, a phenol resin, an epoxy resin, a silicone resin, a furan resin, a diallyl phthalate resin, or the like.

The buffer layer 301 may be a single layer formed of an inorganic insulator, an organic insulator, or a semiconductor, or may be a multilayer in which different layers formed of an inorganic insulator, an organic insulator, and a semiconductor are stacked. For example, a stacked layer of an inorganic insulator layer and a semiconductor layer, a stacked layer of an inorganic insulator layer and an organic insulator layer, a stacked layer of an organic insulator layer and a semiconductor layer, or the like, can be used as appropriate.

A typical example of an inorganic semiconductor which forms the buffer layer 301 is a semiconductor such as silicon, germanium, molybdenum oxide, tin oxide, bismuth oxide, vanadium oxide, titanium oxide, iron oxide, chromium oxide, copper oxide, manganese silicon oxide, nickel oxide, zinc oxide, silicon germanium, gallium arsenide, gallium nitride, indium oxide, indium phosphide, indium nitride, cadmium sulfide, cadmium telluride, or strontium titanate. Note that the buffer layer 301 does not always have to be formed of one kind of semiconductor. The buffer layer 301 may be formed by mixing a plurality of semiconductor materials.

Note that when the buffer layer 301 is formed of an inorganic semiconductor, the thickness of the buffer layer 301 is not particularly limited as long as it is greater than or equal to 0.1 nm, and the thickness may be as thin as less than or equal to 10 nm or may be greater than or equal to 10 nm, for example.

The buffer layer 301 can be formed by an evaporation method, an electron beam evaporation method, a sputtering method, a CVD method, or the like. Further, a spin coating method, a sol-gel method, a printing method, a droplet discharging method, or the like, can be used.

Figure 3C:
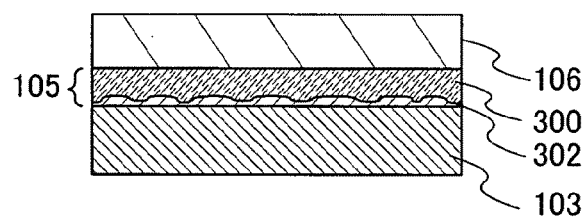

As shown in FIG. 3C, the layer 105 containing an organic compound may be formed by using the organic compound layer 300 and a continuous buffer layer 302 having depression and projection. It is preferable that the thickness at the projection portion of the buffer layer be 0.1 nm to 10 nm inclusive, preferably 2 nm to 8 nm inclusive, and that at the depression portion be greater than or equal to 0.1 nm and less than 4 nm, preferably greater than or equal to 1 nm and less than 2 nm.

Figure 3D:
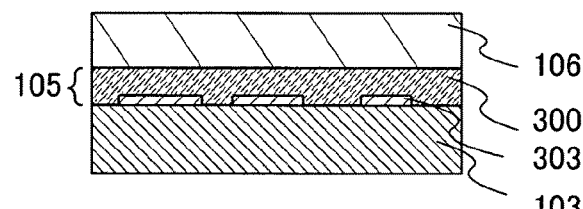

As shown in FIG. 3D, the layer 105 containing an organic compound may be formed by using the organic compound layer 300 and discontinuous insulating layers 303 dispersed. The discontinuous insulating layers 303 may have an island shape, a stripe shape, a net-like shape, or the like.

Moreover, an insulating particle may be provided instead of the buffer layers 301 to 303. The insulating particle in this case preferably has a grain size of 0.1 nm to 4 nm inclusive, or more preferably 1 nm to 4 nm inclusive.

Note that in FIGS. 3B to 3D, the buffer layers 301 to 303 are provided between the first electrode layer 103 and the organic compound layer 300; however, the buffer layers 301 to 303 may also be provided between the second electrode layer 106 and the organic compound layer 300.

Figure 3E:
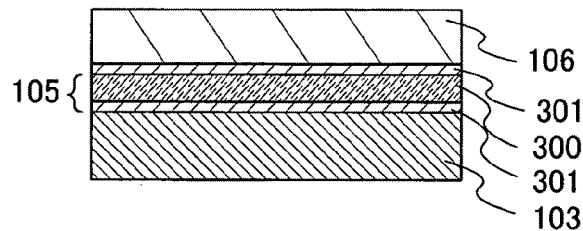

Further, as shown in FIG. 3E, the buffer layers 301 to 303 or the insulating particles may be provided between the first electrode layer 103 and the organic compound layer 300, and between the organic compound layer 300 and the second electrode layer 106.

A buffer layer formed of an inorganic insulator or an organic insulator with a thickness of less than or equal to 4 nm, preferably less than or equal to 2 nm is provided between the first electrode layer 103 and the organic compound layer 300, or between the organic compound layer 300 and the second electrode layer 106, whereby tunnel current flows through the insulating layer. Therefore, variations of the applied voltage and the amount of current in writing data to the memory element can be reduced. Further, when a buffer layer formed of an inorganic insulator or an organic insulator with a thickness of less than or equal to 4 nm, preferably less than or equal to 2 nm is provided between the first electrode layer 103 and the organic compound layer 300, or between the organic compound layer 300 and the second electrode layer 106, a charge injecting-property is increased due to a tunnel effect, and the thickness of the organic compound layer 300 can be increased, thereby making it possible to prevent short-circuiting in an initial state. As a consequence, reliability of a memory device and a semiconductor device can be improved.

Figure 3F:
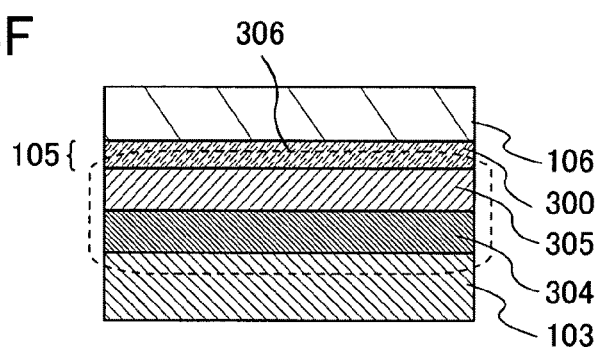

As a different structure from the aforementioned one, an element having a rectifying effect may be provided between the first electrode layer 103 and the layer 105 containing an organic compound, or between the second electrode layer 106 and the layer 105 containing an organic compound (FIG. 3F). As the element having a rectifying effect, typically, a Schottky diode, a diode having a PN junction, a transistor in which a gate electrode is connected to a drain electrode, or the like, is given. Needless to say, a diode having another structure may also be used. Here, a case is shown, in which a PN junction diode 306 including semiconductor layers 304 and 305 is provided between the first electrode layer 103 and the layer 105 containing an organic compound. One of the semiconductor layers 304 and 305 is an n-type semiconductor while the other is a p-type semiconductor. By providing the element having a rectifying effect in this way, the selectivity of a memory cell can be improved and reading and writing can be improved.

Figure 1B:
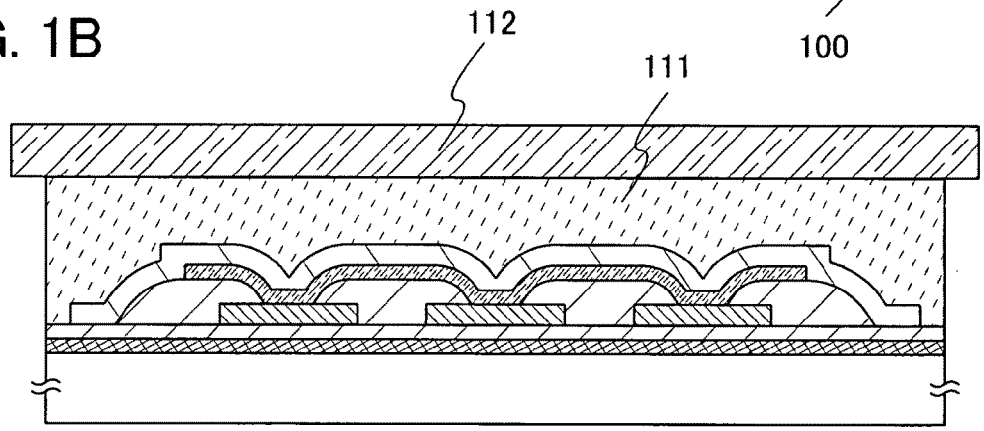

Next, a sealing layer 111 is formed over the second electrode layer 106 as shown in FIG. 1B. Then, an adhesive member 112 is attached to the surface of the sealing layer 111.

The sealing layer 111 is preferably formed by applying a composition by a coating method and then heating and drying the composition. Since such a sealing layer 111 is provided as a protection layer to work in a later separation step, the sealing layer 111 is preferably an insulating layer which has little depression and projection on the surface. Such an insulating layer can be formed by a coating method. Alternatively, the sealing layer 111 may be formed by the steps of forming a thin film by a CVD method, a sputtering method, or the like and then polishing the surface of the thin film by a CMP method. Further alternatively, the sealing layer 111 may be formed by the steps of forming a thin film by a CVD method, a sputtering method, or the like, then forming a resist layer, and etching the resist layer and the thin film.

The sealing layer 111 formed by a coating method is formed of the following: an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; an inorganic siloxane polymer including a Si—O—Si bond among compounds containing silicon, oxygen, and hydrogen formed by using a siloxane polymer-based material typified by silica glass as a starting material; or an organic siloxane polymer in which hydrogen bonded to silicon is substituted by an organic group such as methyl or phenyl, typified by an alkylsiloxane polymer, an alkylsilsesquioxane polymer, a silsesquioxane hydride polymer, or an alkylsilsesquioxane hydride polymer. The thin film formed by a CVD method, a sputtering method, or the like as described above is formed of silicon oxide, silicon oxynitride, silicon nitride oxide, silicon nitride, or the like.

Here, the sealing layer 111 is formed of an epoxy resin by applying a composition by a coating method and baking it.

After the first insulating layer 102, the first electrode layer 103, the insulating layer 104, the layer 105 containing an organic compound, the second electrode layer 106 or sealing layer 111 are formed, heat treatment may be performed to weaken the metal oxide layer in the separation layer 101. Alternatively, by heat treatment performed for forming the insulating layer 104 or sealing layer 111, the metal oxide layer in the separation layer 101 may be weakened.

As the adhesive member 112, a photoplastic adhesive film, a thermoplastic adhesive film, or the like can be used. Further, as the adhesive member 112, adhesive tape, sheet, substrate, roller, or the like can be appropriately used instead of the film. Further, after a photoplastic adhesive film, a thermoplastic adhesive film, or the like is used as the adhesive member 112, it can be reeled off by a roller. Moreover, instead of the adhesive member 112, a member to be attached to the surface of the sealing layer 111 by electrostatic force or adsorption power may be provided. Here, as the adhesive member 112, a photoplastic adhesive film is used.

Figure 1C:
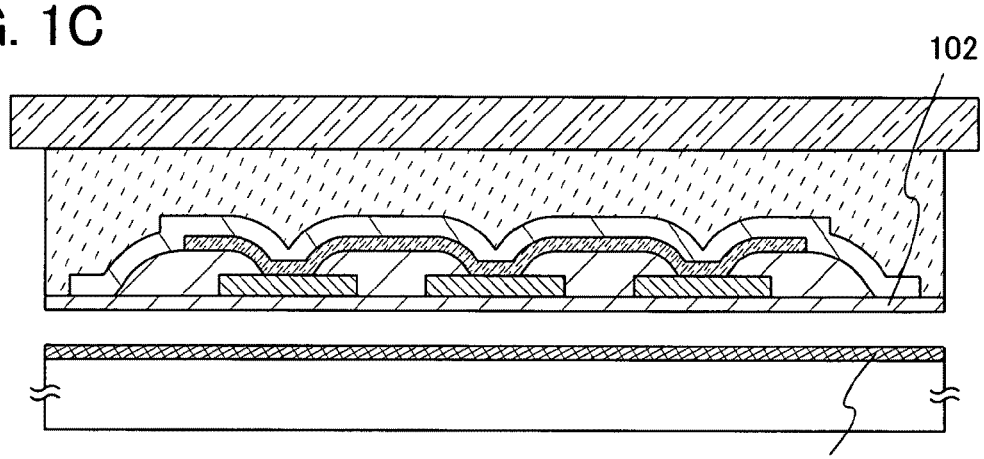

Next, as shown in FIG. 1C, the separation layer 101 and the insulating layer 102 serving as a base film are separated from each other. The element layer 110 is separated from the substrate 100 having the separation layer by a physical method at a metal oxide layer formed at the interface between the separation layer 101 and the insulating layer 102. The physical method refers to a dynamic method or a mechanical method, which changes some dynamic energy (mechanical energy). The typical physical method refers to mechanical power addition (for example, separating by a human hand or grip tool, or division treatment by rolling a roller).

In this embodiment mode, a method is used, in which the separation layer including the metal layer and the metal oxide layer is formed between the substrate and the element layer, the metal oxide layer is weakened by the heat treatment, and the element layer is physically separated. However, the present invention is not limited to this method and can employ the following methods as appropriate: (1) a method in which an amorphous silicon layer containing hydrogen is provided as a separation layer between the substrate and the element layer, and the substrate is separated by discharging a hydrogen gas contained in the amorphous silicon layer by laser beam irradiation; (2) a method in which a separation layer including a metal layer and a metal oxide layer is formed between the substrate and the element layer, the metal oxide layer is weakened by crystallization, and the separation layer is removed by etching using a solution; (3) a method in which only the substrate 100, which is provided with the element layer and the sealing layer 111, is mechanically removed, or the substrate 100 is removed by etching using a solution or a halogen fluoride gas such as $NF_3$, $BrF_3$, or $ClF_3$; (4) a method in which a metal layer and a metal oxide layer are provided as a separation layer between the substrate and the element layer, the metal oxide layer is weakened by crystallization, a part of the metal layer is removed by etching using a solution or a halogen fluoride gas such as $NF_3$, $BrF_3$, or $ClF_3$, and then the element layer is physically separated at the weakened metal oxide layer; and the like.

In this embodiment mode, the second electrode layer 106 is formed of an alloy containing tin and thus easily changed in shape because of elasticity. Therefore, when the separation layer 101 and the insulating layer 102 serving as a base film are separated from each other, even if power is applied to the element layer 110 and the sealing layer 111 and thus the element layer 110 and the sealing layer 111 are bent, this power is absorbed by the second electrode layer 106; thus, the layer 105 containing an organic compound and the second electrode layer 106 are not separated from each other but the separation layer 101 and the insulating layer 102 serving as a base film are separated from each other.

Figure 1D:
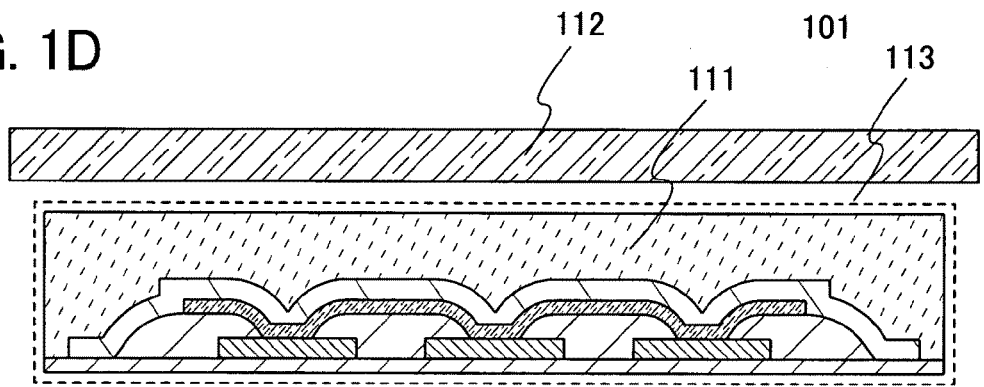

Next, as shown in FIG. 1D, the adhesive member 112 is separated from the sealing layer 111. Consequently, a thin and highly reliable memory device 113 can be formed.

Figure 2A:
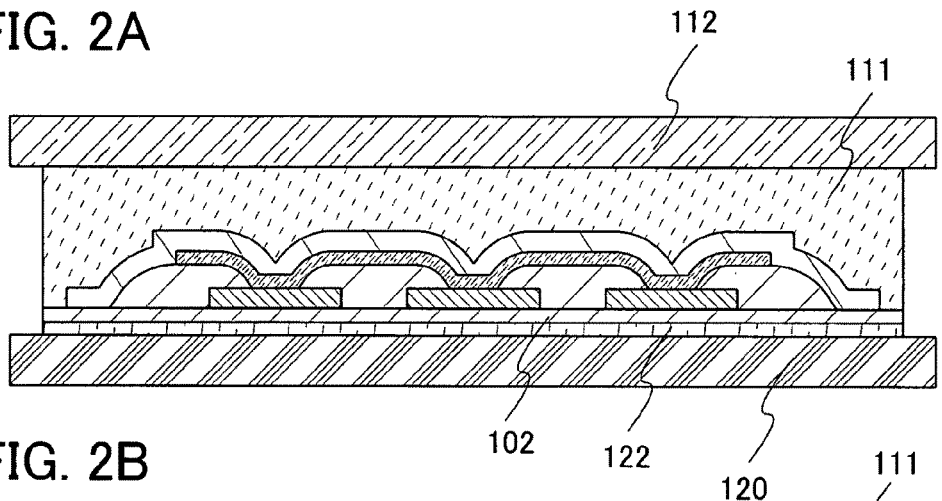
FIGS. 2A to 2C are cross-sectional views showing a manufacturing process of a memory device of the present invention.

Alternatively, after the step shown in FIG. 1C, as shown in FIG. 2A, a flexible substrate 120 may be attached to the insulating layer 102 serving as a base film by using an adhesive 122.

The flexible substrate 120 is preferably a flexible, thin, and lightweight substrate. Typically, a plastic substrate such as PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, or polyphthalamide, or the like, paper made of a fibrous material, a ceramic sheet, or the like can be used. In the case where these substrates are used, the adhesive 122 is provided between the sealing layer 111 and the flexible substrate 120, and the sealing layer 111 and the flexible substrate 120 are attached to each other.

Moreover, as the flexible substrate 120, paper made of a fibrous material, a stacked layer film including a base material film (polyester, polyamide, an inorganic evaporated film, or the like) and an adhesive organic resin film (an acrylic based organic resin, an epoxy based organic resin, or the like), or the like can also be used. In the case where these substrates are used, the flexible substrate 120 is attached to the insulating layer 102 by thermocompression, and the adhesive organic resin film is cured after being plasticized, whereby the insulating layer 102 can be firmly attached to the stacked layer film. In this case, the adhesive 122 is not necessarily provided between the insulating layer 102 and the flexible substrate 120.

Figure 2B:
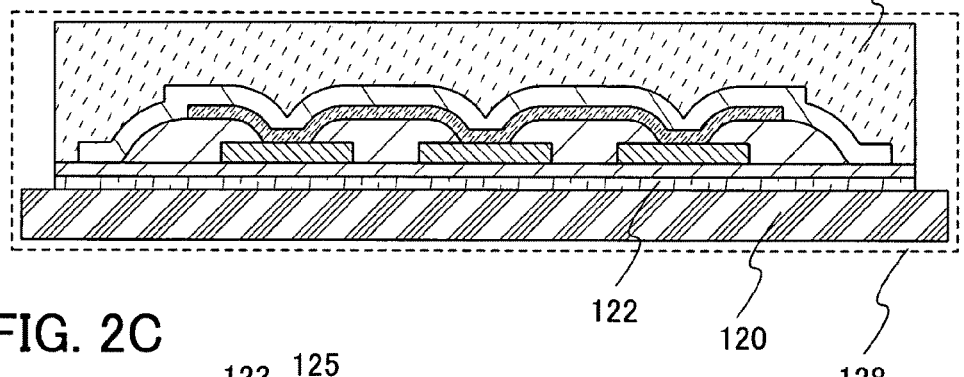

After that, the adhesive member 112 is separated from the sealing layer 111, so that a memory device 128 can be formed, as shown in FIG. 2B.

Figure 2C:
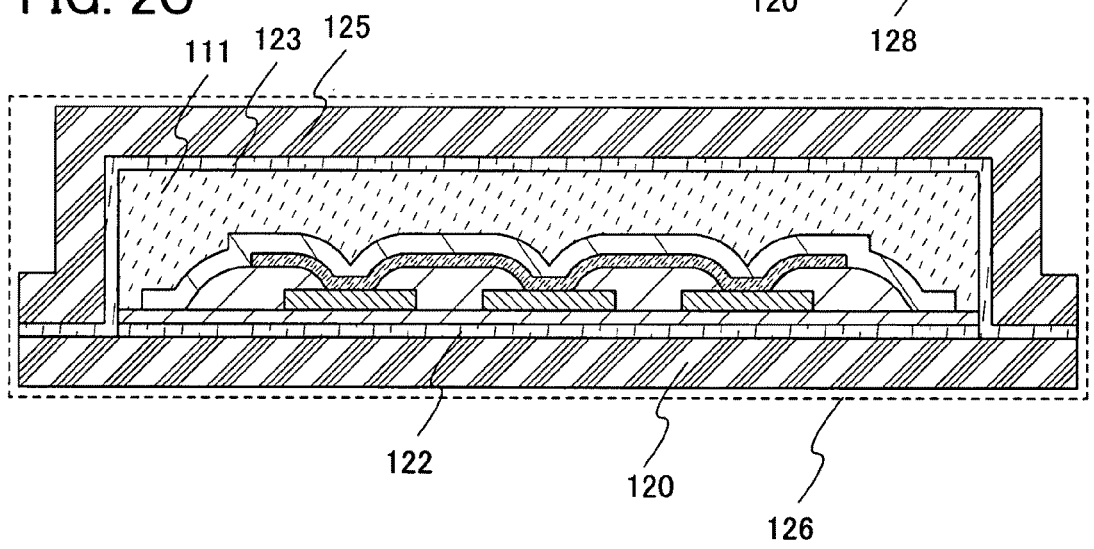

Then, as shown in FIG. 2C, a flexible substrate 125 is attached to the sealing layer 111 by using an adhesive 123, whereby a memory device 126 can be formed.

By providing the flexible substrate for one surface of the element layer 110 or the sealing layer 111 like the memory device 128 shown in FIG. 2B, mechanical strength of the memory device can be enhanced. Further, by sealing the surrounding area of the element layer 110 and the sealing layer 111 with the flexible substrates like the memory device 126 shown in FIG. 2C, the mechanical strength and resistance to external environment can be improved.

Through the preceding process, a flexible memory device having a memory element can be manufactured with high yield.

Next, data writing operations and data reading operations of the above-described memory device will be explained with reference to FIGS. 4A to 4C.

As shown in FIG. 4A, the memory cell 21 has the first electrode layer which is connected to a word line Wy ($1 \leq y \leq n$), the second electrode layer which is connected to a bit line Bx ($1 \leq x \leq m$), and the layer containing an organic compound. The layer containing an organic compound is provided between the first electrode layer and the second electrode layer.

Operations performed while writing of data to the memory cell will be described. A case where data is written by electric action will be described. Note that the writing is performed by changing electrical characteristics of the memory cell; and an initial state (a state in which electric action is not applied) of the memory cell is denoted by data "0", while the state in which the electrical characteristics are changed is denoted by data "1".

When data of "1" is written to the memory cell 21, first, the memory cell 21 is selected by decoders 133 and 134 and a selector 135. Specifically, by the decoder 134, a predetermined voltage V2 is applied to a word line W3 connected to the memory cell 21. In addition, a bit line B3 connected to the memory cell 21 is connected to a reading/writing circuit 136 by the decoder 133 and the selector 135. A writing voltage V1 is output to the bit line B3 from the reading/writing circuit 136. In this way, a voltage Vw=V1−V2 is applied between the first electrode layer and the second electrode layer forming the memory cell 21. By selecting the potential Vw appropriately, the characteristics of the layer containing an organic compound provided between the conductive layers are changed physically or electrically, so that writing of data of "1" is performed. Specifically, the electric resistance between the first electrode layer and the second electrode layer in a state of data of "1" may be changed so that the electric resistance is much smaller than the resistance in a state of data of "0", at a reading operation voltage. The voltage Vw may be set from 5 V to 15 V or from −5 V to −15 V. For example, the voltage Vw can be set so that (V1, V2)=(0 V, from 5V to 15V), (V1, V2)=(from 3 V to 5 V, from −12 V to −2 V), or the like.

Note that writing is controlled so that data of "1" is not written into a memory cell connected to a non-selected word line and a non-selected bit line. For example, the non-selected word line and the non-selected bit line may be placed in a floating state. It is necessary to provide a characteristic such as diode characteristics or the like, by which selectivity can be maintained, to the memory element in the memory cell.

On the other hand, when data of "0" is written to the memory cell 21, electric action is not applied to the memory cell 21. In circuit operations, for example, even though, as in the case where data of "1" is written, the memory cell 21 is selected by the decoders 133 and 134 and the selector 135, output potential to the bit line B3 from the reading/writing circuit 136 approximately equals to potential of the selected word line W3 or that of a non-selected word line. A voltage (for example, −5 to 5 V), by which an electric characteristic of the memory cell 21 is not changed, may be applied between the first and second electrode layers included in the memory cell 21.

Figure 4B:
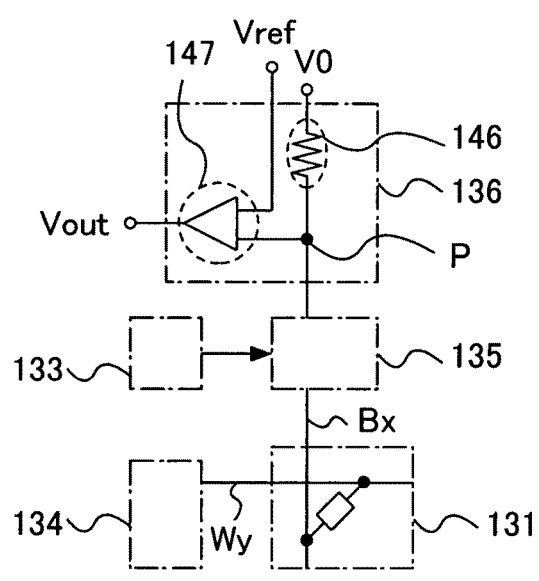
Figure 4C:
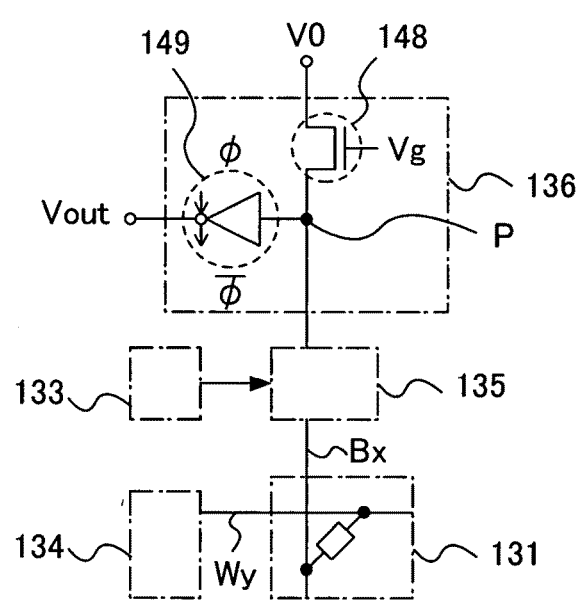

Next, operations in reading of data from the memory cell will be described (FIGS. 4B and 4C). The data reading is carried out by utilizing the difference in the electrical characteristics of a memory cell having a data "0" from that of a memory cell having a data "1". For example, a method for reading out data by utilizing a difference in electric resistance will be described; the method has the following condition: effective electric resistance between the first and second electrode layers included in the memory cell having the data "0" (hereinafter, simply referred to as electric resistance of the memory cell) is R0 at a reading voltage and electric resistance of the memory cell having data "1" is R1 at the reading voltage. R1 and R0 are set so that R1<<R0. As a structure of a reading portion of the reading/writing circuit, for example, the reading/writing circuit 136 including a resistor element 146 and a differential amplifier 147 shown in FIG. 4B can be given. The resistor element 146 has a resistance value Rr, wherein R1<Rr<R0. A transistor 148 may be used as a substitute for the resistor element 146, or a clocked inverter 149 can be used as a substitute for the differential amplifier (FIG. 4C). A signal or an inverted signal, which becomes Hi when reading is carried out and Low when reading is not carried out, is input to the clocked inverter 149. Note that the circuit structure is not limited to those shown in FIGS. 4B and 4C.

When reading of data from the memory cell 21 is performed, first, the memory cell 21 is selected by the decoders 133 and 134 and the selector 135. Specifically, a predetermined voltage Vy is applied to the word line W3 connected to the memory cell 21 by the decoder 134. In addition, by the decoder 133 and the selector 135, the bit line B3 connected to the memory cell 21 is connected to a terminal P of the reading/writing circuit 136. As a result, a potential Vp of the terminal P becomes a value which is determined based on resistance division by the resistor element 146 (resistance value: Rr) and the memory cell 21 (resistance value: R0 or R1). Accordingly, if the memory cell 21 has the data "0", Vp0=Vy+(V0−Vy)×R0/(R0+Rr). Further, when the memory cell 21 has the data "1", Vp1=Vy+(V0−Vy)×R1/(R1+Rr). As a result, by selecting Vref so as to be between Vp0 and Vp in FIG. 4B, or by providing the clocked inverter of which transition point is between Vp0 and Vp1 in FIG. 4C, Low/High (or High/Low) is output as an output potential Vout corresponding to data of "0"/"1," whereby reading can be performed.

For example, the differential amplifier is set to operate at Vdd=3 V, and Vy, V0, and Vref are set so that Vy=0 V; V0=3 V, and Vref=1.5 V. If R0/Rr=Rr/R1=9, in the case where the memory cell has the data "0", the Vp0 is 2.7 V and High is output as the Vout, while in the case where the memory cell has the data "1", the Vp1 is 0.3 V and Low is output as the Vout. In this way, reading of the memory cell can be performed.

According to the above method, electric resistance of the layer 105 containing an organic compound is read out by a voltage value by utilization of a difference in the resistance value and the resistance division. Note that the reading method is not limited to this method. For example, reading may be conducted by utilizing the difference in a current value, other than the method utilizing the difference in electric resistance. In the case where electric characteristics of the memory cell have different diode characteristics in threshold voltages between the states of data "0" and data "1", reading may be carried out by using a difference in the threshold voltages.

As described above, according to this embodiment mode, a flexible memory device with a highly reliability for storing data can be manufactured with high yield.

Embodiment Mode 2

In this embodiment mode, another mode of the memory device shown in the above embodiment mode formed using a separation method will be described. Typically, a main structure of a memory device having a memory cell array where memory cells each have a switching element and a memory element will be described with reference to FIG. 5 and FIGS.

Figure 5:
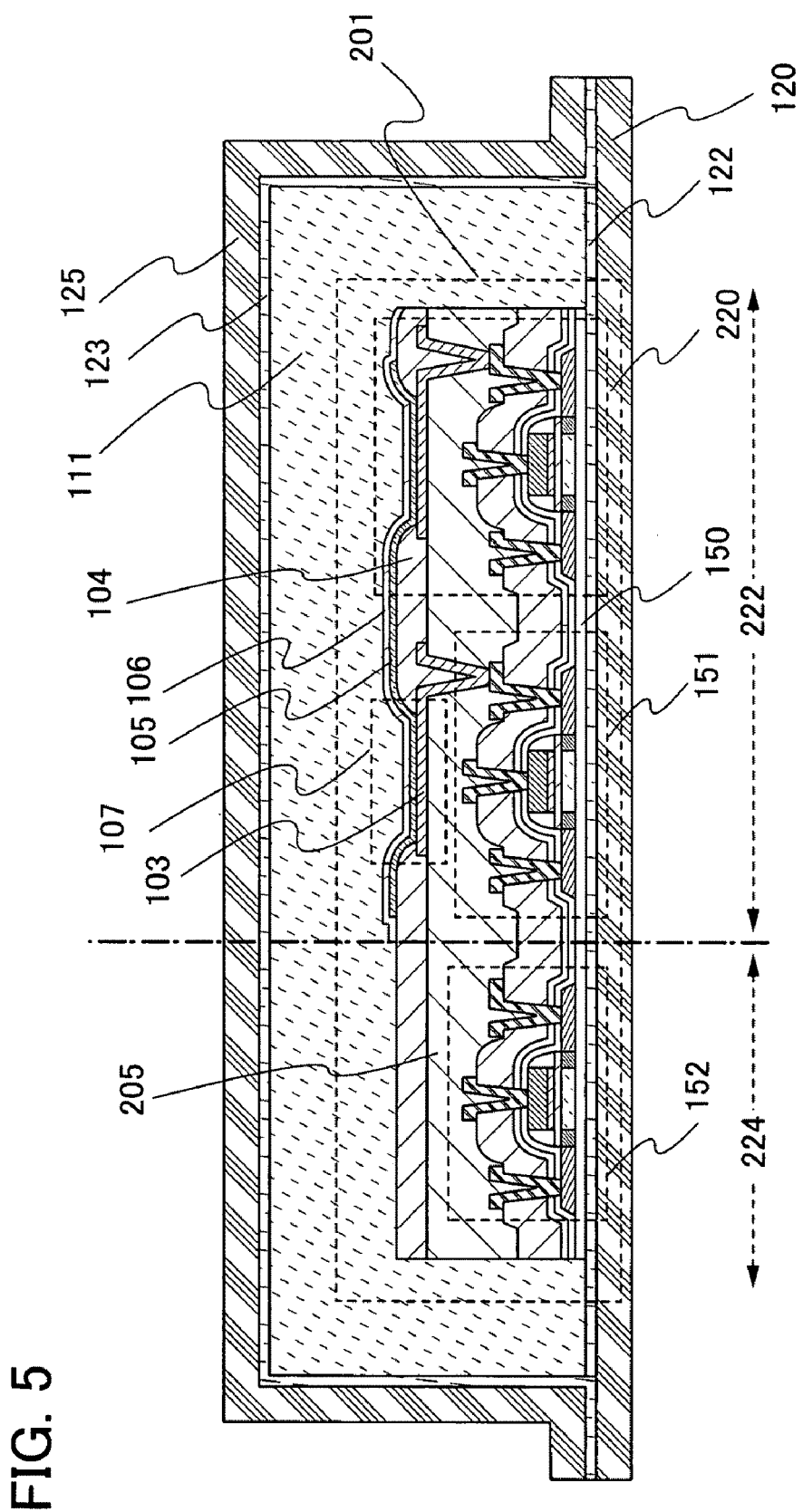
FIG. 5 is a cross-sectional view showing a structure of a memory device of the present invention.

6A to 6C. FIG. 5 is a cross-sectional view of the memory device in this embodiment mode, and FIGS. 6A to 6C illustrate structures of the memory device in this embodiment mode.

Figure 6A:
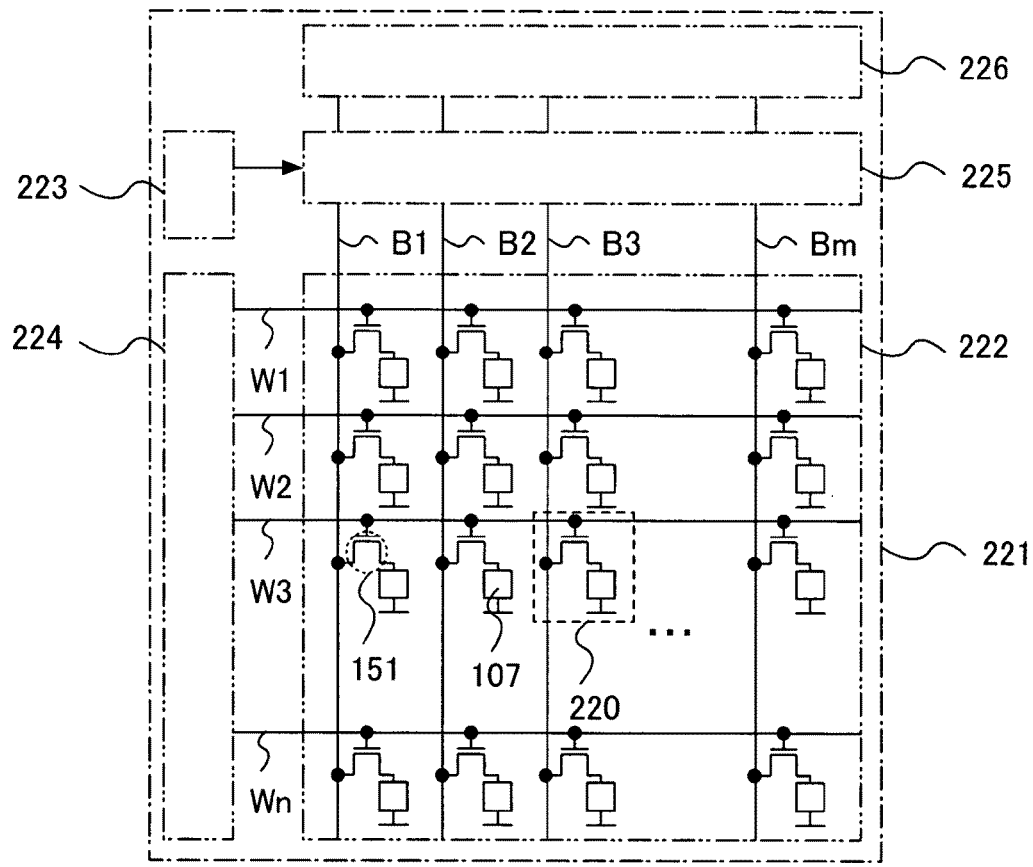
FIGS. 6A to 6C are diagrams showing structures of a memory device of the present invention.
Figure 6B:
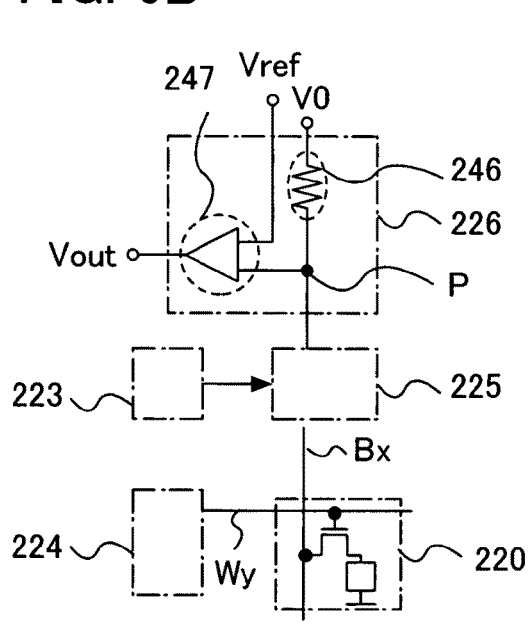
Figure 6C:
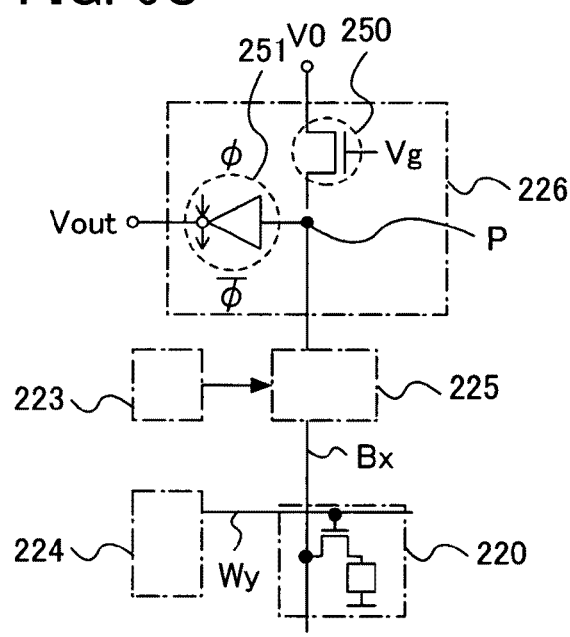

As shown in FIG. 6A, a memory device 221 in this embodiment mode has a memory cell array 222 and a driver circuit which drives the memory cell array 222. The memory cell array 222 has a plurality of memory cells 220 which are provided in matrix. As shown in FIG. 6A and FIG. 5, in the memory device 221, transistors which form the driver circuit, here a transistor 152 which forms a decoder 224, a transistor 151 which functions as a switching element, and a memory element 107 connected to the transistor 151 are formed over an insulating layer 150 which functions as a base film. The memory element 107 has a first electrode layer 103 which is formed over an insulating layer 205, a layer 105 containing an organic compound, and a second electrode layer 106. Note that the layer 105 containing an organic compound is formed over the first electrode layer 103 and an insulating layer 104 which functions as a partition and covers a part of the first electrode layer 103. Further, as the transistor 151, a thin film transistor is used. The memory device 221 may have an insulating layer (not shown) which functions as a protection layer covering the second electrode layer 106.

A sealing layer 111 is formed so as to cover a stack from the insulating layer 150 which functions as a base film through the second electrode layer 106. Here, the stack covered with the sealing layer 111 is referred to as an element layer 201.

The element layer 201 and the sealing layer 111 are sealed with flexible substrates 120 and 125. The flexible substrate 120 is attached to the sealing layer 111 with an adhesive 122. The flexible substrate 125 is attached to the sealing layer 111 with an adhesive 123.

A method to separate the element layer 201 formed over the substrate and a method to attach the flexible substrate to the element layer and the sealing layer 111 may be those described in the above embodiment mode as appropriate.

As the transistors 151 and 152, a MOS transistor using a silicon wafer, a MOS transistor using an SOI substrate, a thin film transistor, an organic semiconductor transistor, or the like, can be used as appropriate. Here, as the transistors 151 and 152, thin film transistors are used. Here, as the thin film transistors, top gate thin film transistors are used; however the present invention is not limited to this. Bottom gate thin film transistors can also be used.

The memory element 107 is formed over the insulating layer 205. In this way, when the insulating layer 205 is provided and the memory element 107 is formed thereover, the first electrode layer 103 can be placed in a given position. That is, the memory element 107 can be formed over the transistor 151. As a result, the memory device can be more highly integrated.

The insulating layer 205 can be formed by using the same material and the same method as the insulating layer 104 described in the above embodiment mode.

As the flexible substrate which is attached to the element layer 201 and the sealing layer 111, a flexible substrate like the flexible substrate 120 shown in Embodiment Mode 1, a film having a thermoplastic resin, paper made of a fibrous material, a ceramic sheet, or the like is used, whereby reduction in size, thickness, and weight of the memory device can be achieved.

Next, data writing operations and data reading operations of the memory device described in this embodiment mode will be described with reference to FIGS. 6A to 6C.

The memory cell 220 has a word line Wy ($1 \leq y \leq n$), a bit line Bx ($1 \leq x \leq m$), the transistor 151, and the memory element 107. The memory element 107 has a structure where the layer containing an organic compound is interposed between a pair of conductive layers. A gate electrode of the transistor 151 is connected to the word line, one of a source electrode and a drain electrode of the transistor 151 is connected to the bit line, and the other of the source electrode and the drain electrode thereof is connected to the first electrode layer included in the memory element 107. The second electrode layer of the memory element 107 is connected to a connecting terminal. The connecting terminal is connected to a common electrode (a potential of Vcom).

Next, an operation in writing data into the memory cell array 222 will be described.

Here, a case will be described in which data is written to the third-row, third-column memory cell 220 by electric action. Note that the writing is performed by changing electrical characteristics of the memory cell; and an initial state (a state in which electric action is not applied) of the memory cell is denoted by data of "0", while the state in which the electrical characteristics are changed is denoted by data of "1".

When data of "1" is written into the memory cell 220, first, the memory cell 220 is selected by decoders 223 and 224 and a selector 225. Specifically, by the decoder 224, a predetermined voltage V22 is applied to a word line W3 connected to the memory cell 220. In addition, a bit line B3 connected to the memory cell 220 is connected to a reading/writing circuit 226 by the decoder 223 and the selector 225. A writing voltage V21 is output to the bit line B3 from the reading/writing circuit 226.

Thus, the transistor 151 that forms the memory cell 220 is turned on and the memory element 107 is electrically connected to the bit line, and then a voltage of approximately Vw=Vcom−V21 is applied to the memory element 107. Note that the second electrode layer of the memory element 107 is connected to the common electrode with the potential Vcom. By properly selecting the potential Vw, characteristics of the layer 105 containing an organic compound provided between the conductive layers is physically or electrically changed, and writing of data of "1" is performed. Specifically, the electric resistance between the first electrode layer and the second electrode layer in a state of data of "1" may be changed so that the electric resistance is much smaller than the resistance in a state of data of "0", at a reading operation, or the first electrode layer and the second electrode layer may be short-circuited. The potential may be selected appropriately from the range of (V21, V22, Vcom)=(5 V to 15 V, 5 V to 15 V, 0 V) or (−12 V to 0 V, −12 V to 0 V, 3 V to 5 V). The voltage Vw may be set in the range of 5 V to 15 V or −5 V to −15 V.

Note that writing is controlled so that data of "1" is not written into a memory cell connected to a non-selected word line or a non-selected bit line. Specifically, potential (e.g., 0 V) by which transistors of memory cells connected to the non-selected word lines are made in an OFF state, may be applied to the non-selected word lines whereas the non-selected bit lines may be placed in a floating state or applied with a potential, which is roughly the same level as Vcom.

On the other hand, when data "0" is written into the memory cell 220, electric action is not applied to the memory cell 220. In circuit operation, for example, in a similar manner to the case of writing the data "1", the memory cell 220 is selected by the decoders 223 and 224, and the selector 225; however, an output potential, which is roughly the same level as Vcom, is applied to the bit line B3 from the reading/writing circuit 226, or the bit line B3 is placed in a floating state. As a result, low voltage (e.g., −5 to 5 V) is applied to the memory element 107, or no voltage is applied to the memory element 107, and therefore, an electric characteristic of the memory element is not changed and writing of the data "0" can be realized.

Next, an operation in reading out data by electric action will be described. The data reading is carried out by utilizing the fact that a memory element having data "0" and a memory element having data "1" have different electric characteristics. For example, a method for reading out data by utilizing a difference in electric resistance will be described; the method has the following condition: electric resistance of the memory element included in the memory cell having the data "0" is R0 at a reading operation and electric resistance of the memory element included in the memory cell having data "1" is R1 at the reading operation. Note that R1<<R0. As a composition of a reading portion of the reading/writing circuit, for example, the reading/writing circuit 226 including a resistor element 246 and a differential amplifier 247 shown in FIG. 6B can be given. The resistor element 246 has a resistance value Rr, wherein R1<Rr<R0. A transistor 250 may be used as a substitute for the resistor element 246, or a clocked inverter 251 can be used as a substitute for the differential amplifier (FIG. 6C). Note that the circuit structure is not limited to those shown in FIGS. 6B and 6C.

When reading of data from the third-row, third-column memory cell 220 is performed, first, the memory cell 220 is selected by the decoders 223 and 224 and the selector 225. Specifically, a predetermined voltage V24 is applied by the decoder 224 to the word line W3 connected to the memory cell 220, and the transistor 151 is turned on. The bit line B3 connected to the memory cell 220 is connected to a terminal P of the reading/writing circuit 226 by the decoder 223 and the selector 225. As a result, a potential Vp of the terminal P is a value which is determined by resistance division of Vcom and V0 by the resistor element 246 (resistance value: Rr) and the memory element 107 (resistance value: R0 or R1). Consequently, when the memory cell 220 has data "0," the value for Vp0 becomes Vp0=Vcom+(V0−Vcom)×R0/(R0+Rr). Additionally, when the memory cell 220 has data "1," the value for Vp1 becomes Vp1=Vcom+(V0−Vcom)×R1/(R1+Rr). As a result, by selecting Vref so as to be between Vp0 and Vp1 in FIG. 6B, or by providing the clocked inverter of which transition point is between Vp0 and Vp1 in FIG. 6C, Low/High (or High/Low) is output as an output potential Vout corresponding to data "0"/"1," whereby reading can be performed.

For example, the differential amplifier is set to operate at Vdd=3 V, and Vcom, V0, and Vref are set so that Vcom=0 V, V0=3 V, and Vref=1.5 V. Supposing that R0/Rr=Rr/R1=9 and supporting that the on resistance of the transistor 151 can be ignored, when data of the memory cell is "0," Vp0 becomes 2.7 V, and High is output as Vout; and when data of the memory cell is "1," Vp1 becomes 0.3 V, and Low is output as Vout. In this way, reading of the memory cell can be performed.

According to the above method, reading is conducted with a voltage by utilizing a difference in the resistance value of the memory element 107 and resistance division. Note that the reading method is not limited to this. For example, other than using the difference in electric resistance, reading may be conducted by using the difference in current value. Alternatively, in the case where the electric characteristic of the memory cell has a diode characteristic in which threshold voltages are different between the data "0" and "1," the difference in the threshold voltages may be used for reading.

As described above, according to this embodiment mode, a flexible memory device with a high reliability for storing data can be manufactured with high yield.

Embodiment Mode 3

Figure 7:
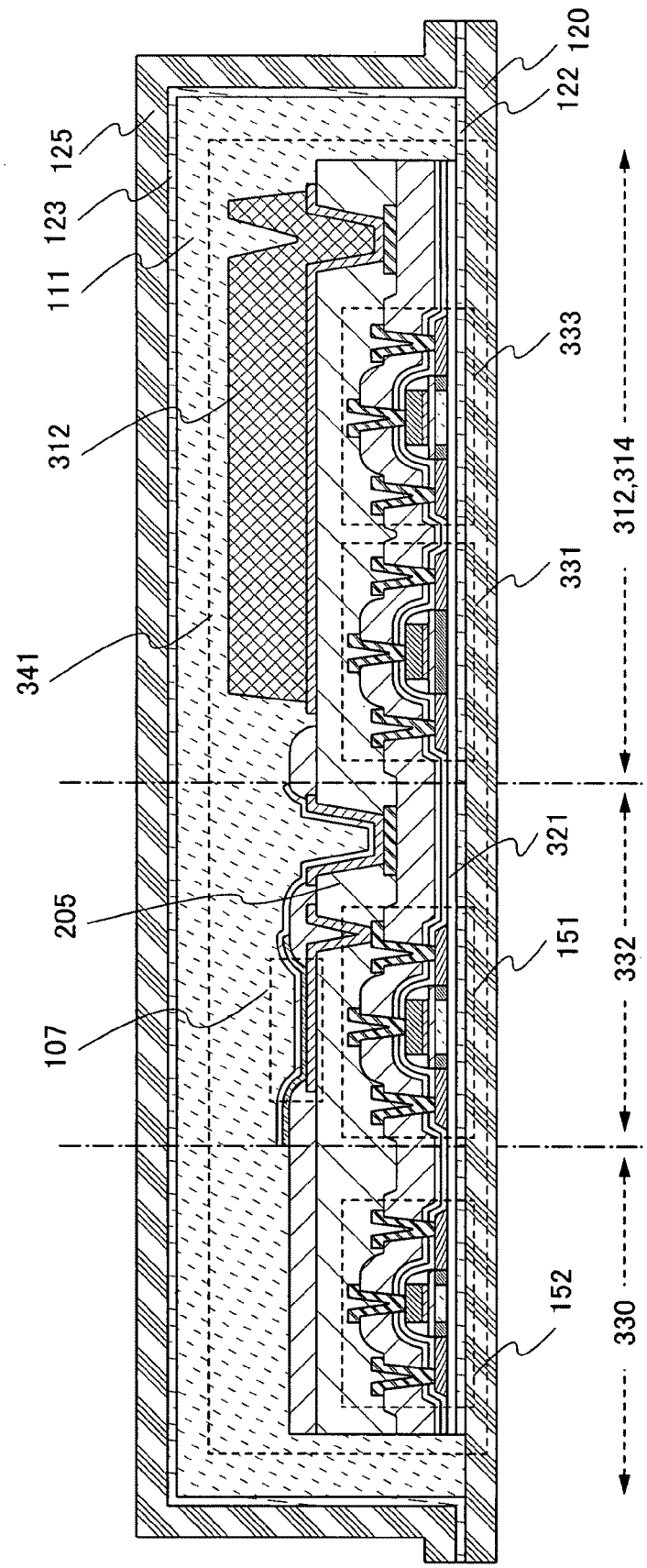
FIG. 7 is a cross-sectional view showing a structure of a semiconductor device of the present invention.
Figure 8:
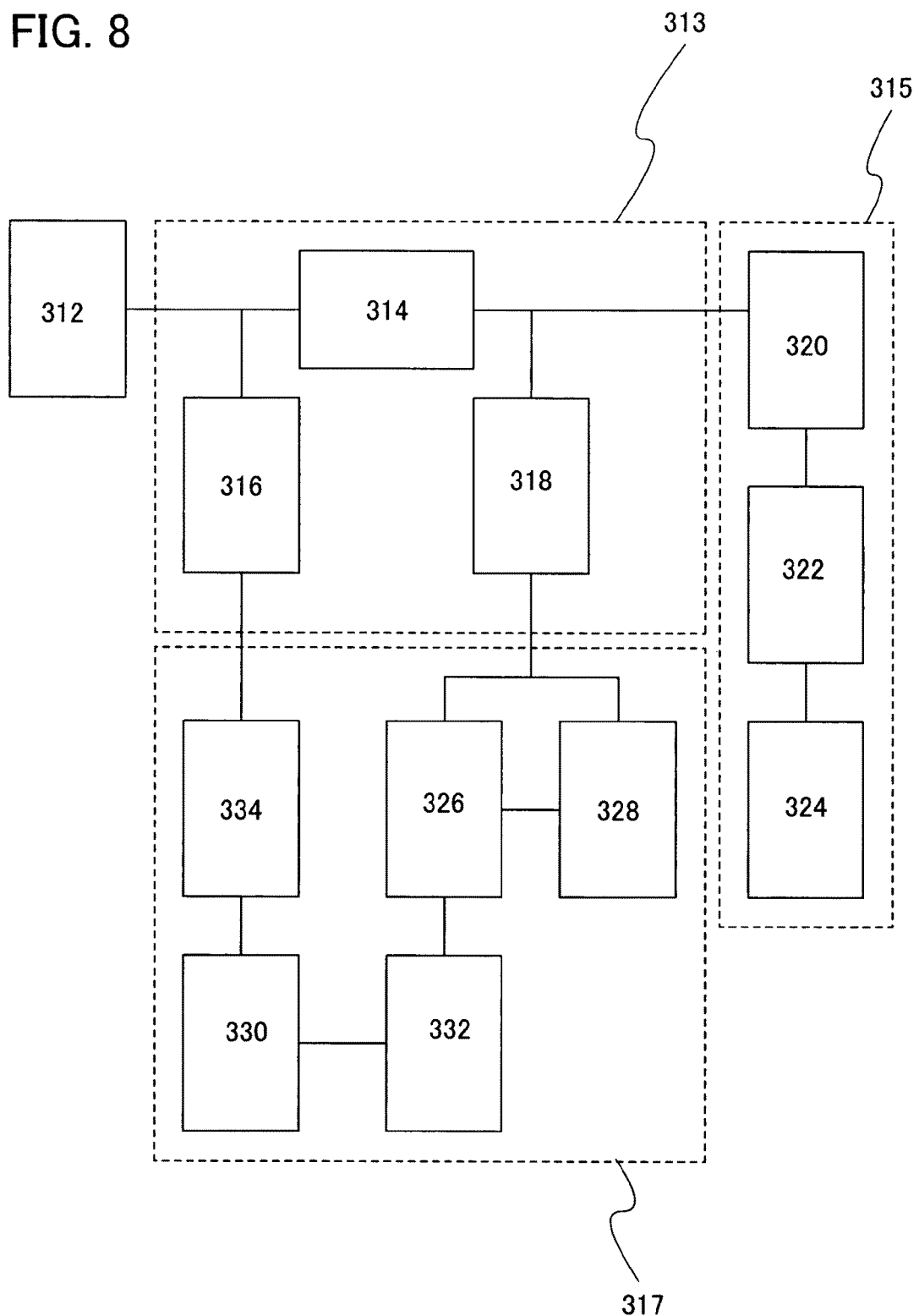
FIG. 8 is a diagram showing a structure of a memory device of the present invention.

In this embodiment mode, one mode of the semiconductor device shown in the above embodiment mode formed by a separation method will be described below. Typically, a main structure of a semiconductor device which can perform transmission/reception of instructions or data with radio signals will be described with reference to FIGS. 7 and 8. FIG. 7 is a cross-sectional view of the semiconductor device in this embodiment mode. FIG. 8 illustrates a structure of the semiconductor device in this embodiment mode.

FIG. 8 is a block diagram illustrating a structural example of the semiconductor device which can perform transmission/reception of instructions or data with radio signals. Such a semiconductor device includes an antenna 312, an RF circuit portion 313, a power supply circuit portion 315, and a logic circuit portion 317 as elements. The antenna 312 transmits and receives signals to/from a communication device which is also called a reader/writer. As a frequency band of carrier waves for delivering signals, a long wave band (30 kHz to 135 kHz), a short wave band (6.78 MHz, 13.56 MHz, 27.125 MHz, 40.68 MHz, or 5.0 MHz), a microwave band (2.45 GHz, 5.8 GHz, or 24.125 GHz), or the like, can be applied. The antenna 312 can have a coiled shape, monopole shape, or dipole shape depending on the communication frequency band.

Carrier waves received by the antenna 312 are divided into the power supply circuit portion 315 and the logic circuit portion 317 through a detection capacitor portion 314. In the power supply circuit portion 315, the carrier waves are half-wave rectified by a rectifier circuit portion 320, and then stored in a storage capacitor portion 322. A constant voltage circuit portion 324 outputs a constant voltage even if power of a certain level or more is supplied by the carrier waves received, and supplies power which is necessary to operate the logic circuit portion 317 or the like in the semiconductor device.

A demodulation circuit portion 318 in the RF circuit portion 313 demodulates the carrier waves to generate clock signals that are necessary to operate the logic circuit portion 317, and outputs the clock signals to a PLL circuit portion 328 which has a function of correcting the clock signals and to a code recognition/judgment circuit portion 326. For example, the demodulation circuit portion 318 detects an amplitude fluctuation as reception data of "0" or "1" based on a reception signal to which an amplitude modulation (e.g. Amplitude Shift Keying (ASK) modulation) is performed. The demodulation circuit portion 318 includes a low-pass filter, for example. In addition, a modulation circuit portion 316 transmits transmission data as a transmission signal to which an amplitude modulation (e.g. ASK modulation) is performed.

The code recognition/judgment circuit portion 326 recognizes and judges instruction codes. Instruction codes that are recognized and judged by the code recognition/judgment circuit portion 326 include an EOF signal (End Of Frame), an SOF signal (Start Of Frame), a flag, a command code, a mask length, a mask value, and the like. The code recognition/judgment circuit portion 326 also includes a cyclic redundancy check (CRC) function for detecting transmission errors. A judgment result by the code recognition/judgment circuit portion 326 is output to a memory controller portion 330. The memory controller portion 330 controls data-reading from a memory portion 332 based on the judgment result. Data which is read out from the memory portion 332 is encoded by an encoding circuit portion 334, and is modulated by the modulation circuit portion 316. Then, a response signal is generated.

As a structure of the memory portion 332, a memory cell having the memory element as shown in Embodiment Mode 1 or a memory cell having the memory element connected to the switching element as shown in Embodiment Mode 2 can be appropriately used. Further, as well as the memory cell as shown in the above embodiment mode, the memory portion 332 can employ a mask ROM (Read Only Memory) which stores only fixed data, a memory from/to which data can be read and written at a given timing such as an SRAM (Static Random Access Memory), a nonvolatile memory which has a floating electrode for accumulating electric charges, or the like.

In this manner, the semiconductor device shown in FIG. 8 has a function of writing data or reading data to/from the memory portion 332 by receiving instructions from a communication device which is also called a reader/writer.

Next, a cross-sectional structure of the semiconductor device in this embodiment mode will be described with reference to FIG. 7.

Here, as a part of the semiconductor device, a cross-sectional view of the memory controller portion 330, the memory portion 332, the antenna 312, and the detection capacitor portion 314 is illustrated (FIG. 7). Typically, a transistor 152 which is included in the memory controller portion 330, a transistor 151 and a memory element 107 connected to the transistor 151 which are included in the memory portion 332, and a capacitor 331, a thin film transistor 333 and the antenna 312 of the detection capacitor portion 314, which are formed over an insulating layer 321 serving as a base film, are illustrated. Note that, although not shown in the drawing, the antenna 312 and the thin film transistor 333 are electrically connected to each other.

The memory element 107 has a first electrode layer 103, a layer 105 containing an organic compound, and a second electrode layer 106 which are formed over an insulating layer 205. The second electrode layer 106 is formed of a tin alloy layer as described in the above embodiment mode. Note that the layer 105 containing an organic compound is formed over the first electrode layer 103 and the insulating layer 104 which functions as a partition and covers a part of the first electrode layer 103. The transistor 151 which functions as a switching element is formed using a thin film transistor. The insulating layer which functions as a protection layer covering the second electrode layer 106 and the antenna 312 may also be provided. Note that a stack from the insulating layer 150 serving as a base film through the antenna 312 is referred to as an element layer 341.

Further, a sealing layer 111 is formed so as to cover the element layer 341.

The element layer 341 and the sealing layer 111 are sealed with flexible substrates 120 and 125. The flexible substrate 120 is attached to the element layer 341 and the sealing layer 111 with an adhesive 122. The flexible substrate 125 is attached to the sealing layer 111 with an adhesive 123.

A method for separating the element layer 341 formed over the substrate and a method for attaching the flexible substrate to the element layer can employ those in the above embodiment mode as appropriate.

As described above, according to this embodiment mode, a flexible semiconductor device which has a highly reliable storage function and can transmit/receive data wirelessly can be manufactured with high yield.

Embodiment 1

In this embodiment, a method for manufacturing a semiconductor device having a memory cell array where memory elements connected to switching elements are provided in matrix, which can perform transmission/reception of instructions or data with radio signals, will be described below with reference to FIG. 9A to FIG. 15F.

A separation layer 502 is formed over a substrate 501. As the substrate 501, a glass substrate is used. The separation layer 502 has a stacked layer structure of a metal layer and a metal oxide layer. As the metal layer, a tungsten layer, a tungsten nitride layer, or a molybdenum layer with a thickness of 30 nm to 200 nm which is obtained by a sputtering method is used.

Next, the metal oxide layer is formed by oxidation of the surface of the metal layer. The metal oxide layer may be formed by oxidation of the surface with the use of pure water or ozone water or with the use of oxygen plasma. Alternatively, the metal oxide layer may be formed by heating in an atmosphere including oxygen. Further alternatively, the metal oxide layer may be formed in a later step of forming an insulating layer. In this case, when a silicon oxide layer or a silicon oxynitride layer is formed as the insulating layer by a plasma CVD method, the surface of the separation layer 502 is oxidized; accordingly, the metal oxide layer is formed.

Next, a first insulating layer 503 is formed over the metal oxide layer. As the first insulating layer 503, an insulating layer such as a silicon oxide layer, a silicon nitride layer, or a silicon oxynitride layer is used. As a typical example of the first insulating layer 503, a two-layer structure, in which a silicon nitride oxide layer formed with a thickness of 50 nm to 100 nm by a PCVD method using $SiH_4$, $NH_3$, and $N_2O$ as reactive gases and a silicon oxynitride layer formed with a thickness of 100 nm to 150 nm using $SiH_4$ and $N_2O$ as reactive gases are stacked, is used. One layer in the first insulating layer 503 is preferably a silicon nitride layer or a silicon oxynitride layer with a thickness of less than or equal to 10 nm. Alternatively, the first insulating layer 503 may have a three-layer structure where a silicon nitride oxide layer, a silicon oxynitride layer, and a silicon nitride layer are sequentially stacked. Although the example of forming the first insulating layer 503 as a base insulating film is given here, the first insulating layer 503 may be omitted if not necessary.

Next, a semiconductor layer is formed over the first insulating layer 503. The semiconductor layer is formed as follows: a semiconductor layer having an amorphous structure is formed by a known method (a sputtering method, a LPCVD method, a plasma CVD method, or the like) and crystallized by known crystallization treatment (e.g., laser crystallization, thermal crystallization, or thermal crystallization using a catalyst such as nickel) to form a crystalline semiconductor layer; a resist mask is formed over the crystalline semiconductor layer using a first photomask; and the crystalline semiconductor layer is etched into a desired shape. Note that, by using a plasma CVD method, the first insulating layer and the semiconductor layer having an amorphous structure can be stacked successively without being exposed to atmospheric air. This semiconductor layer is formed to have a thickness of 25 nm to 80 nm (preferably 30 nm to 70 nm). A material of the crystalline semiconductor layer is not limited; however, silicon, a silicon-germanium (Si—Ge) alloy, or the like, is preferably used.

Alternatively, as the crystallization treatment of the semiconductor layer having an amorphous structure, a continuous wave laser may be used. In order to obtain a crystal with a large grain size in crystallization of an amorphous semiconductor layer, it is preferable to use a solid state laser capable of continuous wave oscillation and apply any of the second to the fourth harmonics of the fundamental wave. Typically, the second harmonic (532 nm) or the third harmonic (355 nm) of a Nd: YVO$_4$ laser (the fundamental wave: 1064 nm) may be applied. When a continuous wave laser is used, a laser beam emitted from a continuous wave YVO$_4$ laser of which output power is 10 W is converted into a harmonic by a non-linear optical element. There is also a method for emitting a harmonic by putting a YVO$_4$ crystal and a non-linear optical element in a resonator. Then, the laser beam is preferably formed into a rectangular shape or an elliptical shape on an irradiated surface with an optical system to irradiate a subject. At this time, a power density of about 0.01 to 100 MW/cm$^2$ (preferably 0.1 to 10 MW/cm$^2$) is required. Then, the semiconductor layer may be irradiated with a laser beam while being moved relatively to the laser beam at a speed of about 10 to 2000 cm/s.

Alternatively, as the crystallization treatment of a semiconductor layer having an amorphous structure, a sequential lateral solidification method (SLS method) may be used. In a SLS method, a sample is irradiated with a pulsed excimer laser beam through a slit-shaped mask. It is a method for successively forming a crystal which is super-laterally grown, which is artificially controlled, by performing crystallization displacing relative positions of the sample and the laser beam every shot by a length of a crystal which is super-laterally grown. Next, a very small amount of an impurity element (boron or phosphorus) is added to the semiconductor layer in order to control a threshold value of the thin film transistor, if necessary. Here, an ion doping method is used, in which diborane (B$_2$H$_6$) is not separated by mass but excited by plasma.

Next, a resist mask is formed over the semiconductor layer which is to be a capacitor electrode of a capacitor later using a second photomask, and a low-concentration impurity region is formed by introduction of an impurity element. As the impurity element, an impurity element imparting n-type conductivity or an impurity element imparting p-type conductivity can be used. As the impurity element imparting n-type conductivity, phosphorus (P), arsenic (As), or the like, can be used. Here, phosphorus (P) is added to the semiconductor layer so as to be contained at a concentration of $1\times10^{15}$ to $1\times10^{19}$/cm$^3$ to form the n-type impurity region.

Then, an oxide layer on the surface of the semiconductor layer is removed by using an etchant containing hydrofluoric acid, and at the same time, the surface of the semiconductor layer is cleaned.

Next, a second insulating layer which covers the semiconductor layer is formed. The second insulating layer is formed by a plasma CVD method or a sputtering method to have a thickness of 1 nm to 200 nm. The second insulating layer is formed to have a single-layer or stacked-layer structure with an insulating layer containing silicon, which is preferably as thin as 10 nm to 50 nm, and then surface nitriding treatment using plasma by a microwave is performed. The second insulating layer serves as a gate insulating layer of the thin film transistor to be formed later.

Next, gate electrodes 504 to 507 and a capacitor electrode 508 are formed over the second insulating layer. A resist mask is formed by using a third photomask over a conductive layer with a thickness of 100 nm to 500 nm which is obtained by a sputtering method, and the conductive layer is etched into a desired shape, so that the gate electrodes 504 to 507 and the capacitor electrode 508 are formed.

As a material of the gate electrodes 504 to 507 and the capacitor electrode 508, a material which reacts with silicon and becomes silicide may be used, and an element such as Ti, W, Ni, Cr, Mo, Ta, Co, Zr, V, Pd, Hf, Pt, or Fe, or an alloy material or a compound material containing the element as its main component may be formed as a single layer or a stacked layer. However, as a gate electrode of a thin film transistor, W or Mo which is a high-melting point metal is preferably used. In the case where the gate electrodes 504 to 507 and the capacitor electrode 508 are formed with a stacked layer, when the material layer which serves as an upper layer is formed of the above-described material, the material layer which serves as a lower layer may be formed with a polycrystalline silicon layer doped with an impurity element such as phosphorus. Alternatively, the upper layer may be formed using the above-described material, and the lower layer may be formed using a nitride of the above-described material. At this time, the lower layer is formed with a metal nitride, which can prevent a metal in the upper layer from diffusing into the gate insulating layer or the underlying semiconductor layer.

Next, a resist mask is formed using a fourth photomask so as to cover the semiconductor layer in a region to be a p-channel thin film transistor, and the semiconductor layer in a region to be an n-channel thin film transistor is doped with an impurity element using the gate electrodes 505 to 507 as masks, thereby forming low-concentration impurity regions. Here, phosphorus (P) is added to the semiconductor layer in a region to be an n-channel thin film transistor at a concentration of $1\times10^{15}$ to $1\times10^{19}$/cm$^3$ to form an n-type impurity region.

Next, the resist mask is removed, another resist mask is formed using a fifth photomask so as to cover the semiconductor layer in a region to be an n-channel thin film transistor, and the semiconductor layer in a region to be a p-channel thin film transistor is doped with an impurity element using the gate electrode 504 as a mask to form p-type impurity regions. As the p-type impurity element, boron (B), aluminum (Al), gallium (Ga), or the like, can be used. Here, boron (B) is added to the semiconductor layer in a region to be a p-channel thin film transistor at a concentration of $1\times10^{19}$/cm$^3$ to $1\times10^{20}$/cm$^3$ to form a p-type impurity region. As a result, source or drain regions 514 and 515 and a channel formation region 516 are formed in the semiconductor layer in a region to be a p-channel thin film transistor.

Next, sidewalls 510 are formed on the both side surfaces of the gate electrodes 504 to 507 and the capacitor electrode 508. As a manufacturing method of the sidewalls 510, a third insulating layer is formed with a single layer or a stacked layer using a layer containing an inorganic material such as an oxide of silicon or a nitride of silicon, or a layer containing an organic material such as an organic resin to cover the second insulating layer, the gate electrodes 504 to 507 and the capacitor electrode 508 by a plasma CVD method, a sputtering method or the like. Then, the third insulating layer is selectively etched by anisotropic etching which is conducted mainly in the perpendicular direction to form the insulating layers (sidewalls 510) which are in contact with the side surfaces of the gate electrodes 504 to 507 and the capacitor electrode 508. Note that a part of the second insulating layer is etched and removed at the same time when the sidewalls 510 are formed. When a part of the second insulating layer is removed, gate insulating layers 512 are formed below the gate electrodes 504 to 507, the capacitor electrode 508, and the sidewalls 510.

Next, a resist mask is formed using a sixth photomask so as to cover the semiconductor layer in a region to be a p-channel thin film transistor, and the semiconductor layer in a region to be an n-channel thin film transistor is doped with an impurity element using the gate electrodes 505 to 507, the capacitor electrode 508, and the sidewalls 510 as masks, thereby forming high-concentration impurity regions. The resist mask is removed after doping of the impurity element. Here, phosphorus (P) is added to the semiconductor layer in a region to be an n-channel thin film transistor at a concentration of $1\times10^{19}$ to $1\times10^{20}/cm^3$ to form n-type high-concentration impurity regions. As a result, source or drain regions 517 and 518, LDD regions 519 and 520, and a channel formation region 521 are formed in the semiconductor layer in a region to be an n-channel thin film transistor. The LDD regions 519 and 520 are formed below the sidewalls 510. Further, a low-concentration impurity region 511 and a high-concentration impurity region 513 are formed in the semiconductor layer to be the capacitor electrode of the capacitor.

A structure where the LDD region is formed in the semiconductor layer included in the n-channel thin film transistor and the LDD region is not formed in the semiconductor layer included in the p-channel thin film transistor is shown; however, the present invention is not limited to this structure. A LDD region may be formed in each of the semiconductor layers of the n-channel thin film transistor and the p-channel thin film transistor.

Next, after formation of a fourth insulating layer 522 containing hydrogen by a sputtering method, an LPCVD method, a plasma CVD method, or the like, activation treatment and hydrogenation treatment of the impurity element added to the semiconductor layer are performed. Activation treatment and hydrogenation treatment of the impurity element are performed by heat treatment using a furnace (heat treatment at 300° C. to 550° C. for 1 to 12 hours) or a rapid thermal annealing method (RTA method) using a lamp light source. For the fourth insulating layer 522 containing hydrogen, a silicon nitride oxide layer that is obtained by a PCVD method is used. Here, a thickness of the fourth insulating layer 522 containing hydrogen is set to be 50 nm to 200 nm. In addition, when the semiconductor layer is crystallized using a metal element which promotes crystallization such as nickel, gettering for reducing nickel in the channel formation region can also be performed at the same time as activation. Note that the fourth insulating layer 522 containing hydrogen is a first layer of an interlayer insulating layer.

Then, a fifth insulating layer 523 and a sixth insulating layer 524 are formed as a second layer and a third layer respectively of the interlayer insulating layer by a sputtering method, an LPCVD method, a plasma CVD method, or the like. As the fifth insulating layer 523 and the sixth insulating layer 524, an insulating layer such as a silicon oxide layer, a silicon nitride layer, or a silicon oxynitride layer is formed with a single layer or a stacked layer. Here, the thickness of the fifth insulating layer 523 is set to be 50 nm to 200 nm, and the thickness of the sixth insulating layer 524 is set to be 300 nm to 800 nm.

A cross-sectional view of the semiconductor device through the steps up to here corresponds to FIG. 9A.

Next, a resist mask is formed using a ninth photomask. Then, the fourth insulating layer 522, the fifth insulating layer 523, and the sixth insulating layer 524 are selectively etched, and a contact hole that reaches the semiconductor layer and a contact hole that reaches the gate electrode are formed. Then, the resist mask is removed after etching.

Next, an oxide layer on the surface of the semiconductor layer which is exposed is removed by an etchant containing hydrofluoric acid and the surface of the semiconductor layer which is exposed is cleaned at the same time.

Next, a conductive layer is formed by a sputtering method This conductive layer is formed using a single layer or a stacked layer of an element such as Ti, W, Ni, Cr, Mo, Ta, Co, Zr, V, Pd, Hf, Pt, Fe, Al, or Cu, or an alloy material or a compound material containing the element as its main component.

Next, a resist mask is formed using a tenth photomask and the conductive layer is selectively etched to form source electrodes or drain electrodes 525 to 532, gate lead wirings 535 to 538, capacitor wirings 533, 534 and 539 of the capacitor, a lead wiring 541 of the second electrode layer of the memory element, and a conductive layer 542. Note that, although not shown in the drawing, the conductive layer 542 is electrically connected to the thin film transistor in the power supply portion 603. After the conductive layer is etched, the resist mask is removed.

A cross-sectional view of the semiconductor device through the steps up to here corresponds to FIG. 9B. In this embodiment, the thin film transistor in the logic circuit portion, the thin film transistor in the memory portion, and the thin film transistor and the capacitor in the power supply portion 603 can be formed over the same substrate by using ten photomasks.

Next, a seventh insulating layer 540 is formed to cover the thin film transistor in the logic circuit portion 601, the thin film transistor in the memory portion 602, and the thin film transistor and the capacitor in the power supply portion 603. As the seventh insulating layer 540, an insulating layer containing silicon oxide or an organic resin layer is used. In an attempt to improve reliability of a wireless chip, an insulating layer containing silicon oxide is preferably used. In the case where the antenna to be formed later is formed by a screen printing method, it is preferable that the seventh insulating layer 540 have a plane surface; therefore, the organic resin layer formed by a coating method is preferably used. A practitioner may select a material of the seventh insulating layer 540 appropriately. Further, in this embodiment, an example that the antenna to be formed later is overlapped with the driver circuit and the memory portion is shown; therefore, the seventh insulating layer 540 serves as an interlayer insulating layer which insulates the antenna. In the case where the antenna is formed to have a circular shape (for example, a loop antenna) or a spiral shape, one of the both ends of the antenna is led with a wiring of a lower layer; therefore, the seventh insulating layer 540 is preferably provided. However, in the case where a microwave method is applied and the antenna is formed to have a linear shape (such as a dipole antenna), a flat shape (such as a patch antenna), or the like, the antenna to be formed later can be placed so as not to overlap with the driver circuit and the memory portion; therefore, the seventh insulating layer 540 is not required to be provided.

Next, a resist mask is formed using an eleventh photomask and the seventh insulating layer 540 is selectively etched to form an opening which reaches the lead wiring 541 and an opening which reaches the conductive layer 542. Then, the resist mask is removed after etching.

Next, a metal layer is formed over the seventh insulating layer 540. As the metal layer, a single layer or a stack layer of Ti, Ni, or Au is used. Then, a resist mask is formed using a twelfth photomask and the metal layer is selectively etched to form a first electrode layer 543 of the memory element, a conductive layer 544 to be connected to the lead wiring 541, and a base film 545 of the antenna. Note that the first electrode layer 543, the conductive layer 544, and the base film 545 here can also be selectively formed by a sputtering method using a metal mask without using a resist mask. By providing the base film 545 of the antenna, a wide contact area with the antenna can be secured. Alternatively, the conductive layer 544 and the lead wiring 541 may not be formed, depending on a layout of a circuit design.

A cross-sectional view of the semiconductor device through the steps up to here corresponds to FIG. 9C.

Next, an eighth insulating layer 548 is formed so as to cover the first electrode layer 543, the conductive layer 544, the base film 545 of the antenna, and the seventh insulating layer 540. The eighth insulating layer can be formed of a similar material to the seventh insulating layer 540. Here, photosensitive polyimide with a thickness of 0.8 μm to 1.5 μm is applied and the photosensitive polyimide is exposed to light and developed using a thirteenth photomask. Then, the photosensitive polyimide is heated at 200° C. to 350° C. to form the eighth insulating layer 548.

Next, an antenna 546 is formed over the base film 545. The antenna 546 can be formed by a method in which a metal layer such as Al or Ag is formed by a sputtering method and then the metal layer is etched using a photomask, or by a screen printing method. If a reduction in the number of photomasks is prioritized, the antenna may be formed by a screen printing method. Here, after printing using a silver paste, baking is performed at 200° C. to 350° C. and the antenna 546 with a thickness of 5 μm to 20 μm is formed.

Next, a layer 549 containing an organic compound is formed over a part of the first electrode layer 543 and the eighth insulating layer 548. The layer 549 containing an organic compound can be formed by using appropriately an evaporation method, a coating method, a droplet discharging method, a printing method, or the like. Here, a calcium fluoride layer with a thickness of 1 nm to 4 nm is evaporated by an evaporation method, and then CzPA with a thickness of 5 nm to 20 nm is evaporated to form the layer 549 containing an organic compound.

Figure 10A:
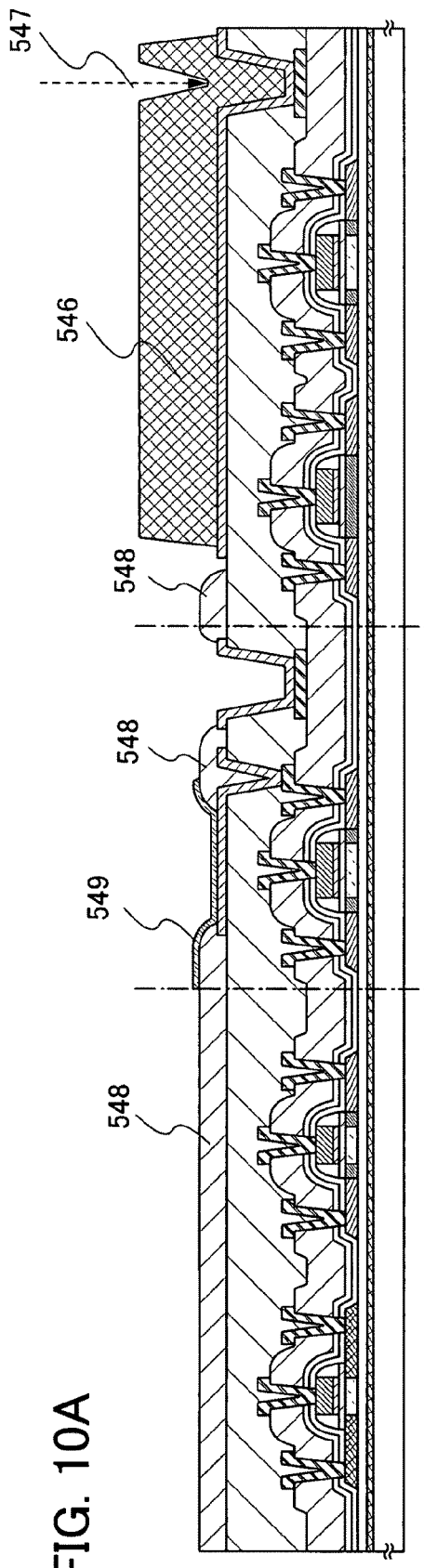
FIGS. 10A and 10B are cross-sectional views showing a manufacturing process of a semiconductor device of the present invention.

A cross-sectional view of the semiconductor device through the steps up to here corresponds to FIG. 10A.

Next, a second electrode layer 550 of the memory element is formed over a part of the layer 549 containing an organic compound, the conductive layer 544, and the eighth insulating layer 548. The second electrode layer 550 is also connected to the conductive layer 544. The second electrode layer 550 can be formed by using appropriately an evaporation method, a sputtering method, a coating method, a droplet discharging method, a printing method, or the like. Here, an alloy layer of tin and silver with a thickness of 50 nm to 200 nm is evaporated by an evaporation method to form the second electrode layer 550.

Figure 10B:
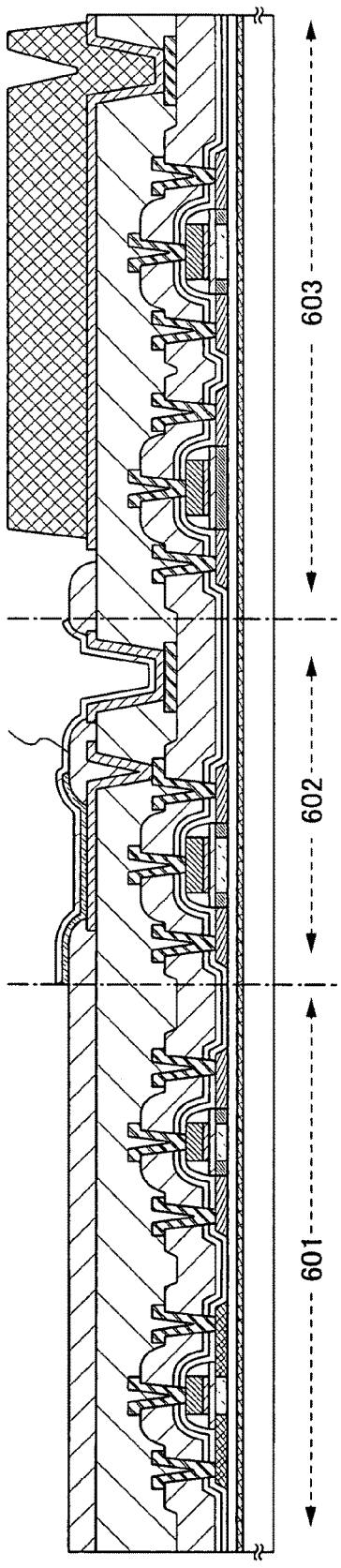

A cross-sectional view of the semiconductor device through the steps up to here corresponds to FIG. 10B. In this embodiment, the thin film transistor in the logic circuit portion 601, the thin film transistor and a memory element 600 in the memory portion 602, and the thin film transistor and the antenna in the power supply portion 603 can be formed over the same substrate.

Further, in this embodiment, although the example of forming a resist mask using a photomask is given, the present invention is not limited thereto, and a resist material may also be selectively formed by a droplet discharging method without using a photomask to form a resist mask.

Next, a ninth insulating layer 551 is formed so as to cover the eighth insulating layer 548, the second electrode layer 550, and the antenna 546. The ninth insulating layer 551 preferably reduces projection and depression on the surface and thus is preferably formed using an organic resin. In this embodiment, an epoxy resin is printed by a printing method and baked at 160° C. for 30 minutes to form the ninth insulating layer 551 with a thickness of 10 μm to 30 μm. Note that a stack from the first insulating layer through the second electrode layer is referred to as an element layer 554. The ninth insulating layer 551 functions as a sealing layer which seals the element layer 554.

Next, in order to perform the later separation step easily, irradiation with a laser beam is performed to form a groove (not shown in the drawing).

Next, a supporting member 552 is provided over the ninth insulating layer 551. Here, as the supporting member 552, a film having an adhesive layer 553 is attached to the ninth insulating layer 551.

Figure 14A:
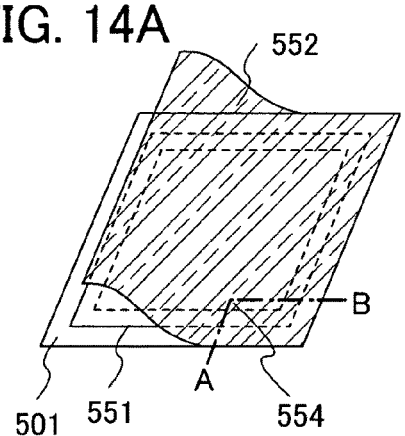
FIGS. 14A to 14H are perspective views and cross-sectional views showing a manufacturing process of a semiconductor device of the present invention.
Figure 14B:
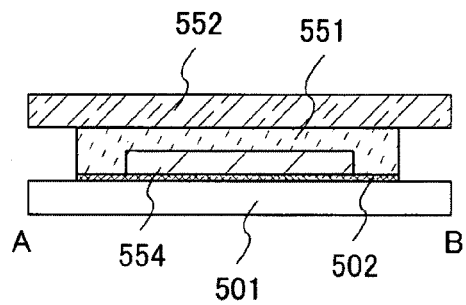

A cross-sectional view of the semiconductor device through the steps up to here corresponds to FIG. 11A, and a perspective view of the semiconductor device corresponds to FIG. 14A. In addition, a cross-sectional view taken along a line A-B in FIG. 14A corresponds to FIG. 14B.

Next, the element layer and the sealing layer are separated from the substrate 501. Specifically, the element layer 554 and the insulating layer 551 are separated from the substrate 501 at the separation layer 502 by a physical method. The physical method refers to a dynamic method or a mechanical method, which changes some dynamic energy (mechanical energy). The typical physical method refers to mechanical power addition (for example, peeling by a human hand or a gripper or separation treatment by rotating a roller). Here, a roller 561 having adhesiveness is attached to the surface of the supporting member 552 and the roller 561 is rotated, whereby the element layer 554 and the insulating layer 551 are separated from the substrate 501. Specifically, separation is caused in the metal oxide layer, in the interface between the first insulating layer 503 and the separation layer 502, or in the separation layer 502, and thus, the element layer 554 and the insulating layer 551 can be separated from the substrate 501 by relatively small power.

Figure 14C:
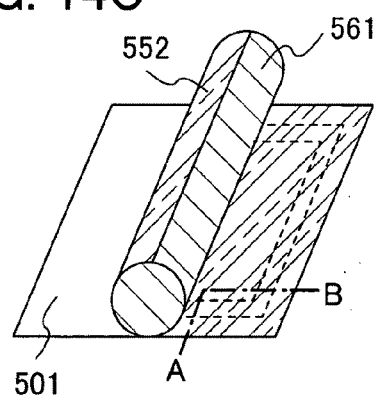
Figure 14D:
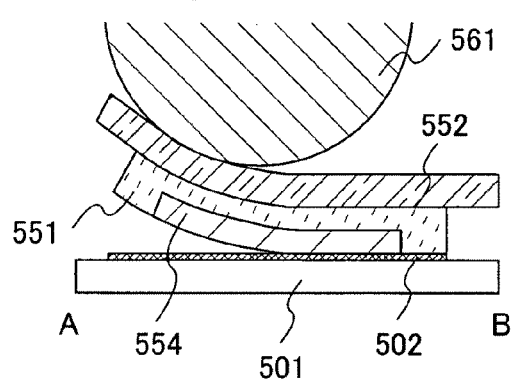

A cross-sectional view of the semiconductor device through the steps up to here corresponds to FIG. 11B, and a perspective view of the semiconductor device corresponds to FIG. 14C. In addition, a cross-sectional view taken along a line A-B in FIG. 14C corresponds to FIG. 14D.

Next, a first flexible substrate is attached to the element layer 554 and the insulating layer 551 which are separated from the separation layer. Here, a first flexible substrate 562 is attached to the surface of the element layer 554 and the insulating layer 551 by using an adhesive 563.

As the first flexible substrate 562, the flexible substrate 120 shown in Embodiment Mode 1 can be appropriately used. Further, paper, prepreg, ceramic sheet, or the like, can be used. As the adhesive 563, various curable adhesives such as a reactive curable adhesive, a thermal curable adhesive, a photo curable adhesive such as an ultraviolet curable adhesive, and an anaerobic adhesive can be used.

Figure 12A:
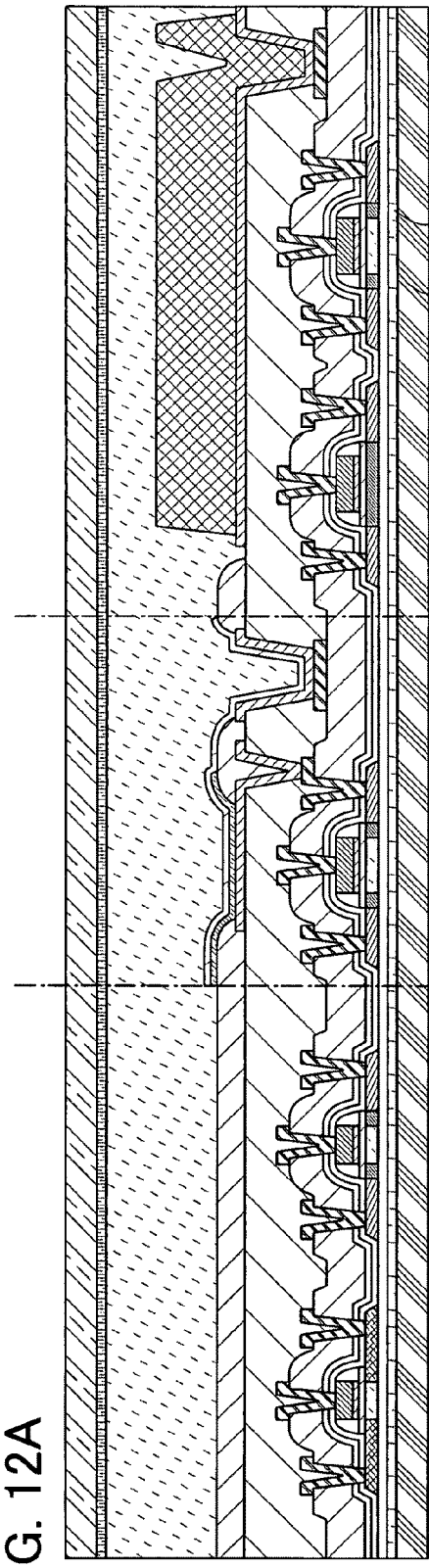
FIGS. 12A and 12B are cross-sectional views showing a manufacturing process of a semiconductor device of the present invention.
Figure 14E:
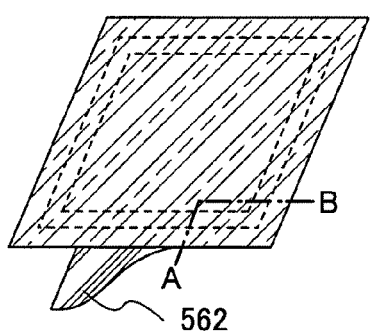
Figure 14F:
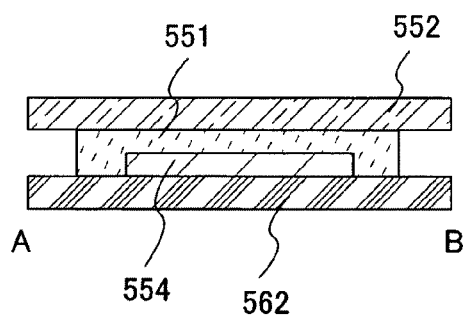

A cross-sectional view of the semiconductor device through the steps up to here corresponds to FIG. 12A, and a perspective view of the semiconductor device corresponds to FIG. 14E. In addition, a cross-sectional view taken along a line A-B in FIG. 14E corresponds to FIG. 14F.

Figure 14G:
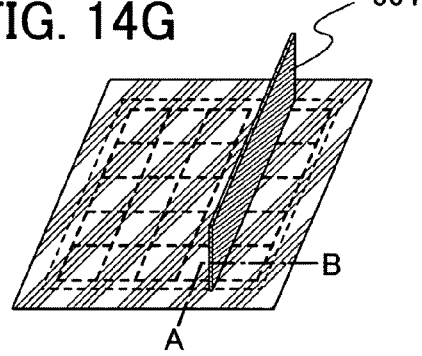
Figure 14H:
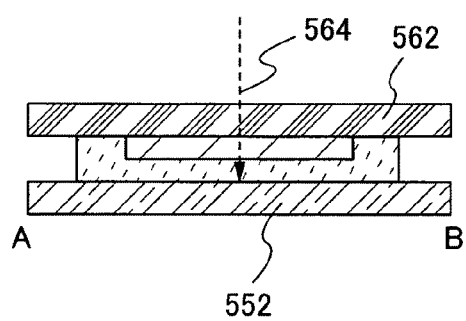

Next, as shown in FIGS. 14G and 14H, the semiconductor device is turned upside down so that the first flexible substrate 562 is at an upper side and the supporting member 552 is at a lower side, and the first flexible substrate 562, the element layer 554, and the insulating layer 551 are cut by a cutting means 564, and then the semiconductor device is divided into plural individual thin film integrated circuits. As the cutting means 564, a laser cutting method, a dicing method, a scribing method, or the like, can be used as appropriate. Here, the supporting member 552 is not divided, and the first flexible substrate 562, the insulating layer 551, and the element layer 554 are cut by a cutter to be divided.

Figure 15A:
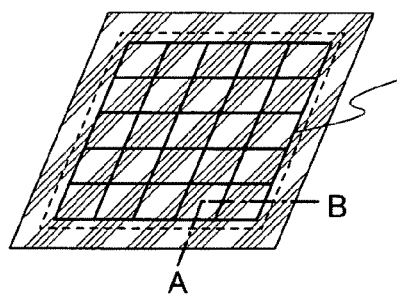
FIGS. 15A to 15F are perspective views and cross-sectional views showing a manufacturing process of a semiconductor device of the present invention.
Figure 15B:
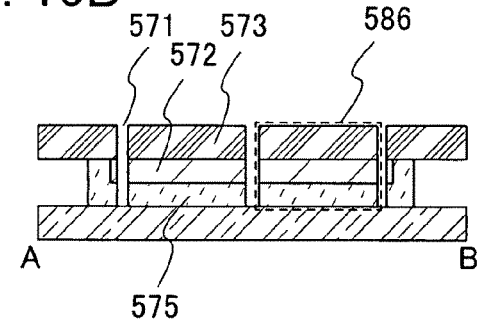

As a result, as shown in FIGS. 15A and 15B, a groove 571 is formed in the element layer and a sealing resin. The divided element layer is referred to as a thin film integrated circuit 572, the divided sealing resin is referred to as a resin layer 575. The thin film integrated circuit 572, the resin layer 575, and a divided first flexible substrate 573 is referred to as a stack 586.

Figure 12B:
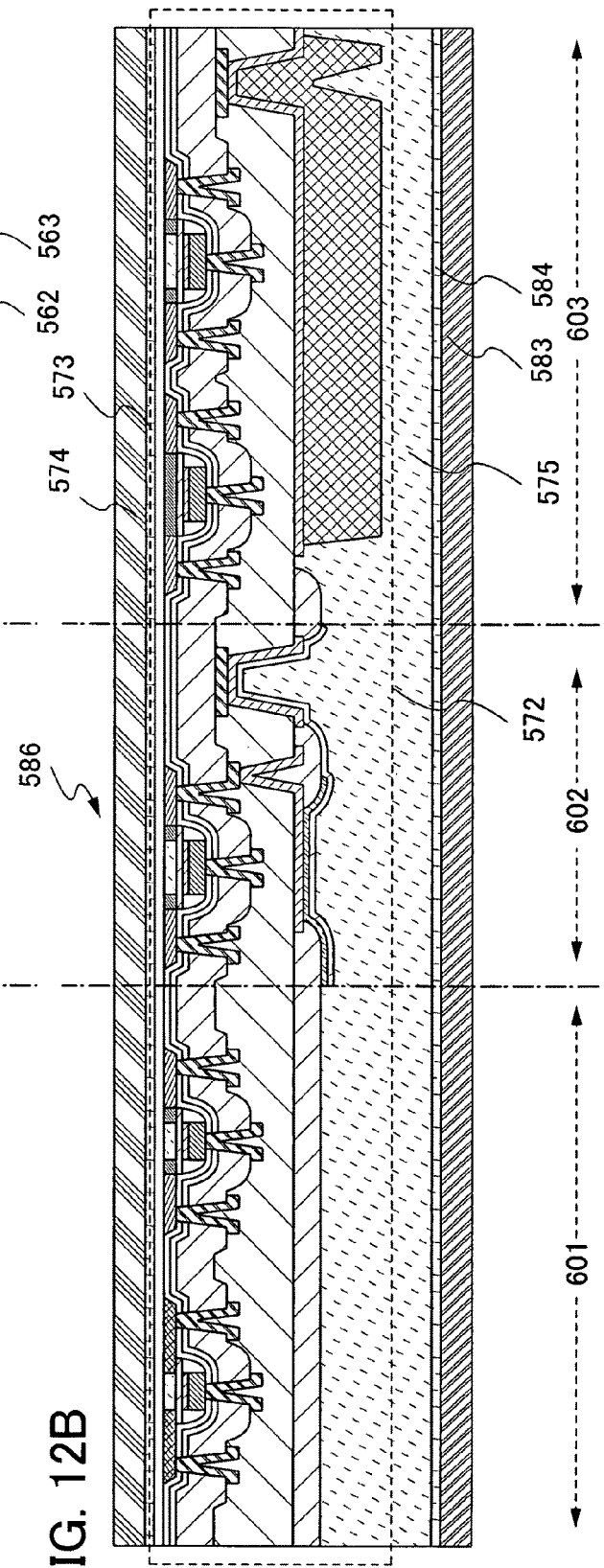

A cross-sectional view of the stack 586 through the steps up to here taken along a line A-B corresponds to FIG. 12B.

Figure 15C:
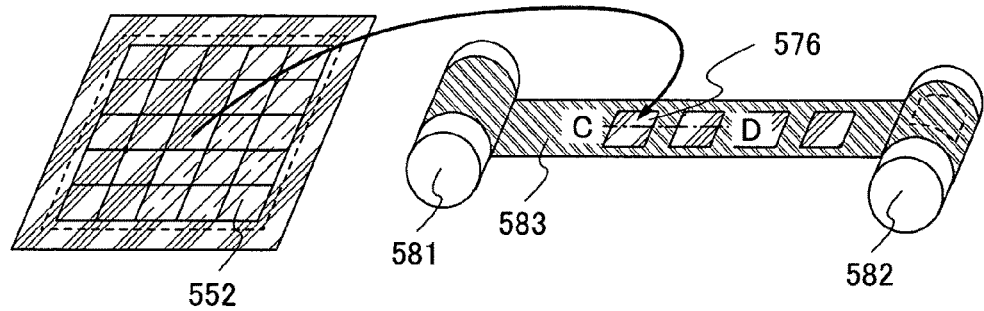
Figure 15D:
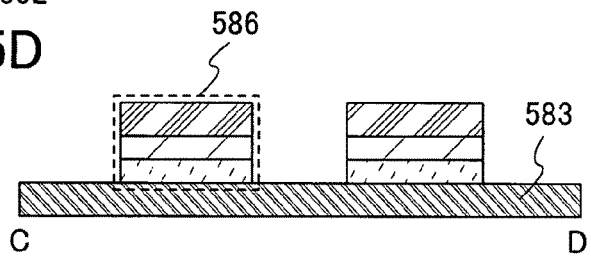

Next, as shown in FIG. 15C, the stack 586 provided over the supporting member 552 is picked up by a pickup device and attached to a second flexible substrate 583. Note that the second flexible substrate 583 is fed from a supply roll 581. The second flexible substrate 583 to which the stack 586 is attached is collected by a collection roll 582. An adhesive layer 584 is provided over the surface of the second flexible substrate 583, and the stack 586 can be attached to the second flexible substrate 583 by the adhesive layer.

As the second flexible substrate 583, plastic, paper, prepreg, ceramic sheet, or the like can be used. As the adhesive layer, various curable adhesives such as a reactive curable adhesive, a thermal curable adhesive, a photo curable adhesive such as an ultraviolet curable adhesive, and an anaerobic adhesive can be used.

Further, the stack is provided in the process of forming paper, and the stack can be provided inside a sheet of paper. In addition, a cross-sectional view taken along a line C-D in FIG. 15C corresponds to FIG. 15D.

Figure 15E:
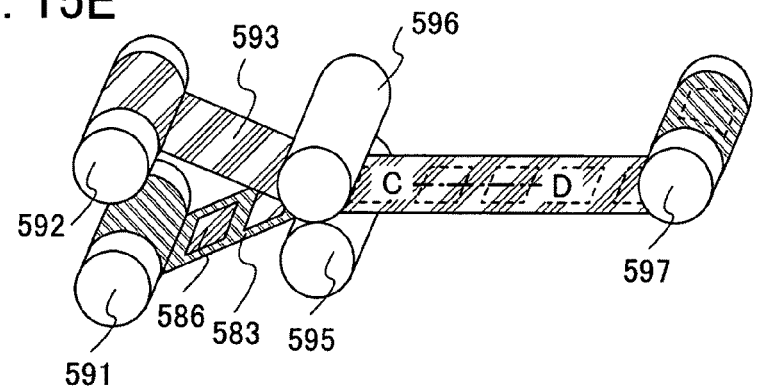
Figure 15F:
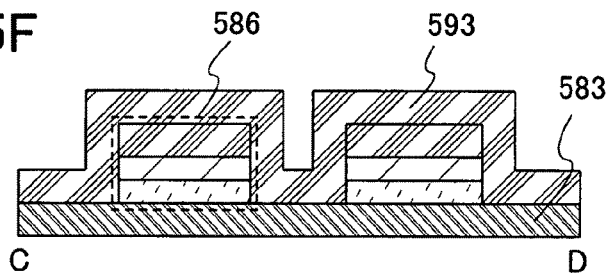

Next, as shown in FIG. 15E, a third flexible substrate 593 is attached to the surface of the second flexible substrate 583 over which the stack 586 is provided. Specifically, the second flexible substrate 583 over which the stack 586 is provided is fed from a supply roll 591. Further, the third flexible substrate 593 is fed from a supply roll 592. The second flexible substrate and the third flexible substrate can be sealed by a pressure and a rotation speed of a pair of rollers 595 and 596. That is, the stack 586 can be sealed with the second flexible substrate 583 and the third flexible substrate 593, and the second flexible substrate 583 and the third flexible substrate 593 can be adhered to each other.

Figure 13:
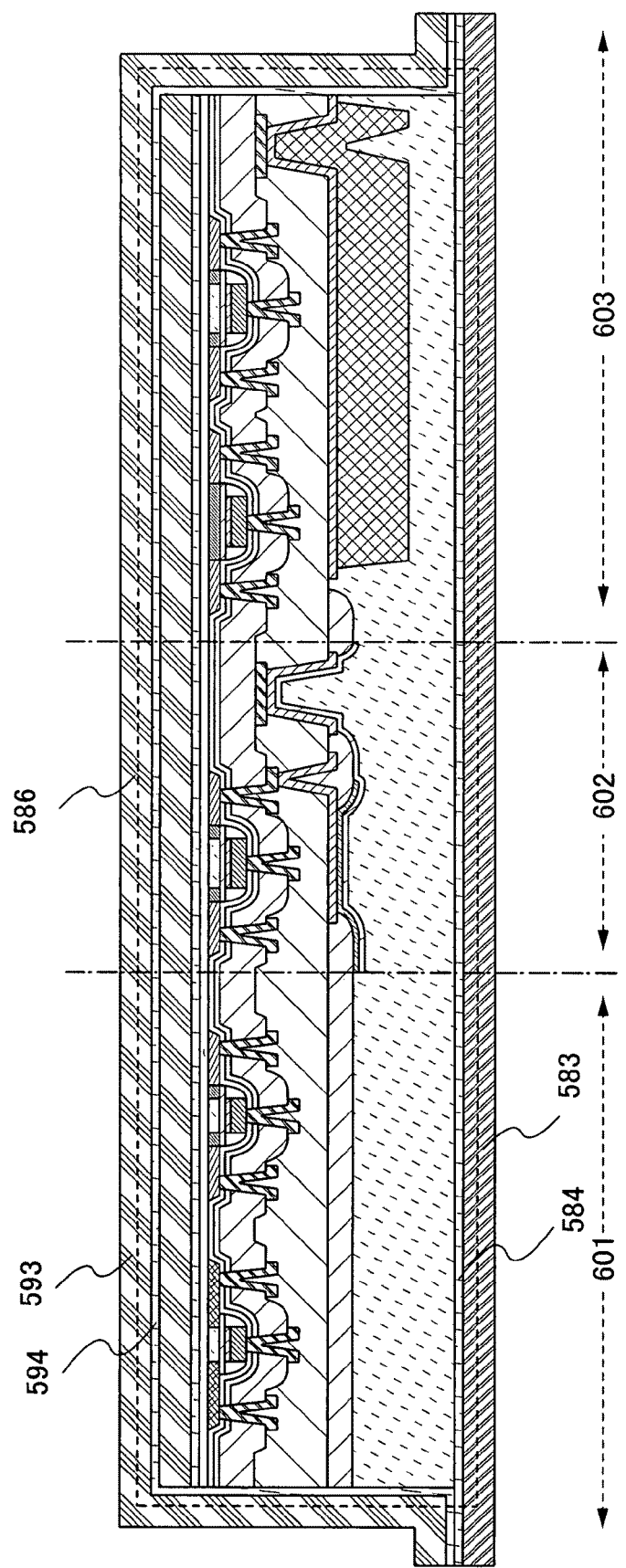
FIG. 13 is a cross-sectional view showing a manufacturing process of a semiconductor device of the present invention.
Figure 16A:
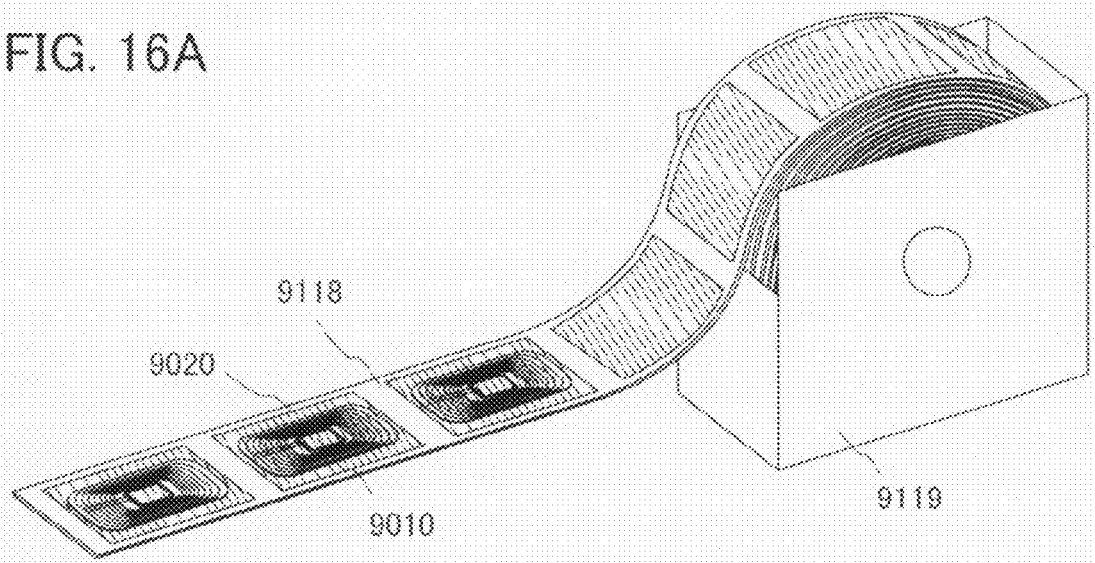
FIGS. 16A to 16E are views showing applications of a semiconductor device of the present invention.
Figure 16B:
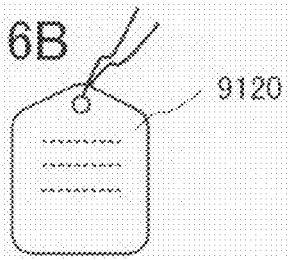
Figure 16C:
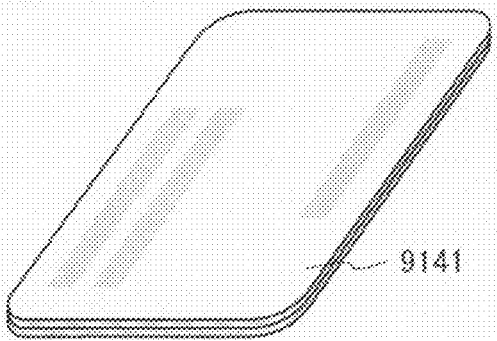
Figure 16D:
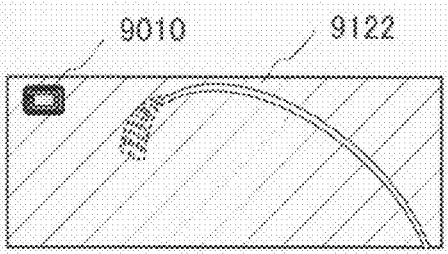
Figure 16E:
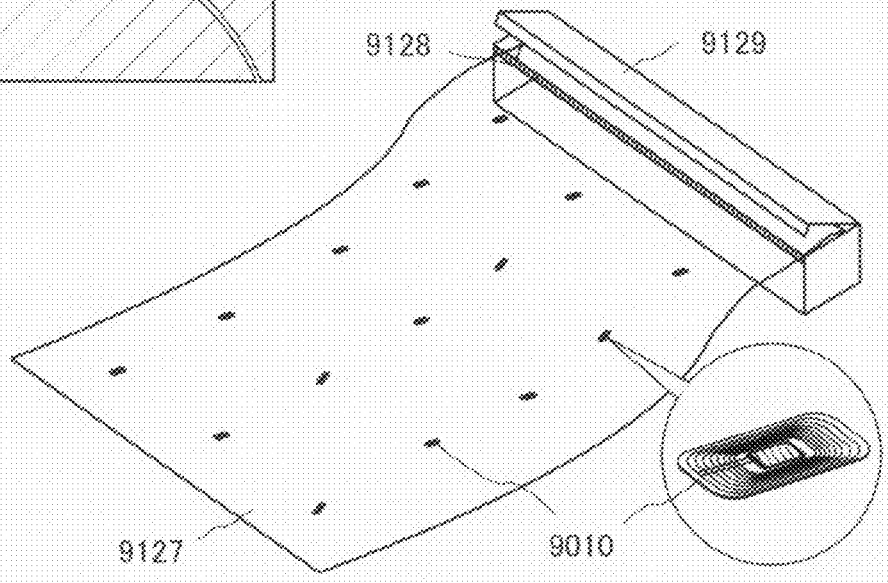

A cross-sectional view of the semiconductor device through the steps up to here corresponds to FIG. 13, and a perspective view of the semiconductor device corresponds to FIG. 16E. In addition, a cross-sectional view taken along a line C-D in FIG. 15E corresponds to FIG. 15F.

After that, a region where the second flexible substrate 583 and the third flexible substrate 593 are in contact with each other is cut by a cutting means, whereby a flexible semiconductor device can be manufactured.

Embodiment 2

In this embodiment, a semiconductor device having a memory element using an alloy layer of tin and bismuth as a second electrode layer will be described.

In this embodiment, a semiconductor device having a memory element was formed over a substrate, a measurement device was directly connected to the semiconductor device, and data was written by applying a voltage to the memory element. Writing rates at writing voltage at that time will be explained with reference to FIGS. 19A and 19B. Note that data was written by applying a voltage to the memory element and causing a short-circuit therein.

In the memory element, a first electrode layer, a layer containing an organic compound, and a second electrode layer were sequentially stacked over a substrate. The substrate was a glass substrate, the first electrode layer was formed using a titanium layer having a thickness of 100 nm, the layer containing an organic compound was formed using a tin oxide layer with a thickness of 1 nm and a CzPA layer with a thickness of 10 nm, and the second electrode layer was formed using an alloy layer of tin and bismuth with a thickness of 200 nm.

A first conductive layer was formed by a sputtering method, then, a resist mask was formed over the first conductive layer by a photolithography step, and the first conductive layer was selectively etched using the resist mask, so that the first electrode layer was formed. In addition, the layer containing an organic compound was formed by an evaporation method. Further, the second electrode layer was formed by the steps of putting tin and bismuth with a molar ratio of tin to bismuth of 1:1.1 in a tantalum boat, forming a melt in which tin and bismuth were mixed by heating, and evaporating the melt. A memory element whose top shape is square and whose length of one side is 10 μm is referred to as Sample 1. Further, a memory element having the foregoing structure, whose top shape is square and whose length of one side is 5 μm is referred to as Sample 2.

Figure 19A:
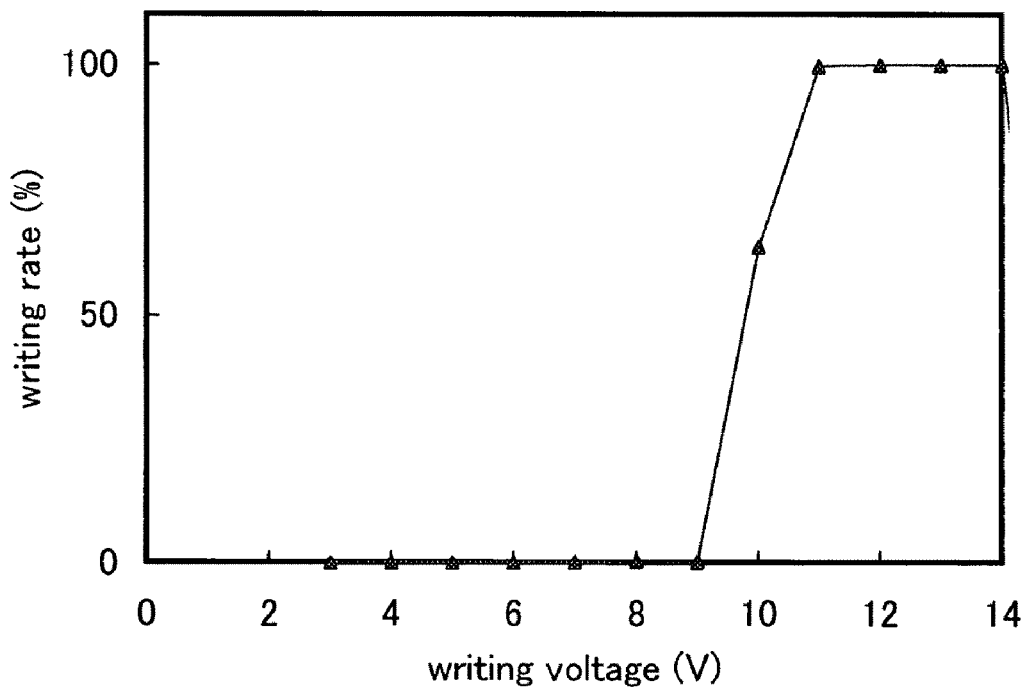
FIGS. 19A and 19B are graphs showing measurement results of a semiconductor device of the present invention.
Figure 19B:
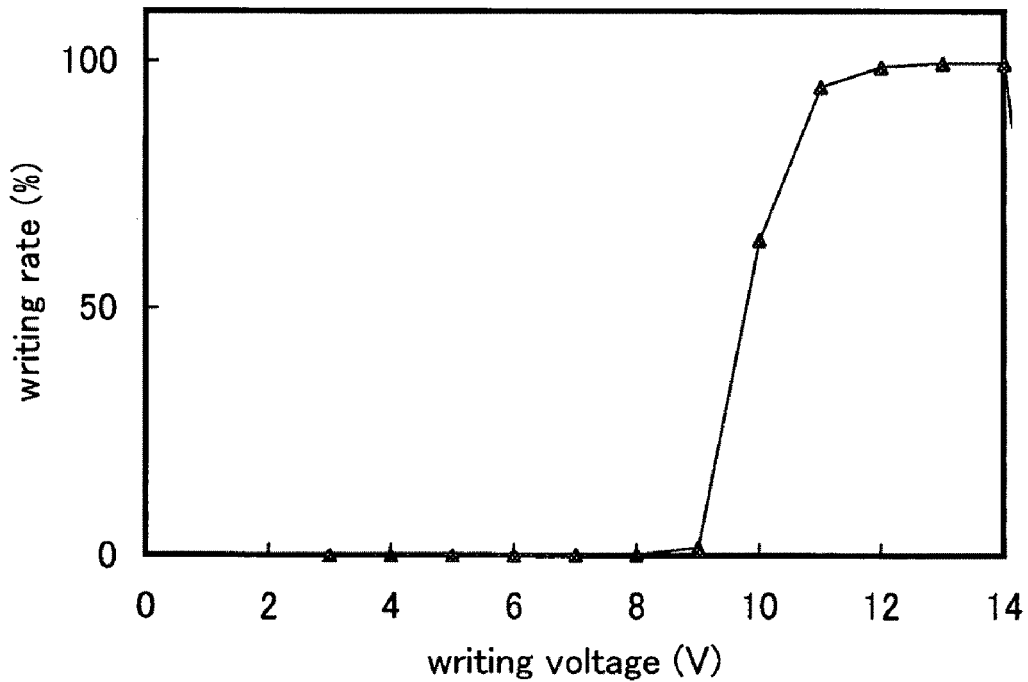

FIG. 19A shows a writing rate when a voltage was applied to the memory element of Sample 1 to perform writing. FIG. 19B shows a writing rate of the memory element of Sample 2. In FIGS. 19A and 19B, a horizontal axis represents a voltage value and a vertical axis represents a writing rate. Writing time was set to be 10 milliseconds. In the memory element of Sample 1, writing was started at a voltage higher than 9 V and a writing success rate reached 100% at 11 V. In addition, in the memory element of Sample 2, writing was started at a voltage higher than 8 V, and a writing success rate reached 95% at 11 V.

Figure 20:
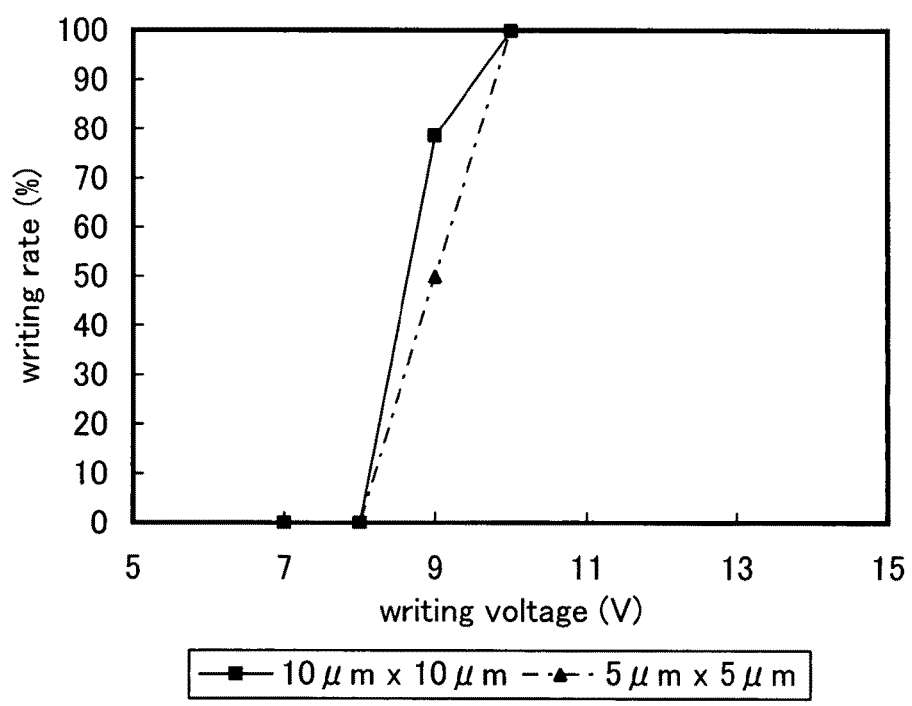
FIG. 20 is a graph showing measurement results of a semiconductor device of the present invention.

Next, FIG. 20 shows writing rates of other memory elements, in each of which a second electrode layer was formed by evaporating an alloy of tin and bismuth.

Writing rates in FIG. 20 are writing rates at writing voltage of semiconductor devices each having the following memory element. In the memory element, a first electrode layer, a layer containing an organic compound, and a second electrode layer were sequentially stacked over a substrate. The substrate was formed using a glass substrate, the first electrode layer was formed using a titanium layer with a thickness of 100 nm, the layer containing an organic compound was formed using a calcium fluoride layer with a thickness of 2 nm, a CzPA layer with a thickness of 10 nm, and a calcium fluoride layer with a thickness of 2 nm, and the second electrode layer was formed using an alloy layer of tin and bismuth with a thickness of 300 nm.

Each memory element shown in FIG. 20 was formed as follows: a first conductive layer was formed by a sputtering method, then, a resist mask was formed over the first conductive layer by a photolithography step, and the first conductive layer was selectively etched using the resist mask, so that the first electrode layer was formed; the layer containing an organic compound was formed by an evaporation method; and the second electrode layer was formed by the steps of putting an alloy of tin and bismuth with a molar ratio of tin to bismuth of 43:57 in a tantalum boat, and evaporating it. As for a memory element whose top shape is square and whose length of one side is 10 μm, writing rates are denoted by a solid line. As for a memory element whose top shape is square and whose length of one side is 5 μm, writing rates are denoted by a dashed line.

In FIG. 20, a horizontal axis represents a voltage value and a vertical axis represents a writing rate. Writing time was set to be 10 milliseconds.

According to FIG. 20, it is found that in the semiconductor device having the memory element whose length on one side in a top shape is 10 μm and the semiconductor device having the memory element whose length on one side in a top shape is 5 μm, writing was started at a voltage higher than 8 V and writing success rates reached 100% at 10 V.

As described above, by using an alloy of tin and bismuth for the second electrode layer, writing can be performed at a high rate. In addition, when the layer containing an organic compound is formed using an organic compound layer interposed between a pair of calcium fluoride layers, variation in writing voltage can be reduced.

Embodiment 3

This embodiment mode will describe a semiconductor device having a memory element using an alloy layer of tin and silver for a second electrode layer.

As for a semiconductor device formed similarly to Embodiment 1 (note that the antenna 546 was formed using an aluminum layer with a thickness of 5 μm by a sputtering method), three kinds of samples having memory elements with different structures were formed.

Figure 21A:
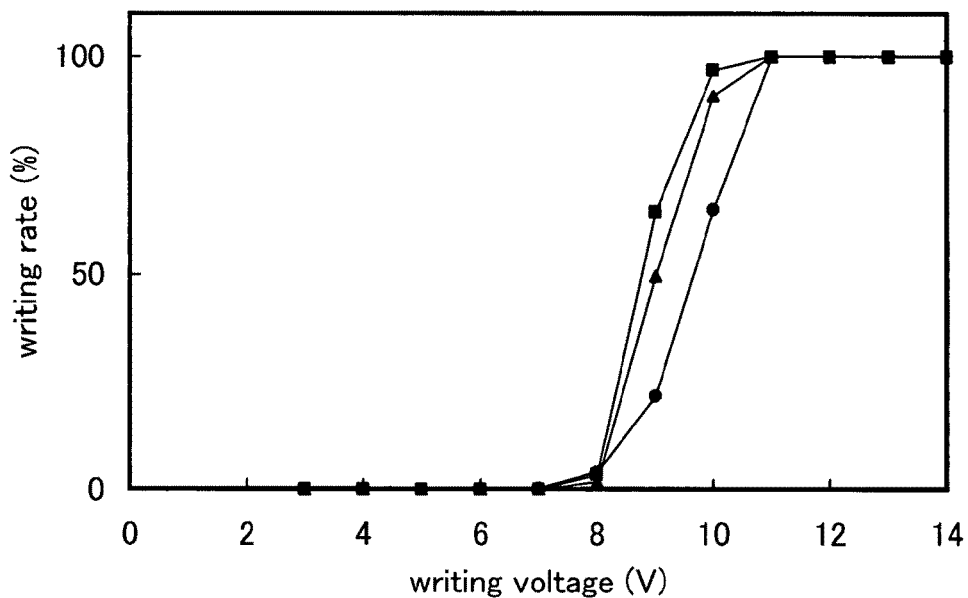
FIGS. 21A and 21B are graphs showing measurement results of a semiconductor device of the present invention and FIG. 21C are cross-sectional views of samples of a semiconductor device of the present invention.
Figure 21B:
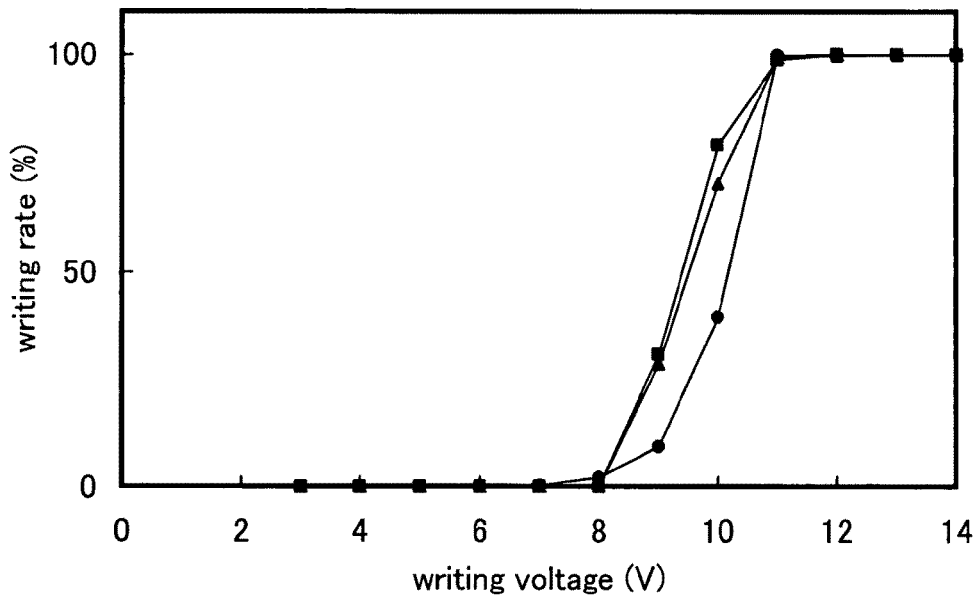
Figure 21C:
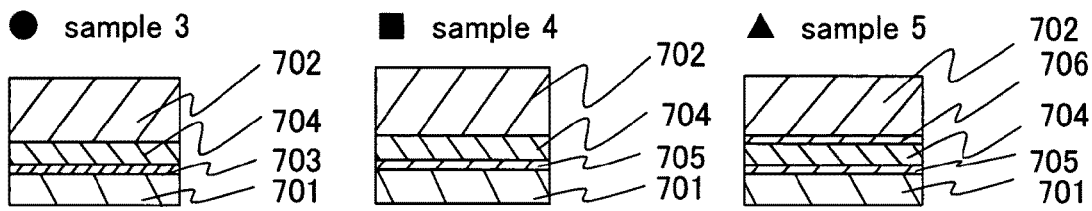

As shown in FIG. 21C, for Sample 3, a titanium layer with a thickness of 100 nm formed by a sputtering method was used as a first electrode layer 701, an alloy layer of tin and silver with a thickness of 200 nm formed by an evaporation method was used as a second electrode layer 702, and a SnO$_2$ layer 703 with a thickness of 1 nm formed by an evaporation method and a CzPA layer 704 with a thickness of 10 nm formed by an evaporation method were used as a layer containing an organic compound.

For Sample 4, a titanium layer with a thickness of 100 nm formed by a sputtering method was used as the first electrode layer 701, an alloy layer of tin and silver with a thickness of 200 nm formed by an evaporation method was used as the second electrode layer 702, and a calcium fluoride layer 705 with a thickness of 1 nm formed by an evaporation method and the CzPA layer 704 with a thickness of 10 nm formed by an evaporation method were used as the layer containing an organic compound.

For Sample 5, a titanium layer with a thickness of 100 nm formed by a sputtering method was used as the first electrode layer 701, an alloy layer of tin and silver with a thickness of 200 nm formed by an evaporation method was used as the second electrode layer 702, and the calcium fluoride layer 705 with a thickness of 1 nm formed by an evaporation method, the CzPA layer 704 with a thickness of 10 nm formed by an evaporation method, and a calcium fluoride layer 706 with a thickness of 1 nm were used as the layer containing an organic compound.

In Samples 3 to 5, the second electrode layer 702 was formed by the steps of putting tin and silver with a molar ratio of tin to silver of 1:0.27 in a tantalum boat, forming a melt in which tin and silver were mixed by heating, and evaporating the melt.

Separation process as illustrated in FIG. 11B was performed to Samples 3 to 5. A separation success rate of the elements of Sample 3 or other semiconductor elements without breaking them was 92 to 100%. A separation success rate of Sample 4 was 76%. A separation success rate of Sample 5 was 96%. That is, when the alloy layer of tin and silver is used as the second electrode layer, the elements can be separated with high yield. Further, flexible semiconductor devices can be manufactured with high yield.

FIGS. 21A and 21B show writing rates measured by directly connecting a measurement device to the semiconductor device shown in FIG. 10B that is formed similarly to Embodiment 1 (note that the separation layer 502 and the antenna 546 were not formed). This semiconductor device includes a memory element formed over a glass substrate without a separation process.

FIG. 21A shows writing rates of Samples 3 to 5 each having a memory element whose top shape is square and whose length of one side is 10 μm, and FIG. 21B shows writing rates of Samples 3 to 5 each having a memory element whose top shape is square and whose length of one side is 5 μm.

In each graph, a circle sign, a square sign, and a triangular sign show the writing rates of Sample 3, Sample 4, and Sample 5, respectively.

According to FIG. 21A, in each sample, writing was started at a voltage higher than 7 V and writing of 100% was accomplished at 11 V. In addition, according to FIG. 21B, writing was started at a voltage higher than 7 V and writing of 100% was accomplished at 12 V.

Figure 22A:
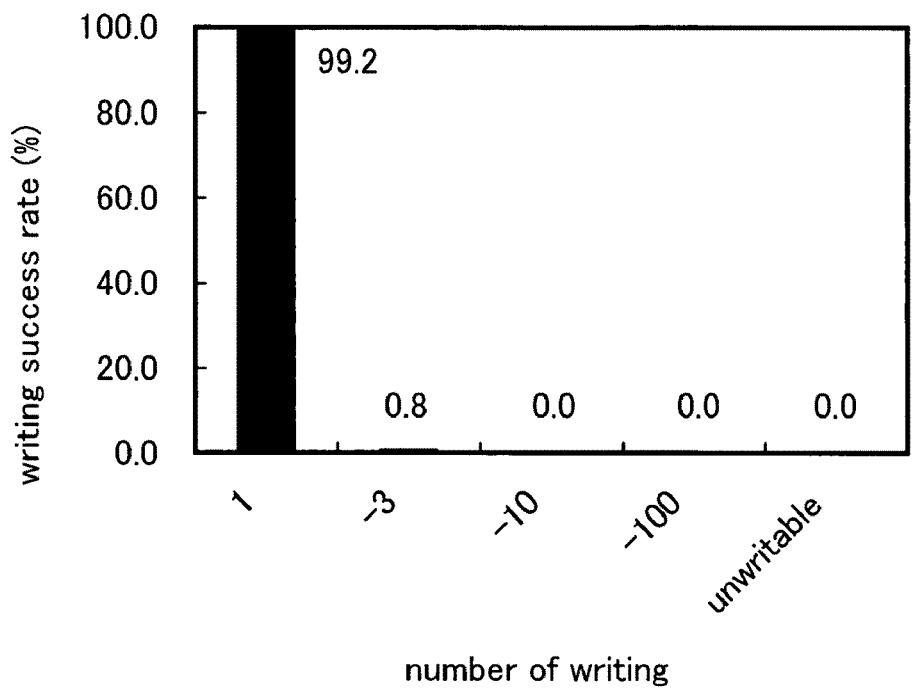
FIGS. 22A and 22B are graphs showing measurement results of a semiconductor device of the present invention.
Figure 22B:
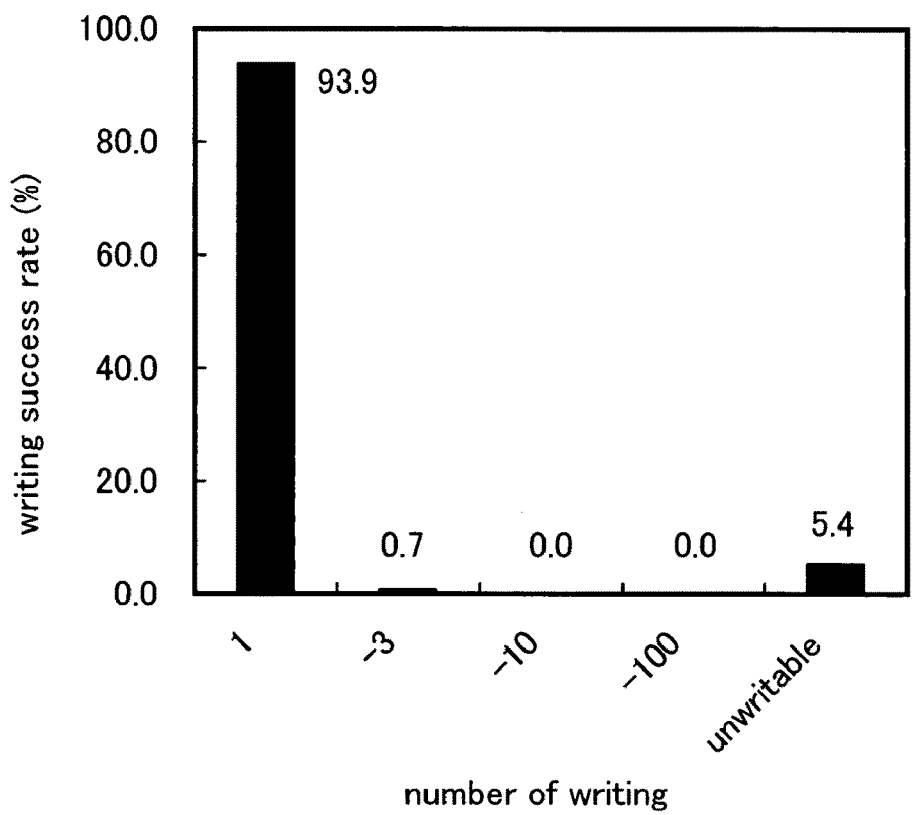

Next, FIGS. 22A and 22B show writing success rates when writing was wirelessly performed using a reader/writer to a memory element in a semiconductor device as shown in FIG. 13 formed similarly to Embodiment 1. This semiconductor device is a semiconductor device attached to a flexible substrate through a separation process. Writing was performed to the memory element at voltage in the range of 1.6 to 6.7 V, which can operate the semiconductor device.

FIG. 22A shows wiring rates of a semiconductor device having a memory element with the structure of Sample 4 shown in FIG. 21C, and FIG. 22B shows wiring rates of a semiconductor device having a memory element with the structure of Sample 5 shown in FIG. 21C.

According to FIG. 22A, it is found that data can be written into the memory element by one-time writing instruction from the reader/writer at a rate of 99.2%. In addition, according to FIG. 22B, it is found that data can be written into the memory element by one-time writing instruction from the reader/writer at a rate of 93.9%. That is, a semiconductor device having a favorable writing rate could be formed.

Next, FIGS. 23A to 23F show writing rates when writing was performed wirelessly using a reader/writer to a memory element after a semiconductor device as shown in FIG. 13 formed similarly to Embodiment 1 had been kept under a certain condition. This semiconductor device is a semiconductor device attached to a flexible substrate through a separation process. Writing was performed to the memory element at a voltage in the range of 1.6 to 6.7 V, which can operate the semiconductor device.

After each of Samples 3 to 5 shown in FIGS. 21A to 21C had been kept at high temperature (+85° C.) or at high temperature and high humidity (+85° C. and humidity of 85%) for a certain period of time, data was written into the memory element wirelessly using a reader/writer. Note that samples had been kept under the above condition for 84 hours, 240 hours, and 500 hours.

FIGS. 23A to 23C shows writing rates of the semiconductor device kept at high temperature (+85° C.), and FIGS. 23D to 23F show writing rates of the semiconductor device kept at high temperature and high humidity (+85° C. and humidity of 85%). Further, FIGS. 23A and 23D show measurement results of Sample 3 shown in FIG. 21C, FIGS. 23B and 23E show measurement results of Sample 4 shown in FIG. 21C, and FIGS. 23C and 23F show measurement results of Sample 5 shown in FIG. 21C.

According to FIGS. 23B and 23E, in the semiconductor device having a memory element formed using a calcium fluoride layer with a thickness of 1 nm and a CzPA layer with a thickness of 10 nm as the layer containing an organic compound and an alloy of tin and silver with a thickness of 20 nm as the second electrode layer, data can be written by one-time writing instruction also after the semiconductor device had been kept at high temperature, and at high temperature and high humidity, for a long period of time (84 hours, 240 hours, and 500 hours).

According to FIGS. 23C and 23F, in the semiconductor device having a memory element formed using a calcium fluoride layer with a thickness of 1 nm, a CzPA layer with a thickness of 10 nm, and a calcium fluoride layer with a thickness of 1 nm as the layer containing an organic compound, and an alloy of tin and silver with a thickness of 20 nm as the second electrode layer, data can be written by one-time writing instruction also after the semiconductor device had been kept at high temperature, and at high temperature and high humidity, for a long period of time (84 hours, 240 hours, and 500 hours).

According to the above, it is found that by using an alloy layer of tin and silver as the second electrode layer, rate of variation in data of the semiconductor device kept at high temperature and at high temperature and high humidity was reduced. That is, by using an alloy layer of tin and silver as one electrode of the memory element, reliability of a storage function can be enhanced.

Figure 24A:
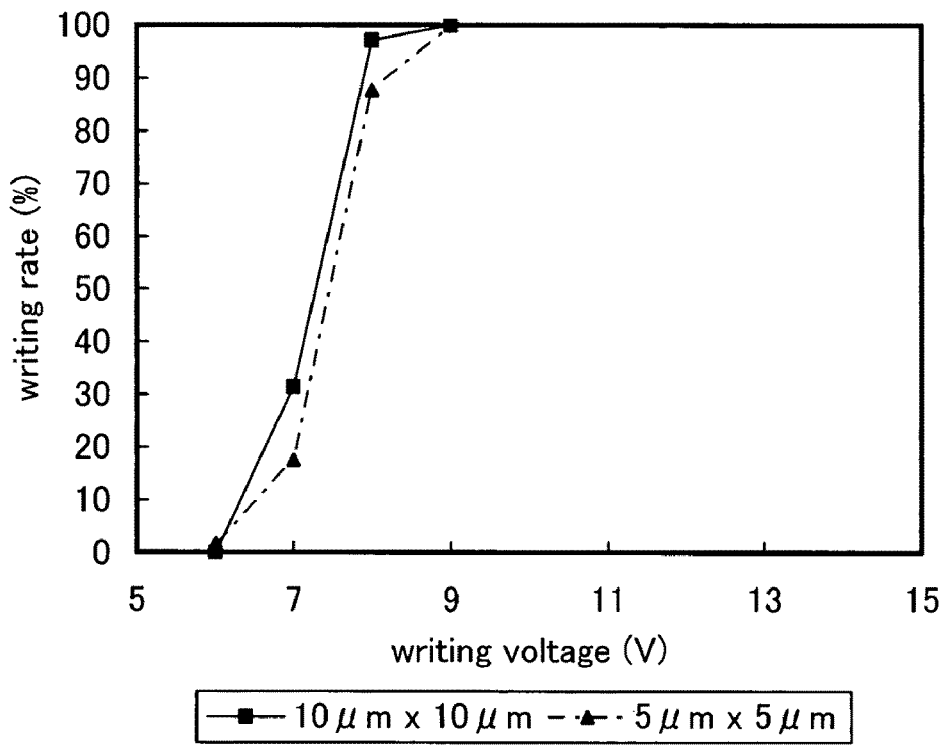
FIGS. 24A and 24B are graphs showing a measurement result of a semiconductor device of the present invention.
Figure 24B:
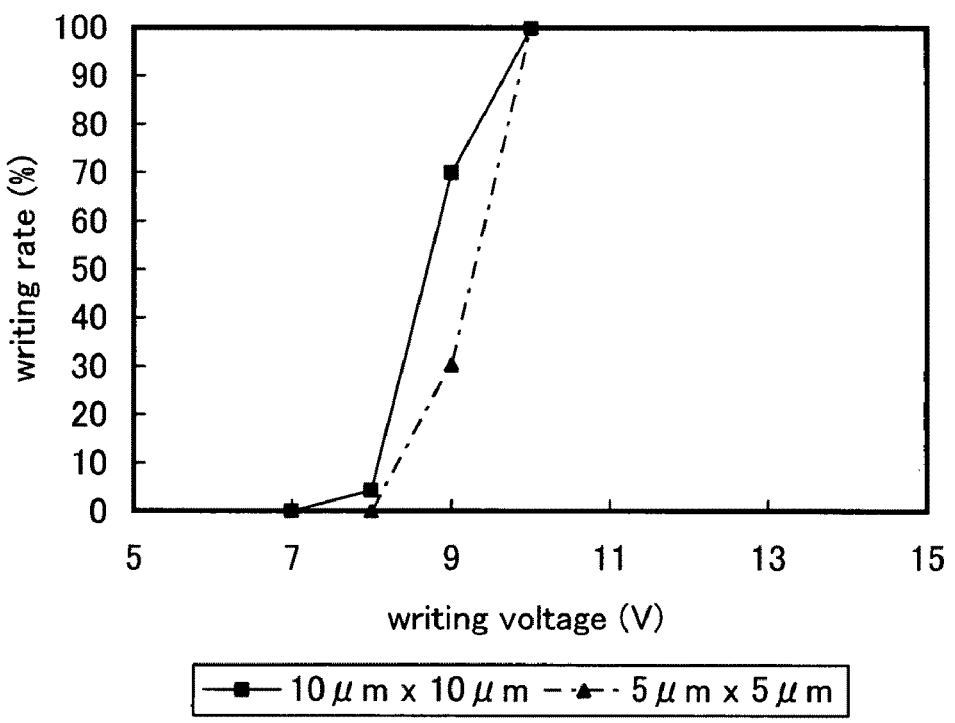
Figure 25A:
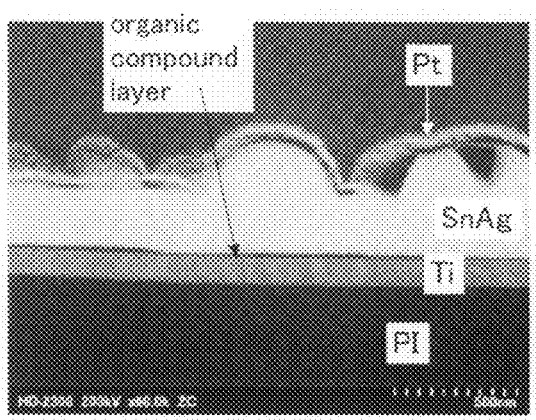
FIGS. 25A to 25E are observation images of a cross section of a memory element of the present invention.
Figure 25B:
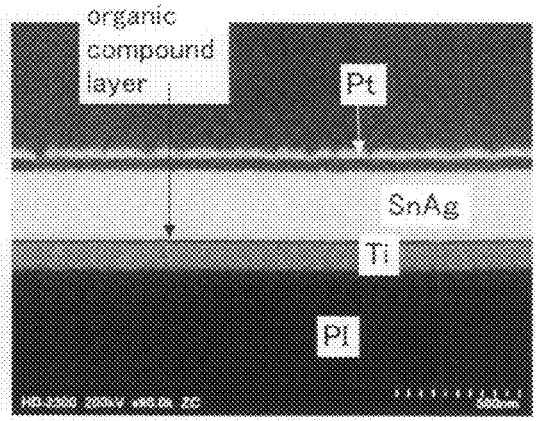
Figure 25C:
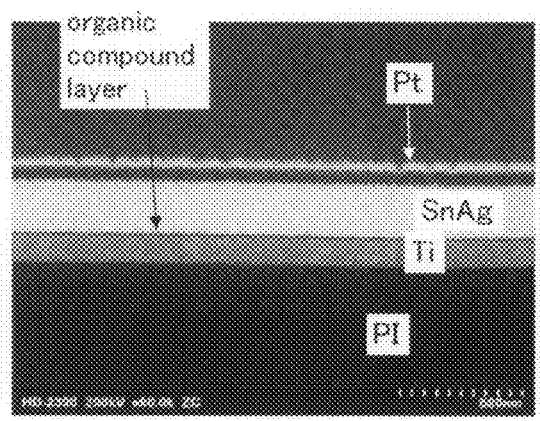
Figure 25D:
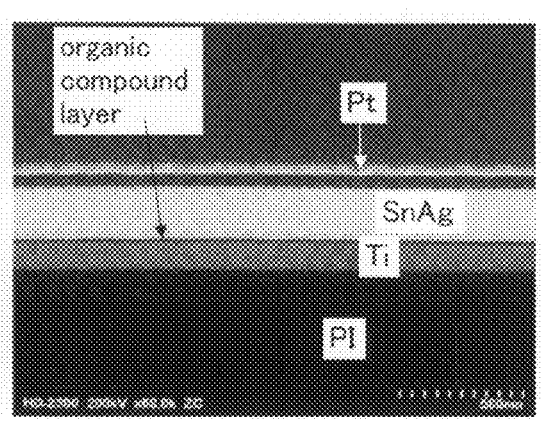
Figure 25E:
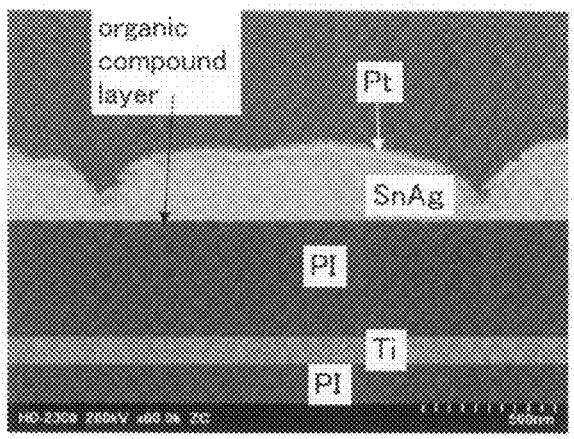

Next, FIGS. 24A and 24B show writing rates of a memory element formed by evaporating an alloy of tin and silver for a second electrode layer.

Writing rates in FIG. 24A show measurement results of a semiconductor device having the following memory element. The memory element is the element of Sample 4 shown in FIG. 21C. The substrate was a glass substrate, the first electrode layer was formed using a titanium layer with a thickness of 100 nm, the layer containing an organic compound was formed using a calcium fluoride layer with a thickness of 2 nm and a CzPA layer with a thickness of 10 nm, and the second electrode layer was formed using an alloy layer of tin and silver with a thickness of 200 nm.

Writing rates in FIG. 24B show writing rates at writing voltage of a semiconductor device having the following memory element. The memory element is the element of Sample 5 shown in FIG. 21C. The substrate was a glass substrate, the first electrode layer was formed using a titanium layer with a thickness of 100 nm, the layer containing an organic compound was formed using a calcium fluoride layer with a thickness of 2 nm, a CzPA layer with a thickness of 10 nm, and a calcium fluoride layer with a thickness of 2 nm, and the second electrode layer was formed using an alloy layer of tin and silver with a thickness of 200 nm.

In each of the memory elements shown in FIGS. 24A and 24B, a first conductive layer was formed by a sputtering method, then, a resist mask was formed over the first conductive layer by a photolithography step, and the first conductive layer was selectively etched using the resist mask, so that the first electrode layer was formed; the layer containing an organic compound was formed by an evaporation method; and the second electrode layer was formed by the steps of putting an alloy of tin and silver with a molar ratio of tin to silver of 1:0.035 in a tantalum boat, and evaporating it. As for a memory element whose top shape is square and whose length of one side is 10 μm, writing rates are denoted by a solid line. As for a memory element whose top shape is square and whose length of one side is 5 μm, writing rates are denoted by a dashed line.

In FIGS. 24A and 24B, a horizontal axis represents a voltage value and a vertical axis represents writing rates. Writing time was set to be 10 milliseconds.

According to FIG. 24A, in the semiconductor device having the memory element whose length of one side in a top shape is 5 μm and the semiconductor device having the memory element whose length of one side in a top shape is 10 μm, it was found that writing was started at a voltage higher than 6 V and a writing success rate reached 100% at 9 V.

According to FIG. 24B, in the semiconductor device having the memory element whose length of one side in a top shape is 5 μm and the semiconductor device having the memory element whose length of one side in a top shape is 10 μm, it was found that writing was started at a voltage higher than 7 V and a writing success rate reached 100% at 10 V.

Embodiment 4

This embodiment will describe a proportion of tin in the second electrode layer, projection and depression of the second electrode layer, and a separation success rate, in a semiconductor device including a memory element using an alloy layer of tin and silver as a second electrode layer.

As for a semiconductor device formed similarly to Embodiment 1 up to the step in FIG. 10A (note that the antenna 546 was not formed), five kinds of samples (Samples 6 to 10) having different compositions for the second electrode layers of the memory elements were formed. Table 1 shows a percentage (atomic percent) of tin contained in the second electrode layer. Note that the percentage of tin was measured by elementary analysis using a STEM (scanning transmission electron microscope) and EDX (electron dispersion X ray spectroscopy).

TABLE 1

|  | sample 6 | sample 7 | sample 8 | sample 9 | sample 10 |
|---|---|---|---|---|---|
| atomic percent of tin in the second electrode layer | 21.1 | 4.3 | 4.3 | 6.1 | 100 30~40 |

In Sample 10, two kinds of regions, a region with tin of 100 at. % and a region of an alloy of tin and silver with 30 at. % to 40 at. % of tin, were formed.

As a structure of the memory element in this embodiment, a titanium layer with a thickness of 100 nm was formed as a first electrode layer, a $CaF_2$ layer with a thickness of 1 nm, a CzPA layer with a thickness of 10 nm, and a $CaF_2$ layer with a thickness of 1 nm were formed as a layer containing an organic compound, and a layer of an alloy of tin and silver with a thickness of 200 nm was formed as the second electrode layer.

A first conductive layer was formed by a sputtering method, then, a resist mask was formed over the first conductive layer by a photolithography step, and the first conductive layer was selectively etched using the resist mask, so that the first electrode layer was formed. In addition, the layer containing an organic compound was formed by an evaporation method. Further, the second electrode layer was formed by an evaporation method using an alloy in which tin and silver with a certain proportion were melted. Table 2 shows a percentage (weight percent) of tin and silver in the alloy which is provided in an evaporation source to form the second electrode layer for each Sample.

TABLE 2

|  | sample 6 | sample 7 | sample 8 | sample 9 | sample 10 |
| --- | --- | --- | --- | --- | --- |
| weight percent of tin | 25 | 33.3 | 40 | 50 | 80 |
| weight percent of silver | 75 | 66.6 | 60 | 50 | 20 |

FIGS. 25A to 25E show observation images (Z-contrast images) obtained by observing the cross sections of the memory elements of Samples 6 to 10 using the STEM. FIGS. 25A, 25B, 25C, 25D, and 25E are cross-sectional views around the memory elements of Samples 6, 7, 8, 9, and 10, respectively.

According to FIGS. 25A to 25E, in Samples 6 and 10, a difference between projection and depression is large and uniformity in film thickness distribution is low in the second electrode layer. On the other hand, in Samples 7 to 9, a difference between projection and depression is small and uniformity in film thickness distribution is high in the second electrode layer. That is, in an alloy of tin and silver, when the proportion of tin is made less than or equal to 10 at. %, further, less than or equal to 6.1 at. % (except for 0 at. %), contraction, roughness, and the like of the second electrode layer due to modification of a crystalline structure of a tin crystal can be reduced, variation in distances between the first electrode layer and the second electrode layer can be reduced, and variation in writing can be reduced.

Next, the following will describe a proportion of tin in the second electrode layer and a separation success rate. A sample including a memory element with 0 at. % of tin in the second electrode layer is referred to as Sample 11, a sample including a memory element with 21.1 at. % of tin in the second electrode layer is referred to as Sample 12, a sample including a memory element with 4.3 at. % of tin in the second electrode layer is referred to as Sample 13, and a sample including a memory element with 100 at. % or 30 to 40 at. % of tin in the second electrode layer is referred to as Sample 14.

First, a manufacturing process of semiconductor devices of Samples 12 and 13 will be described with reference to FIGS. 9A to 13.

An insulating film (not shown in the drawing) was formed over a substrate 501 and a separation layer 502 was formed over the insulating film. Here, as the substrate 501, a square glass substrate having a side of 126.6 mm (EAGLE2000 manufactured by Corning Incorporated) was used. As the insulating film, a silicon oxynitride film with a thickness of 100 nm was formed by a plasma CVD method using a silane gas and dinitrogen monoxide. As the separation layer 502, a tungsten layer with a thickness of 30 nm was formed by sputtering a tungsten target using an argon gas.

Next, a first insulating layer 503 was formed over the separation layer. As the first insulating layer 503, a silicon oxide layer with a thickness of 200 nm was formed by sputtering a silicon target using oxygen and argon, a silicon nitride oxide layer with a thickness of 50 nm was formed by a plasma CVD method using $SiH_4$, $NH_3$, and $N_2O$, and a silicon oxynitride layer with a thickness of 100 nm was formed by a plasma CVD method using $SiH_4$ and $N_2O$, Note that when a silicon oxide layer with a thickness of 200 nm was formed by a sputtering method, oxygen plasma treatment was performed to the surface of the tungsten layer, and a tungsten oxide layer with a thickness of several nm was formed over the surface of the tungsten layer.

Next, a semiconductor layer was formed over the first insulating layer 503. Here, as the semiconductor layer, an amorphous silicon layer was formed by a plasma CVD method using a silane gas, and then hydrogen contained in the amorphous silicon layer was removed by heating at 500° C. for one hour and at 550° C. for 4 hours. After that, an oxide film over the surface of the amorphous silicon layer was removed with hydrofluoric acid, and then the amorphous silicon layer was irradiated with a continuous wave laser beam of the second harmonic (532 nm) of a Nd:$YVO_4$ laser to form a crystalline silicon layer.

Next, a very small amount of an impurity element (boron or phosphorus) was added to the crystalline silicon layer in order to control a threshold value of a thin film transistor. Here, an ion doping method was used, in which 2.5% diborane ($B_2H_6$) was not separated by mass but excited by plasma, and the crystalline silicon layer was doped with boron at $1\times10^{17}/cm^3$ to $7\times10^{17}/cm^3$.

Next, a resist was applied on the crystalline silicon layer, and then light exposure was performed using a photomask and development was performed to form a resist mask. The crystalline silicon layer was selectively etched using the resist mask to form crystalline silicon layers that were separated. Here, an oxide film over the surface of the crystalline silicon layer was removed, an oxide film was formed over the surface of the crystalline silicon layer by using solution of hydrofluoric acid and hydrogen peroxide, and then a resist was applied. The resist was exposed to light using a photomask and developed to form the resist mask. Then, with the use of the resist mask, the crystalline silicon layer was dry-etched by using $SF_6$ and $O_2$, so that crystalline silicon layers that were separated were formed. After that, the resist mask was removed.

Next, a second insulating layer which functions as a gate insulating film was formed over the crystalline silicon layers that were separated. Here, as the second insulating layer, a silicon oxynitride layer with a thickness of 20 nm was formed by a plasma CVD method using $SiH_4$ and $N_2O$.

Next, a resist mask was formed using a photomask, a low-concentration impurity region 511 was formed by introduction of an impurity element (boron or phosphorus) to the crystalline silicon layer to be a capacitor electrode of a capacitor. Here, by ion doping of 5% phosphine so that phosphorus (P) was contained at a concentration of $1\times10^{15}$ to $1\times10^{19}/cm^3$ in the crystalline silicon layer, the n-type low-concentration impurity region 511 was formed. After that, the resist mask was removed.

Next, gate electrodes 504 to 507 and a capacitor electrode 508 were formed over the second insulating layer. Here, sputtering was performed using tantalum nitride as a target and using argon as a sputtering gas to form a tantalum nitride layer with a thickness of 30 nm. Then, sputtering was performed using tungsten as a target and using argon as a sputtering gas to form a tungsten layer with a thickness of 370 nm. After that, the surface of the tungsten layer was coated with a resist and the resist was exposed to light using a photomask and developed, so that a resist mask was formed. Then, with the use of the resist mask, the tungsten layer and the tantalum nitride layer were dry-etched by using $Cl_2$, $SF_6$ and $O_2$ to form the gate electrodes 504 to 507 and the capacitor electrode 508. After that, the resist mask was removed.

Next, a resist mask was formed using a photomask so as to cover the semiconductor layer in a region to be a p-channel thin film transistor, and a low-concentration impurity region was formed by adding an impurity element to the semiconductor layer in a region to be a n-channel thin film transistor using the gate electrodes 505 to 507 as masks. Here, by ion doping of 5% phosphine so that phosphorus (P) was contained at a concentration of $1\times10^{15}$ to $1\times10^{19}/cm^3$ in the semiconductor layer in a region to be an n-channel thin film transistor, the n-type impurity region was formed. After that, the resist mask was removed.

Next, a resist mask was formed using a photomask so as to cover the semiconductor layer to be an n-channel thin film transistor, and p-type source and drain regions 514 and 515 were formed by adding an impurity element to the semiconductor layer in a region to be a p-channel thin film transistor using the gate electrode 504 as a mask. Here, by ion doping of 15% diborane so that boron (B) was contained at a concentration of $1\times10^{19}$ to $1\times10^{20}/cm^3$ in the semiconductor layer in a region to be a p-channel thin film transistor, the p-type source and drain regions 514 and 515 could be formed. In addition, a channel formation region 516 was formed. Then, the resist mask was removed.

Next, sidewalls 510 were formed on the both side surfaces of the gate electrodes 504 to 507 and the capacitor electrode 508. Here, a silicon oxynitride layer with a thickness of 100 nm was formed by a plasma CVD method using $SiH_4$ and $N_2O$, and then a silicon oxide layer with a thickness of 200 nm was formed by a LPCVD method. Then, a resist was applied over the silicon oxide layer, and the silicon oxide layer formed on the back surface of the substrate was etched by wet etching. After that, the resist over the silicon oxide layer was removed, and the silicon oxide layer and the silicon oxynitride layer were dry-etched using $CHF_3$ and $O_2$ to form the sidewalls 510. Note that a part of the second insulating layer was etched and removed at the same time when the sidewalls 510 were formed. A part of the second insulating layer was removed, and the left portions of the gate insulating layer 512 were formed below the gate electrodes 504 to 507, the capacitor electrode 508, and the sidewalls 510.

Next, a resist mask was formed using a photomask so as to cover the semiconductor layer to be a p-channel thin film transistor, and a high-concentration impurity region was formed by adding an impurity element to the semiconductor layer in a region to be a n-channel thin film transistor using the gate electrodes 505 to 507, the capacitor electrode 508, and the sidewalls 510 as masks. Here, ion doping of 5% phosphine was performed, so that phosphorus was contained at a concentration of $1\times10^{19}$ to $1\times10^{20}/cm^3$ in the crystalline silicon layer in a region to be an n-channel thin film transistor, and thus an n-type high-concentration impurity region could be formed. Specifically, source or drain regions 517 and 518, LDD regions 519 and 520, and a channel formation region 521 were formed in the semiconductor layer in a region to be an n-channel thin film transistor. The LDD regions 519 and 520 were formed below the sidewalls 510. Further, a low-concentration impurity region 511 and a high-concentration impurity region 513 were formed in the semiconductor layer to be the capacitor electrode of the capacitor. Then, the resist mask was removed.

Next, activation treatment of an impurity element added to the semiconductor layer was performed after formation of a fourth insulating layer 522 containing hydrogen. Here, a silicon oxynitride layer with a thickness of 50 nm was formed by a plasma CVD method using $SiH_4$ and $N_2O$, and then activation treatment of an impurity element was performed by heating at 550° C. for 4 hours in a nitrogen atmosphere.

Next, a fifth insulating layer 523 and a sixth insulating layer 524 were formed as a second layer and a third layer respectively of an interlayer insulating layer. Here, as the fifth insulating layer 523, a silicon nitride oxide layer with a thickness of 100 nm was formed by a plasma CVD method using $SiH_4$, $NH_3$, and $N_2O$, and then as the sixth insulating layer 524, a silicon oxynitride layer with a thickness of 600 nm was formed by a plasma CVD method using $SiH_4$ and $N_2O$.

Next, hydrogenation treatment of the crystalline silicon layer was performed. Here, heating was performed at 410° C. for one hour in a nitrogen atmosphere.

A cross-sectional view of the semiconductor device through the steps up to here corresponds to FIG. 9A.

Next, a resist was applied over the sixth insulating layer 524, and the resist was exposed to light using a photomask and developed to form a resist mask. After that, the fourth insulating layer 522, the fifth insulating layer 523, and the sixth insulating layer 524 were selectively etched, and a contact hole that reached the semiconductor layer and a contact hole that reached the gate electrode were formed. Here, the fourth insulating layer 522, the fifth insulating layer 523, and the sixth insulating layer 524 were etched by dry etching using $CHF_3$ and $H_2$. Then, the resist mask was removed after etching.

Next, an oxide layer on the surface of the semiconductor layer which was exposed was removed with an etchant containing hydrofluoric acid and the surface of the semiconductor layer which was exposed was cleaned at the same time.

Next, a conductive layer was formed by a sputtering method. Here, a titanium layer with a thickness of 60 nm was formed by a sputtering method using titanium as a target, a titanium nitride layer with a thickness of 40 nm was formed by a sputtering method using titanium nitride as a target, an aluminum layer with a thickness of 500 nm was formed by a sputtering method using aluminum as a target, and a titanium layer with a thickness of 100 nm was formed using titanium as a target.

Next, after a resist was applied, the resist was exposed using a photomask and developed to form a resist mask. Then, the conductive layer was selectively etched to form source electrodes or drain electrodes 525 to 532, gate lead wiring 535 to 538, capacitor wirings 533, 534 and 539 of the capacitor, a lead wiring 541 of a second electrode layer of a memory element, and a conductive layer 542. After that, the resist mask was removed.

A cross-sectional view of the semiconductor device through the steps up to here corresponds to FIG. 9B. A thin film transistor in a logic circuit portion 601, a thin film transistor in a memory portion 602, and a thin film transistor and the capacitor in the power supply portion 603 could be formed over the same substrate.

Next, a seventh insulating layer 540 was formed to cover the sixth insulating layer 524, the source electrodes or drain electrodes 525 to 532, the gate lead wiring 535 to 538, the capacitor wirings 533, 534 and 539 of the capacitor, the lead wiring 541 of the second electrode layer of the memory element, and the conductive layer 542. Here, as the seventh insulating layer 540, photosensitive polyimide was applied, and then the photosensitive polyimide was exposed to light using a photomask, developed and baked by heating at 300° C. for one hour to form the seventh insulating layer 540 with a thickness of 1500 nm having an opening which reached the lead wiring 541 and an opening which reached the conductive layer 542.

Next, a first electrode layer 543 of the memory element, a conductive layer 544 to be connected to the lead wiring 541, and a base film 545 of the antenna were formed over the seventh insulating layer 540. Here, a titanium layer with a thickness of 100 nm was formed using titanium as a target, and then a resist was applied over the titanium layer. The resist was exposed to light using a photomask and developed, so that a resist mask was formed. Then, with the use of the resist mask, the titanium layer was dry-etched using $BCl_3$ and $Cl_2$ to form the first electrode layer 543 of the memory element, the conductive layer 544 to be connected to the lead wiring 541, and the base film 545 of the antenna. After that, the resist mask was removed.

A cross-sectional view of the semiconductor device through the steps up to here corresponds to FIG. 9C.

Next, an eighth insulating layer 548 was formed so as to cover the first electrode layer 543, the conductive layer 544, the base film 545 of the antenna, and the seventh insulating layer 540. Here, as the eighth insulating layer, photosensitive polyimide was applied, and the photosensitive polyimide was exposed to light using a photomask and developed. Then, the photosensitive polyimide was heated at 250° C. for one hour to form the eighth insulating layer 548 with a thickness of 800 nm.

Next, an antenna 546 was formed over the base film 545. After a silver paste was printed on the base film 545 by a screen printing method, the silver paste was heated at 200° C. for 30 minutes to form the antenna 546.

Next, a layer 549 containing an organic compound was formed over a part of the first electrode layer 543 and the eighth insulating layer 548. Here, a calcium fluoride layer with a thickness of 1 nm was evaporated, and then CzPA with a thickness of 10 nm and a calcium fluoride layer with a thickness of 1 nm were evaporated to form the layer 549 containing an organic compound.

A cross-sectional view of the semiconductor device through the steps up to here corresponds to FIG. 10A.

Next, a second electrode layer 550 of the memory element was formed by an evaporation method over a part of the layer 549 containing an organic compound, the conductive layer 544, and the eighth insulating layer 548. The second electrode layer 550 was also connected to the conductive layer 544. Here, for Sample 12, an alloy of tin and silver containing tin of 21.1 at. % was formed with a thickness of 200 nm. Further, for Sample 13, an alloy of tin and silver containing tin of 4.3 at. % was formed with a thickness of 200 nm.

A cross-sectional view of the semiconductor device through the steps up to here corresponds to FIG. 10B. In this embodiment, the thin film transistor in the logic circuit portion 601, the thin film transistor and the memory element 600 in the memory portion 602, and the thin film transistor and the antenna in the power supply portion 603 could be formed over the same substrate.

Next, a ninth insulating layer 551 was formed so as to cover the eighth insulating layer 548, the second electrode layer 550, and the antenna 546. Here, as the ninth insulating layer 551, a composition was printed by a printing method and baked at 160° C. for 30 minutes, and an epoxy resin with a thickness 10 μm to 30 μm was formed. Note that a stack from the first insulating layer through the second electrode layer is referred to as an element layer 554. The ninth insulating layer 551 functions as a sealing layer which seals the element layer 554.

Next, in order to perform the later separation step easily, the separation layer was irradiated with a laser beam to form a groove.

Next, a supporting member 552 was provided over the ninth insulating layer 551. Here, as the supporting member 552, a thermal separating film was attached to the ninth insulating layer 551.

A cross-sectional view of the semiconductor device through the steps up to here corresponds to FIG. 11A.

Next, the element layer 554 and the ninth insulating layer 551 were separated from the substrate 501. Specifically, the element layer 554 and the ninth insulating layer 551 were separated from the substrate 501 at the separation layer 502 by the physical method. Here, a roller 561 having adhesiveness was attached to the surface of the supporting member 552 and the roller 561 was rotated, whereby the element layer 554 and the ninth insulating layer 551 could be separated from the substrate 501.

A cross-sectional view of the semiconductor device through the steps up to here corresponds to FIG. 11B.

Next, a first flexible substrate 562 was attached to the element layer 554 and the insulating layer 551 which were separated from the separation layer. Here, a laminated film having a thermoplastic adhesive layer was provided as the first flexible substrate on the surface of the element layer 554 and the insulating layer 551, and the laminated film was pressed by the roller which was heated to 135° C. and attached to the surface of the element layer 554 and the insulating layer 551.

A cross-sectional view of the semiconductor device through the steps up to here corresponds to FIG. 12A. After that, the supporting member 552 was heated and separated from the ninth insulating layer 551.

Next, a second flexible substrate 583 was attached to the ninth insulating layer 551. Here, a laminated film having a thermoplastic adhesive layer was provided as the second flexible substrate 583 over the surface of the insulating layer 551, and the laminated film was pressed by the roller which was heated to 135° C. and firmly attached to the surface of the ninth insulating layer 551.

After that, a portion where the first flexible substrate, the element layer, and the second flexible substrate 583 overlap one another is selectively irradiated with a UV laser beam so as to be divided, whereby a semiconductor device could be manufactured.

Next, manufacturing steps of Samples 11 and 14 will be described with reference to FIGS. 9A to 9C, and 26A to 29.

Similarly to Samples 12 and 13, through the steps illustrated in FIGS. 9A to 9C, the first electrode layer 543 of the memory element, the conductive layer 544 connected to the lead wiring 541, and the base film 545 of the connection terminal were formed over the seventh insulating layer 540.

Figure 26A:
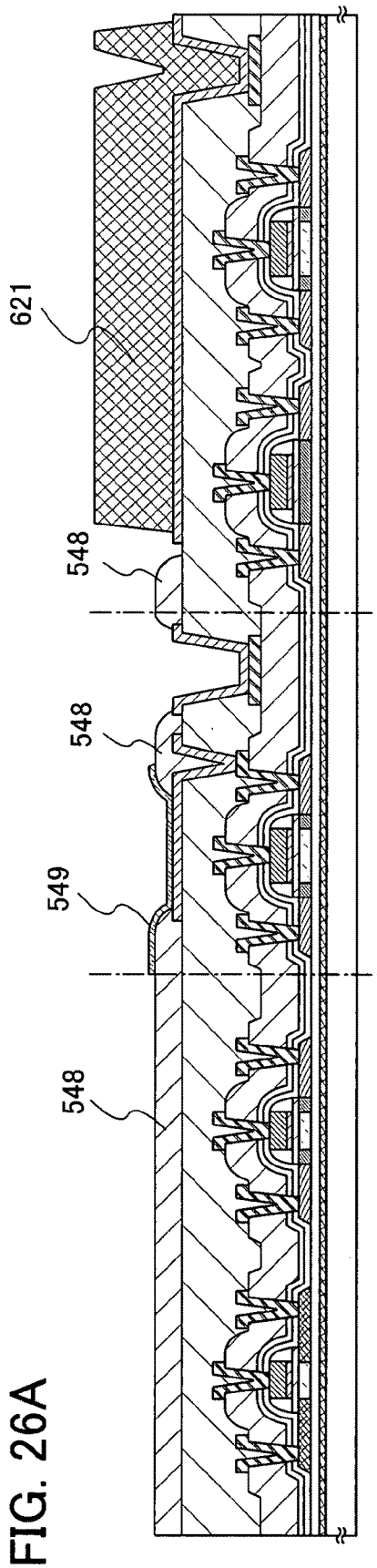
FIGS. 26A and 26B are cross-sectional views showing a manufacturing process of a semiconductor device of the present invention.

Next, as shown in FIG. 26A, an eighth insulating layer 548 was formed so as to cover the first electrode layer 543, the conductive layer 544, and the seventh insulating layer 540.

Next, a conductive layer 621 was formed over the base film 545. After a silver paste was printed on the base film 545 by a screen printing method, the silver paste was heated at 200° C. for 30 minutes to form the conductive layer 621.

Next, a layer 549 containing an organic compound was formed over a part of the first electrode layer 543 and the eighth insulating layer 548. Here, a calcium fluoride layer with a thickness of 1 nm was evaporated, and then a CzPA layer with a thickness of 10 nm and a calcium fluoride layer with a thickness of 1 nm were evaporated to form the layer 549 containing an organic compound.

A cross-sectional view of the semiconductor device through the steps up to here corresponds to FIG. 26A.

Next, a second electrode layer 550 was formed by an evaporation method over a part of the layer 549 containing an organic compound, the conductive layer 544, and the eighth insulating layer 548. The second electrode layer 550 was also connected to the conductive layer 544. Here, for Sample 11, tin was not used, and silver with a thickness of 200 nm was formed. Further, for Sample 14, the second electrode layer, which has tin of 100 at. % and an alloy of tin and silver containing tin of 30 to 40 at. %, with a thickness of 200 nm was formed.

Figure 26B:
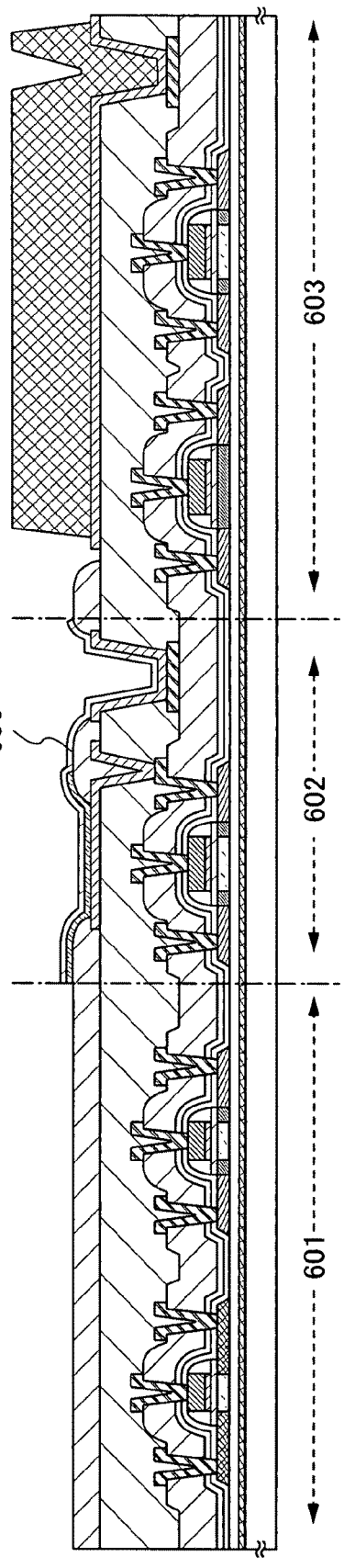

A cross-sectional view of the semiconductor device through the steps up to here corresponds to FIG. 26B. In this embodiment, the thin film transistor in the logic circuit portion 601, the thin film transistor and the memory element 600 in the memory portion 602, and the thin film transistor in the power supply portion 603 could be formed over the same substrate.

Next, a tenth insulating layer 622 was formed so as to cover the eighth insulating layer 548, the second electrode layer 550, and a part of the conductive layer 621. Here, as the tenth insulating layer 622, a composition was printed by a printing method and baked at 160° C. for 30 minutes, and an epoxy resin with a thickness 10 μm to 30 μm was formed. Note that a stack from the first insulating layer through the connection terminal is referred to as an element layer 620. The tenth insulating layer 622 functions as a sealing layer which seals the element layer 620.

Next, in order to perform the later separation step easily, the separation layer was irradiated with a laser beam to form a groove (not shown in the drawing).

Next, a supporting member 624 was provided over the tenth insulating layer 622. Here, as the supporting member 624, a thermal separating film was attached to the tenth insulating layer 622 using an adhesive 623.

A cross-sectional view of the semiconductor device through the steps up to here corresponds to FIG. 27A.

Next, the element layer 620 and the tenth insulating layer 622 were separated from the substrate 501. Specifically, the element layer 620 and the tenth insulating layer 622 were separated from the substrate 501 at the separation layer 502 by the physical method. Here, a roller having adhesiveness was attached to the surface of the supporting member 624 and the roller was rotated, whereby the element layer 620 and the tenth insulating layer 622 could be separated from the substrate 501.

A cross-sectional view of the semiconductor device through the steps up to here corresponds to FIG. 27B.

Next, a first flexible substrate 562 was attached to the element layer 620 and the tenth insulating layer 622 which were separated from the separation layer 502. Here, a laminated film having a thermoplastic adhesive layer was provided as the first flexible substrate 562 on the surface of the element layer 620, and the laminated film was pressed by the roller which was heated to 135° C. and attached to the surface of the element layer 620.

Figure 28A:
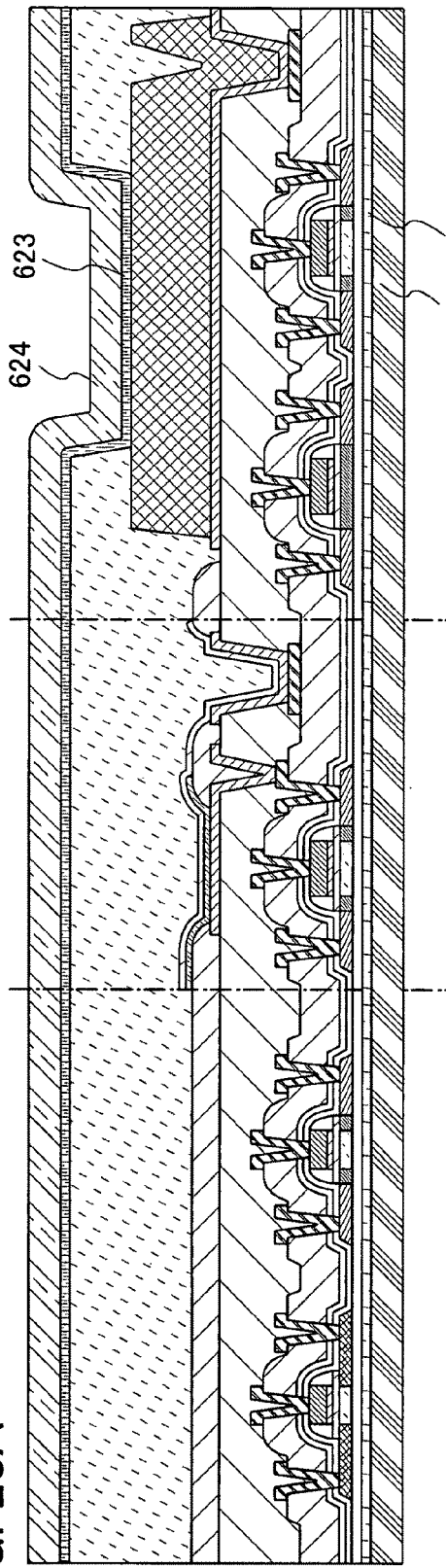
FIGS. 28A and 28B are cross-sectional views showing a manufacturing process of a semiconductor device of the present invention.

A cross-sectional view of the semiconductor device through the steps up to here corresponds to FIG. 28A. After that, the supporting member 624 was heated and separated from the tenth insulating layer 622 and the conductive layer 621.

Next, the first flexible substrate 562 was attached to UV sheet of a dicing frame (not shown in the drawing). Since the UV sheet is adhesive, the first flexible substrate 562 was fixed to the UV sheet. Then, the UV sheet was irradiated with ultraviolet light to lower adhesiveness of the UV sheet.

Next, a connection terminal 625 was formed over the conductive layer 621. By forming the connection terminal 625, alignment and adhesion with/to the antenna later can be facilitated. Here, after a silver paste was printed on the conductive layer 621 by a screen printing method, the silver paste was heated at 120° C. for 20 minutes, so that the connection terminal 625 was formed.

Next, the connection terminal 625 was irradiated with a laser beam. Thus, adhesion among the connection terminal 625, the conductive layer 621, and the conductive layer 542 was enhanced, and electric resistance was reduced.

Figure 28B:
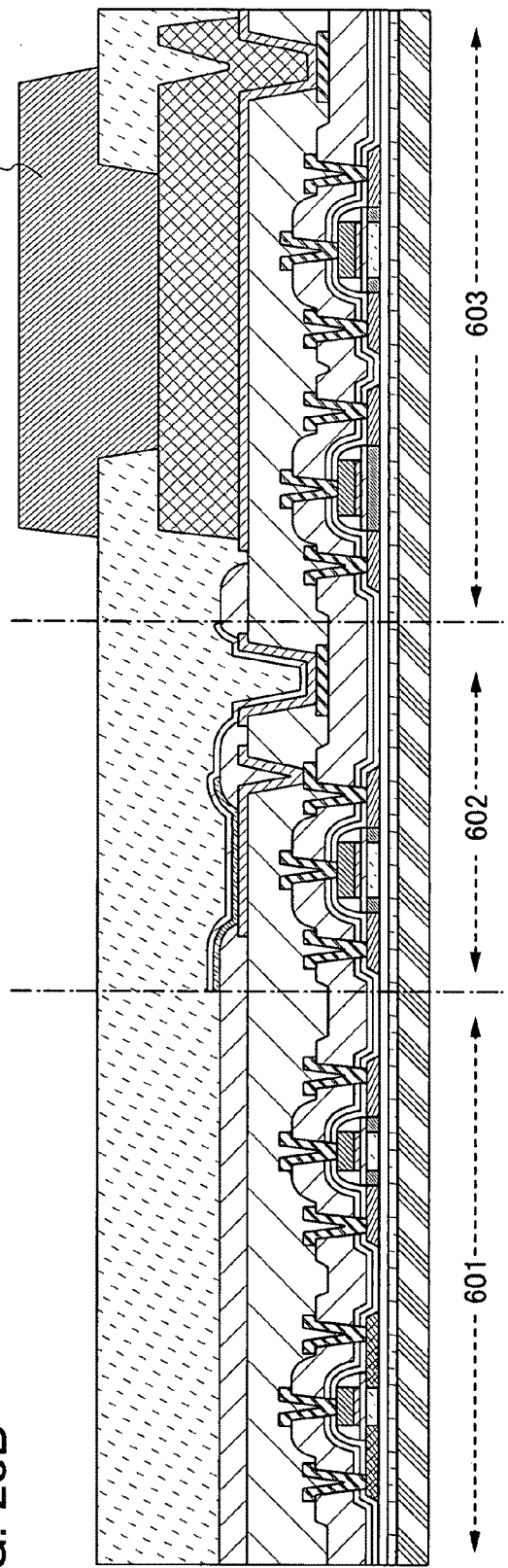

A cross-sectional view of the semiconductor device through the steps up to here corresponds to FIG. 28B.

Next, an anisotropic conductive adhesive was printed on the connection terminal and the tenth insulating layer 622 and baked. Here, the anisotropic conductive adhesive was baked at 120° C. for five minutes.

Next, the element layer 620 was divided into parts. Here, the element layer 620 and the first flexible substrate 562 were irradiated with a laser beam, and the element layer 620 was divided into plural parts. Note that, in this case, a part of the element layer was divided into plural parts by a laser cutting method; however, instead of a laser cutting method, a dicing method, a scribing method, or the like can be used as appropriate. The divided element layer is referred to as a thin film integrated circuit 630.

Next, the thin film integrated circuit 630 was separated from the UV sheet.

A second flexible substrate 631 having an antenna 632 and the thin film integrated circuit 630 were attached to each other using an anisotropic conductive adhesive 633.

The antenna 632 and the thin film integrated circuit 630 were connected to each other through conductive particles 634 in the anisotropic conductive adhesive 633.

Figure 29:
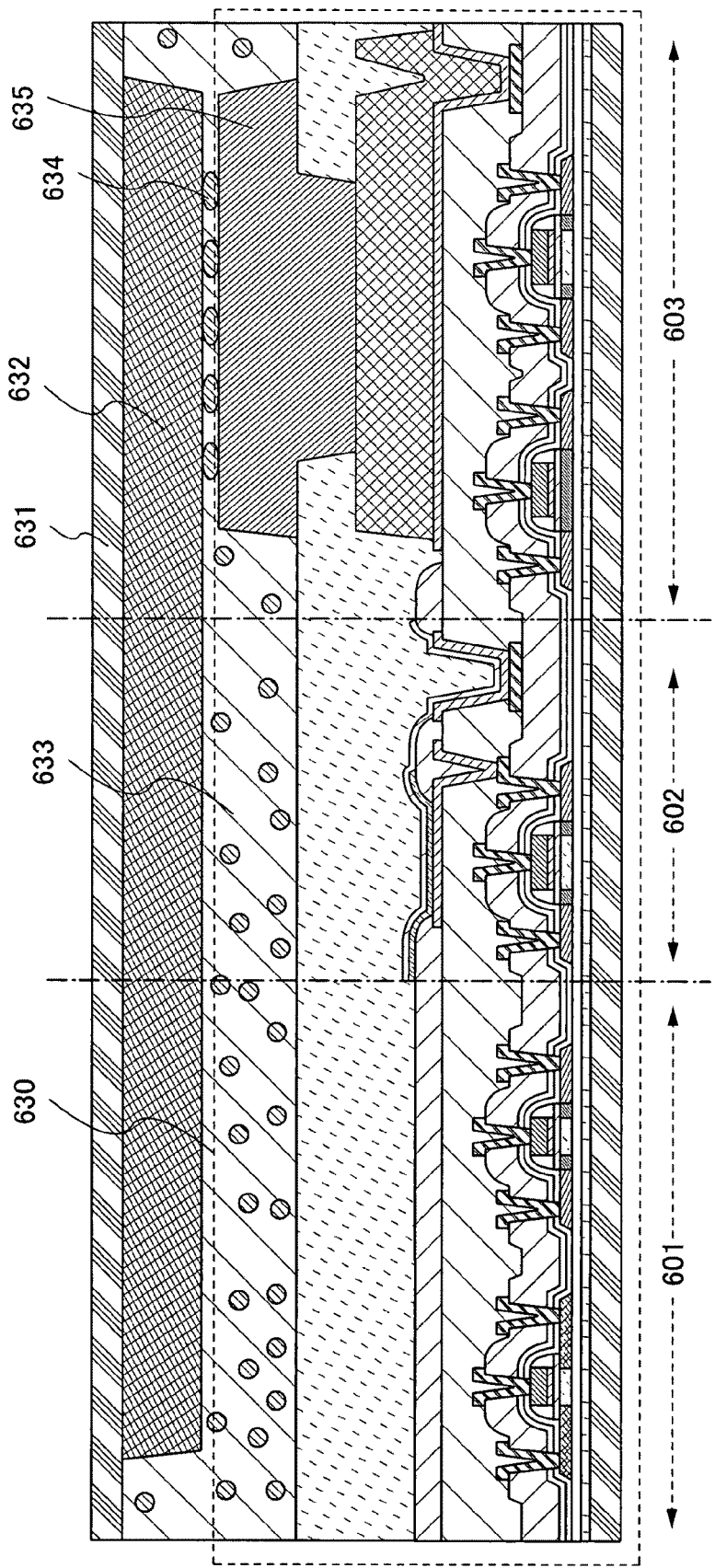
FIG. 29 is a cross-sectional view showing a manufacturing process of a semiconductor device of the present invention.

Through the above process, as shown in FIG. 29, a semiconductor device capable of transmitting data without contact could be manufactured.

In this embodiment, a plurality of semiconductor devices were provided over one substrate. A separation success rate per one substrate is shown in Table 3.

TABLE 3

|  | sample 11 | sample 12 | sample 13 | sample 14 |
|---|---|---|---|---|
| success rate of separation (%) | 2 | 66 | 96 | 89.5 |

It was difficult to separate the memory element normally when the second electrode layer of the memory element was formed using only silver without containing a slight amount of tin (Sample 11). Further, it was difficult to separate the memory element normally when the second electrode layer of the memory element was formed using only tin or an alloy containing tin of greater than or equal to 21 at. % (Samples 12 and 14). However, when the second electrode layer of the memory element was formed using an alloy of tin and silver, which contains a slight amount of tin and has high uniformity in thickness distribution, here, an alloy of tin and silver, which contains tin of 4.3 at. %, the memory element could be separated normally. It is found that when the second electrode layer of the memory element was formed using an alloy of tin and silver, which contains a slight amount of tin, typically less than or equal to 10 at. %, further, less than or equal to 6.1 at. % (except for 0 at. %), the memory element could be separated normally with a high rate.

Embodiment 5

A semiconductor device capable of transmitting and receiving data without contact of the present invention can be used by being provided in, for example, paper money, coins, securities, certificates, bearer bonds, packing containers, books, recording media, personal belongings, vehicles, food items, clothes, healthcare items, livingwares, medicals, electronic devices, and the like. Examples thereof will be described with reference to FIGS. 16A to 17C.

FIG. 16A shows an example of a state of completed products of labels with built-in semiconductor devices 9010 according to the present invention. On a label board (separate paper) 9118, labels 9020 with the built-in semiconductor devices 9010 are formed. The labels 9020 are put in a box 9119. On the label, information on a commercial product or service (for example, a name of the product, a brand, a trademark, a trademark owner, a seller, a manufacturer, and the like) is written, while an ID number that is unique to the commercial product (or the kind of the commercial product) is assigned to the semiconductor device 9010 to make it possible to easily figure out forgery, infringement of intellectual property rights such as a patent and a trademark, and illegality such as unfair competition. In addition, a lot of information that is too much to be written clearly on a container of the commercial product or the label, for example, the production area, selling area, quality, raw material, efficacy, use, quantity, shape, price, production method, directions for use, time of the production, time of the use, expiration date, instructions of the commercial product, information on the intellectual property of the commercial product, and the like can be input in the semiconductor device 9010 so that a transactor and a consumer can access the information using a simple reader. While rewriting, deleting, and the like of the information can be easily conducted by the producer, a transactor or consumer is not allowed to conduct rewriting, deleting, and the like of the information.

FIG. 16B shows a tag 9120 with a built-in semiconductor device. By mounting the tag with a built-in semiconductor device on commercial products, the management of the commercial products becomes easier. For example, in the case where the commercial product is stolen, the thief can be figured out quickly by tracing the pathway of the commercial product. In this way, by providing the tag with a built-in semiconductor device, commercial products that are excellent in so-called traceability (traceability means that preparation is made for smoothly grasping the cause of a problem, which may occur at each complicated stage of manufacture and distribution, by tracing the pathway) can be distributed.

FIG. 16C shows an example of a state of a completed product of an ID card 9141 with a built-in semiconductor device according to the present invention. The ID card includes all kinds of cards such as a cash card, a credit card, a prepaid card, an electronic ticket, electronic money, a telephone card, and a membership card.

FIG. 16D shows an example of a state of a completed product of a bearer bond 9122 with a built-in semiconductor device 9010 according to the present invention. The bearer bonds include, but not limited to of course, stamps, tickets, admission tickets, merchandise coupons, book coupons, stationery coupons, beer coupons, rice coupons, various gift coupons, and various service coupons. In addition, a semiconductor device of the present invention can be provided in securities such as a check, a bill, and a promissory note, certificates such as a driver's license and a resident card, or the like, not limited to the bearer bonds.

FIG. 16E shows a wrapping film 9127 with built-in semiconductor devices 9010, for wrapping a commercial product. The wrapping film 9127 can be manufactured, for example, by scattering semiconductor devices 9010 arbitrarily on a lower film and covering them with an upper film. The wrapping film 9127 is put in a box 9129, and the desired amount of the film can be cut away with a cutter 9128 and used. The material of the wrapping film 9127 is not particularly limited. For example, materials such as a thin film resin, an aluminum foil, and paper can be used.

Figure 17A:
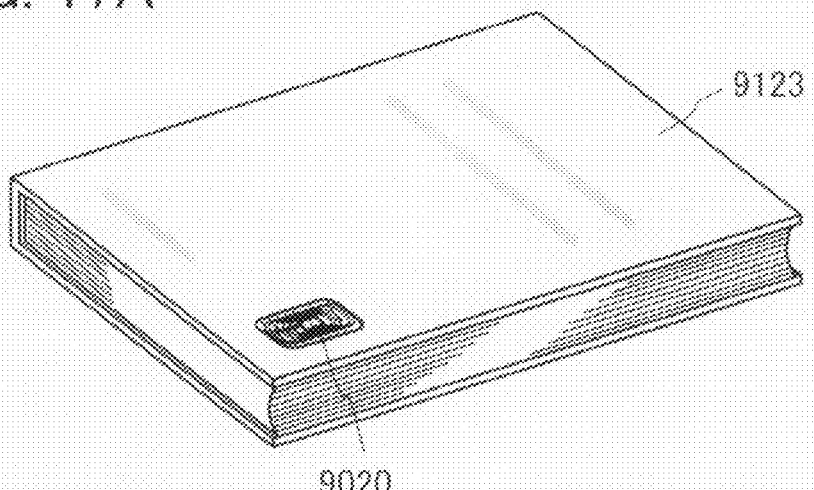
FIGS. 17A to 17C are views showing applications of a semiconductor device of the present invention.
Figure 17B:
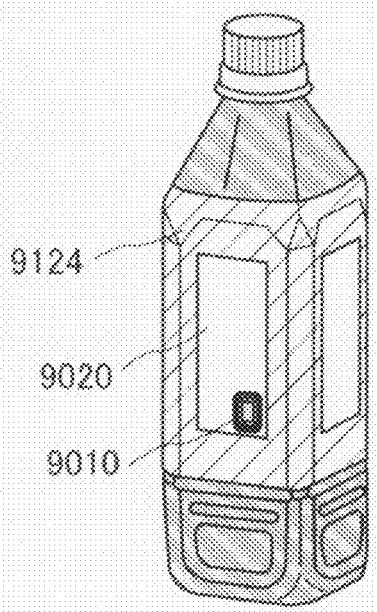

FIGS. 17A and 17B respectively show a book 9123 and a plastic bottle 9124 to which a label 9020 with a built-in semiconductor device 9010 according to the present invention is attached. Note that the goods are not limited to these and the label may be attached to various goods such as packing containers such as paper for packing a box lunch; recording media such as DVD software and a video tape; vehicles including a wheeled vehicle such as a bicycle and a vessel; personal belongings such as a bag and glasses; food items such as foods and beverages; clothes such as clothing and footwear; healthcare items such as a medical device and a health appliance; livingware such as furniture and a lighting apparatus; medicals such as a medicine and an agricultural chemical; and electronic devices such as a liquid crystal display device, an EL display device, a television set (a television receiver, a thin television receiver), and a mobile phone. The semiconductor device that is used in the present invention is quite thin, therefore, when the label is mounted on goods such as the book, the function or design is not damaged. Furthermore, in the case of a semiconductor device of the present invention, an antenna and a chip can be formed in an integrated manner to make it easier to transfer the semiconductor device of the present invention directly to a commercial product with a curved surface.

Figure 17C:
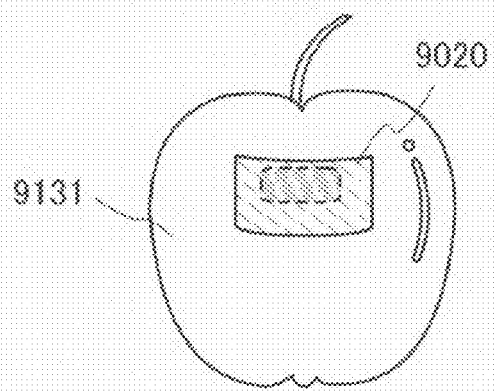
Figure 18:
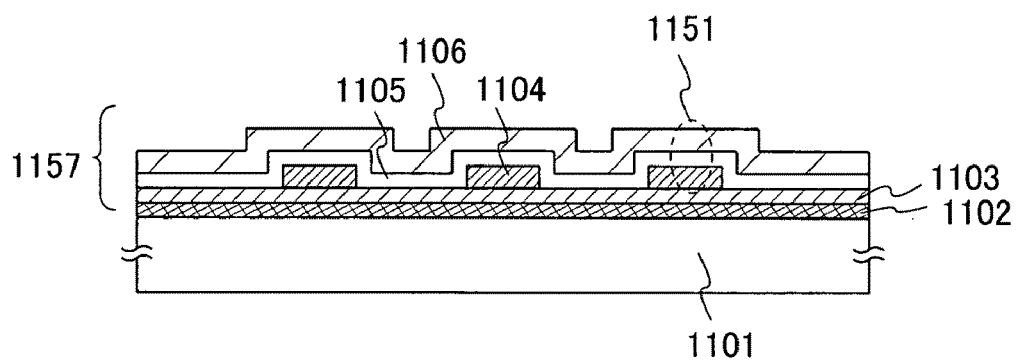
FIG. 18 is a cross-sectional view showing a conventional semiconductor device.

FIG. 17C shows a state in which the label 9020 is directly attached to fresh food such as fruits 9131. When a label is attached to a commercial product, probably, the label is peeled off. However, when the commercial product is wrapped in wrapping films, it is difficult to peel off the wrapping film, which brings some merit for security.

When a semiconductor device of the present invention is provided for paper money, coins, securities, certificates, bearer bonds, and the like, forgery of them can be prevented. When a semiconductor device of the present invention is provided in packing containers, books, recording media, personal belongings, food items, clothes, livingware, electronic devices, and the like, inspection systems, rental systems, and the like can be performed more efficiently. When a semiconductor device of the present invention is provided in vehicles, healthcare items, medicals, and the like, forgery and theft thereof can be prevented and medicines can be prevented from being taken in the wrong manner.

As described above, a semiconductor device of the present invention can be used for any product. Since a semiconductor device of the present invention is thinner and more bendable, a user can naturally use a product with the semiconductor device attached. Note that this embodiment can be freely combined with the other embodiment modes and embodiments.

This application is based on Japanese Patent Application serial no. 2006-321032 filed with Japan Patent Office on Nov. 29, 2006, the entire contents of which are hereby incorporated by reference.

The invention claimed is:

1. A device comprising a memory element which includes a layer containing an organic compound between a first electrode layer and a second electrode layer,
   wherein the second electrode layer comprises an alloy containing tin of 1 atomic percent to 10 atomic percent inclusive and silver;
   wherein the memory element is arranged to change a distance between the first electrode layer and a second electrode layer when a voltage is applied between the first electrode layer and a second electrode layer.

2. The device according to claim 1 further comprising a semiconductor element.

3. The device according to claim 1 further comprising an antenna.

4. The device according to claim 3 further comprising:
   a demodulation circuit configured to demodulate a carrier wave received by the antenna; and a power supply circuit configured to generate a constant voltage from the carrier wave received by the antenna.

5. A device comprising:
a first flexible substrate;
an element layer having a memory element provided over the first flexible substrate; and
an insulating layer formed over the element layer,
wherein the memory element includes a layer containing an organic compound between a first electrode layer and a second electrode layer; and
wherein the first electrode layer or the second electrode layer comprises an alloy containing tin of 1 atomic percent to 10 atomic percent inclusive and silver;
wherein the memory element is arranged to change a distance between the first electrode layer and a second electrode layer when a voltage is applied between the first electrode layer and a second electrode layer.

6. The device according to claim 5, wherein the element layer further has a semiconductor element provided over the first flexible substrate.

7. The device according to claim 5 further comprising a second flexible substrate provided over the insulating layer.

8. The device according to claim 5 further comprising an antenna.

9. The device according to claim 8 further comprising:
a demodulation circuit configured to demodulate a carrier wave received by the antenna; and
a power supply circuit configured to generate a constant voltage from the carrier wave received by the antenna.

10. A device comprising a memory element which includes a layer containing an organic compound between a first electrode layer and a second electrode layer,
wherein the second electrode layer comprises an alloy containing tin of 1 atomic percent to 10 atomic percent inclusive;
wherein the memory element is arranged to change a distance between the first electrode layer and a second electrode layer when a voltage is applied between the first electrode layer and a second electrode layer.

11. The device according to claim 10 further comprising a semiconductor element.

12. The device according to claim 10 further comprising an antenna.

13. The device according to claim 12 further comprising:
a demodulation circuit configured to demodulate a carrier wave received by the antenna; and
a power supply circuit configured to generate a constant voltage from the carrier wave received by the antenna.

14. A method for manufacturing a memory device, comprising the steps of:
forming a separation layer over a substrate;
forming, over the separation layer, an element layer having a memory element which includes a layer containing an organic compound between a first electrode layer and a second electrode layer; and
separating the substrate and the element layer from each other at the separation layer,
wherein the first electrode layer or the second electrode layer is formed using an alloy containing tin and silver.

15. The method for manufacturing a memory device according to claim 14 further comprising the step of forming an insulating layer over the element layer.

16. The method for manufacturing a memory device according to claim 14 further comprising the step of attaching a flexible substrate to the element layer after separating the substrate and the element layer from each other at the separation layer.

17. The method for manufacturing a memory device according to claim 14 further comprising the step of attaching flexible substrates to an upper surface and a lower surface of the element layer after separating the substrate and the element layer from each other at the separation layer.

18. A method for manufacturing a semiconductor device, comprising the steps of:
forming a separation layer over a substrate;
forming, over the separation layer, an element layer having a transistor, a memory element which includes a layer containing an organic compound between a first electrode layer and a second electrode layer, and an antenna; and
separating the substrate and the element layer from each other at the separation layer,
wherein the first electrode layer or the second electrode layer is formed using an alloy containing tin and silver.

19. The method for manufacturing a semiconductor device according to claim 18 further comprising the step of forming an insulating layer over the element layer.

20. The method for manufacturing a semiconductor device according to claim 18 further comprising the step of attaching a flexible substrate to the element layer after separating the substrate and the element layer from each other at the separation layer.

21. The method for manufacturing a semiconductor device according to claim 18 further comprising the step of attaching flexible substrates to an upper surface and a lower surface of the element layer after separating the substrate and the element layer from each other at the separation layer.

* * * * *